(12) United States Patent
Kawamura et al.

(10) Patent No.: US 8,450,727 B2
(45) Date of Patent: May 28, 2013

(54) ORGANIC LUMINESCENT MEDIUM AND ORGANIC EL DEVICE

(75) Inventors: Masahiro Kawamura, Chiba (JP);
Masakazu Funahashi, Chiba (JP);
Mitsunori Ito, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 400 days.

(21) Appl. No.: 12/867,497

(22) PCT Filed: Feb. 16, 2009

(86) PCT No.: PCT/JP2009/052538
§ 371 (c)(1),
(2), (4) Date: Nov. 8, 2010

(87) PCT Pub. No.: WO2009/102054
PCT Pub. Date: Aug. 20, 2009

(65) Prior Publication Data
US 2011/0042660 A1 Feb. 24, 2011

(30) Foreign Application Priority Data

Feb. 15, 2008 (JP) .................................. 2008-035156
Feb. 25, 2008 (JP) .................................. 2008-042959

(51) Int. Cl.
*H01L 35/24* (2006.01)
(52) U.S. Cl.
USPC .................................... 257/40; 257/E51.001
(58) Field of Classification Search
USPC .......................................... 257/40, E51.001
See application file for complete search history.

(56) References Cited

U.S. PATENT DOCUMENTS

| 2004/0137270 A1 | 7/2004 | Seo et al. |
| 2005/0064233 A1 | 3/2005 | Matsuura et al. |
| 2006/0043858 A1 | 3/2006 | Ikeda et al. |
| 2007/0055085 A1 | 3/2007 | Kubota et al. |
| 2007/0152565 A1 | 7/2007 | Kubota et al. |
| 2007/0252511 A1 | 11/2007 | Funahashi |
| 2007/0292714 A1 | 12/2007 | Funahashi |

FOREIGN PATENT DOCUMENTS

| JP | 2004 204238 | 7/2004 |
| WO | 2004 018587 | 3/2004 |
| WO | 2004 018588 | 3/2004 |
| WO | 2006 030527 | 3/2006 |

OTHER PUBLICATIONS

International Search Report issued Mar. 12, 2009 in PCT/JP09/52538 filed Feb. 16, 2009.

*Primary Examiner* — Anthony Ho
(74) *Attorney, Agent, or Firm* — Oblon, Spivak, McClelland, Maier & Neustadt, L.L.P.

(57) ABSTRACT

Provided is an organic luminescent medium containing a specific diaminopyrene derivative and a specific anthracene derivative. Also provided are an organic electroluminescence device capable of emitting light having a short wavelength (such as blue light) with high luminous efficiency and having a long lifetime by having such constitution that the organic EL device contains one or more organic thin film layers including a light emitting layer between a cathode and an anode, and at least one layer of the organic thin film layers contains the organic luminescent medium, and an organic luminescent medium that can be used in an organic thin film layer of the organic EL device.

34 Claims, No Drawings

ORGANIC LUMINESCENT MEDIUM AND ORGANIC EL DEVICE

TECHNICAL FIELD

The present invention relates to an organic luminescent medium and an organic EL device using the medium.

BACKGROUND ART

Organic electroluminescence devices (organic EL devices) each utilizing the light emission of an organic compound have been conventionally known. The organic EL devices each have a plurality of organic thin films laminated between an anode and a cathode. In the constitution, a voltage is applied between the anode and the cathode. As a result, holes from the anode and electrons from the cathode are injected into the organic thin films. A molecule in an excited state is produced from an injected hole and an injected electron in a light emitting layer in the organic thin films. Then, energy upon return from the excited state to the ground state is emitted as light.

Patent Document 1 discloses a combination of an anthracene host and an arylamine as an exemplary material to be used in the light emitting layer. In addition, Patent Documents 2 to 4 each disclose a combination of an anthracene host having a specific structure and a diaminopyrene dopant. Further, Patent Documents 5 and 6 each disclose an anthracene-based host material.

However, each of the materials has involved the following problems. That is, it is difficult to obtain the emission of light having a short wavelength (such as blue light emission) with high luminous efficiency, and furthermore, an organic EL device using any such material has a short lifetime.

Patent Document 1: WO 2004/018588 A1
Patent Document 2: WO 2004/018587 A1
Patent Document 3: JP 2004-204238 A
Patent Document 4: WO 2005/108348 A1
Patent Document 5: WO 2005/054162 A1
Patent Document 6: WO 2005/061656 A1

DISCLOSURE OF THE INVENTION

Problems to be Solved by the Invention

An object of the present invention is to provide an organic EL device capable of emitting light having a short wavelength (such as blue light) with high luminous efficiency, having a long lifetime, and containing a combination of a specific host material and a specific dopant material, and an organic luminescent medium that can be used in an organic thin film layer of the organic EL device.

Means for Solving the Problems

The inventors of the present invention have made extensive studies to solve the above problems. As a result, the inventors have found that the problems can be solved with the following first invention and second invention.

That is, the first invention is an organic luminescent medium containing a diaminopyrene derivative represented by the following formula (1-1) and an anthracene derivative represented by the following formula (1-2):

[Chem 1]

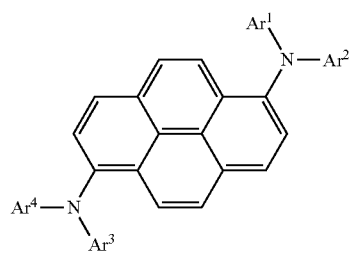

(1-1)

where $Ar^1$ to $Ar^4$ each independently represent a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, or a substituted or unsubstituted heterocyclic group having 5 to 50 ring atoms, provided that one or more of $Ar^1$ to $Ar^4$ each represent an α-naphthyl group;

[Chem 2]

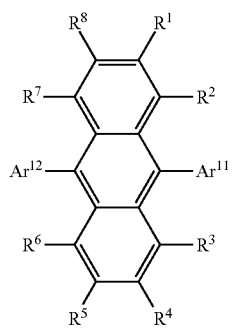

(1-2)

where $Ar^{11}$ and $Ar^{12}$ each independently represent a substituted or unsubstituted aryl group having 6 to 20 ring carbon atoms, and $R^1$ to $R^8$ each independently represent a group selected from a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group.

The second invention is an organic luminescent medium containing a diaminopyrene derivative represented by the following formula (2-1) and an anthracene derivative represented by the following formula (2-2):

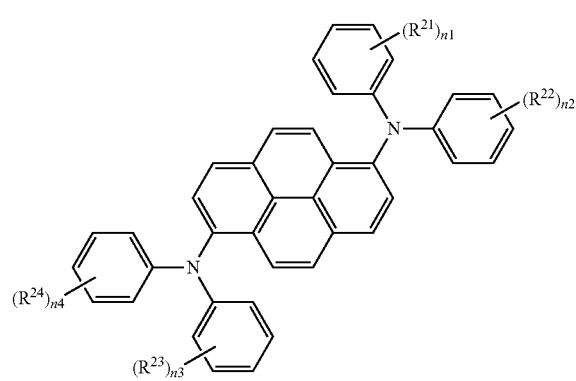

(2-1)

where: $R^{21}$ to $R^{24}$ each independently represent a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, or a substituted or unsubstituted aralkyl group having 7 to 50 carbon atoms, and when adjacent alkyl groups are present on the same benzene ring, the adjacent alkyl groups may be bonded to each other to form a substituted or unsubstituted, divalent bonding group, provided that a case where the adjacent alkyl groups form a α-naphthyl group together with the benzene ring to which the groups are bonded is excluded; and n1 to n4 each independently represent an integer of 0 to 5, and at least one of n1 to n4 represents an integer of 1 to 5;

[Chem 4]

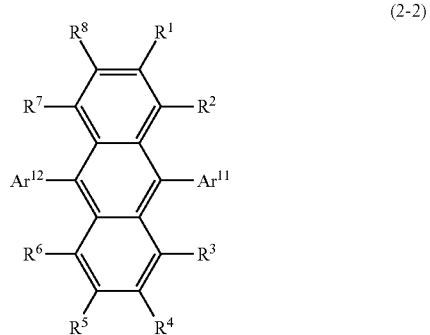

(2-2)

where $Ar^{11}$ and $Ar^{12}$ each independently represent a substituted or unsubstituted aryl group having 6 to 20 ring carbon atoms, and $R^1$ to $R^8$ each independently represent a group selected from a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group, provided that, when one of $Ar^{11}$ and $Ar^{12}$ represents a substituted or unsubstituted β-naphthyl group, the other represents a group excluding a substituted or unsubstituted arylphenylene group and a substituted or unsubstituted fluorenylphenylene group.

Further, the present invention provides an organic electroluminescence device containing one or more organic thin film layers including a light emitting layer between a cathode and an anode, in which at least one layer of the organic thin film layers contains the organic luminescent medium according to the first invention or the second invention.

Effects of the Invention

According to the present invention, there can be provided an organic EL device capable of emitting light having a short wavelength (such as blue light) with high luminous efficiency and having a long lifetime, and an organic luminescent medium that can be used in an organic thin film layer of the organic EL device.

BEST MODE FOR CARRYING OUT THE INVENTION

[First Invention]
[Organic Luminescent Medium]

An organic luminescent medium of a first invention contains a specific diaminopyrene derivative and a specific anthracene derivative. The organic luminescent medium contributes as a constituting component for an organic thin film layer of an organic EL device to light emission, and is present as, for example, a deposited product in the layer. In addition, when the medium is used in the organic EL device, the medium enables the emission of light having a short wavelength typified by the emission of blue light with high luminous efficiency, and can contribute to the lengthening of the lifetime of the device. Hereinafter, the diaminopyrene derivative and the anthracene derivative according to the first invention are described.

(Diaminopyrene Derivative)

The diaminopyrene derivative according to the first invention is represented by the following formula (1-1).

[Chem 5]

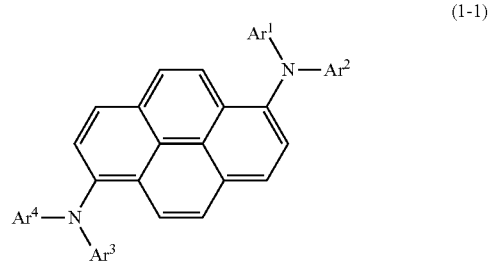

(1-1)

(In the formula (1-1), $Ar^1$ to $Ar^4$ each independently represent a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, or a substituted or unsubstituted heterocyclic group having 5 to 50 ring atoms, provided that one or more of $Ar^1$ to $Ar^4$ each represent an α-naphthyl group.)

It should be noted that, in the first invention, the term "ring carbon atoms" means carbon atoms of which a saturated ring, unsaturated ring, or aromatic ring is constituted, and the term "ring atoms" means carbon atoms and heteroatoms of which heterocycles (including a saturated ring, an unsaturated ring, and an aromatic ring) are constituted.

In addition, examples of a substituent in "substituted or unsubstituted . . . " include an alkyl group, an aryl group, a cycloalkyl group, an alkoxy group, a heterocyclic group, an aralkyl group, an aryloxy group, an arylthio group, an alkoxycarbonyl group, a halogen atom, a hydroxyl group, a nitro group, a cyano group, a carboxyl group, a dibenzofuranyl group, and a fluorenyl group as described below.

Examples of the aryl group represented by any one of $Ar^1$ to $Ar^4$ include a phenyl group, a 2-methylphenyl group, a 3-methylphenyl group, a 4-methylphenyl group, a 4-ethylphenyl group, a biphenyl group, a 4-methylbiphenyl group, a 4-ethylbiphenyl group, a 4-cyclohexylbiphenyl group, a terphenyl group, a 3,5-dichlorophenyl group, a 1-naphthyl group, a 2-naphthyl group, a 5-methylnaphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 6-chrysenyl group, a 1-benzo[c]phenanthryl group, a 2-benzo[c]phenanthryl group, a 3-benzo[c]phenanthryl group, a 4-benzo[c]phenanthryl group, a 5-benzo[c]phenanthryl group, a 6-benzo[c]phenanthryl group, a 1-benzo[g]chrysenyl group, a 2-benzo[g]chrysenyl group, a 3-benzo[g]chrysenyl group, a 4-benzo[g]chrysenyl group, a 5-benzo[g]chrysenyl group, a 6-benzo[g]chrysenyl group, a 7-benzo[g]chrysenyl group, an 8-benzo[g]chrysenyl group, a 9-benzo[g]chrysenyl group, a 10-benzo[g]chrysenyl group, an 11-benzo[g]chrysenyl group, a 12-benzo[g]chrysenyl group, a 13-benzo[g]chrysenyl group, a 14-benzo[g]chrysenyl group, a 1-triphenyl group, a 2-triphenyl group, a 2-fluorenyl group, a 9,9-dimethylfluoren-2-yl group, a benzofluorenyl group, a dibenzofluorenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl) phenyl group, a 3-methyl-2-naphthyl group, a 4-methyl-1-naphthyl group, a 4-methyl-1-anthryl group, a 4'-methylbiphenylyl group, a 4''-t-butyl-p-terphenyl-4-yl group, a fluoranthenyl group, and a perylenyl group. Of those, a substituted or unsubstituted aryl group having 10 to 14 ring carbon atoms is preferred, and a 1-naphthyl group, a 2-naphthyl group, and a 9-phenanthryl group are particularly preferred.

Examples of the alkyl group represented by any one of $Ar^1$ to $Ar^4$ include a methyl group, an ethyl group, a propyl group, an isopropyl group, a butyl group, a sec-butyl group, a tert-butyl group, a pentyl group, a hexyl group, a heptyl group, an octyl group, a stearyl group, a 2-phenylisopropyl group, a trichloromethyl group, a trifluoromethyl group, a benzyl group, an α-phenoxybenzyl group, an α,α-dimethylbenzyl group, an α,α-methylphenylbenzyl group, an α,α-ditrifluoromethylbenzyl group, a triphenylmethyl group, and an α-benzyloxybenzyl group.

Examples of the cycloalkyl group represented by any one of $Ar^1$ to $Ar^4$ include a cyclopropyl group, a cyclobutyl group, a cyclopentyl group, a cyclohexyl group, a cycloheptyl group, a cyclooctyl group, a cyclononyl group, a bicycloheptyl group, a bicyclooctyl group, a tricycloheptyl group, and an adamantyl group. Of those, a cyclopentyl group, a cyclohexyl group, a cycloheptyl group, a bicycloheptyl group, a bicyclooctyl group, and an adamantyl group are preferred.

Examples of the heterocyclic group represented by any one of $Ar^1$ to $Ar^4$ include residues of imidazole, benzimidazole, pyrrole, furan, thiophene, oxadiazoline, indoline, carbazole, pyridine, quinoline, isoquinoline, benzoquinone, pyralozine, imidazolidine, and piperidine.

The diaminopyrene derivative represented by the formula (1-1) is preferably a diaminopyrene derivative represented by the following formula (1-1A), or more preferably a diaminopyrene derivative represented by the following formula (1-1a).

[Chem 6]

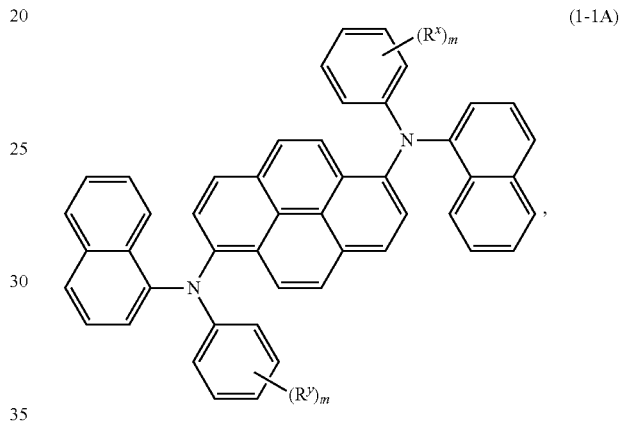

(1-1A)

(In the above formula (1-1A), $R^x$ and $R^y$ each independently represent an alkyl group having 1 to 5 carbon atoms, and m represents an integer of 1 to 5.)

[Chem 7]

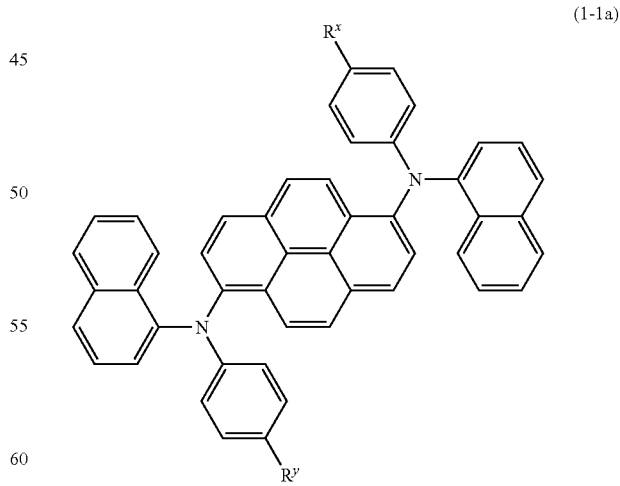

(1-1a)

(In the above formula (1-1a), $R^x$ and $R^y$ each independently represent an alkyl group having 1 to 5 carbon atoms.)

Specific examples of the diaminopyrene derivative represented by the formula (1-1) include compounds represented by the following formulae.

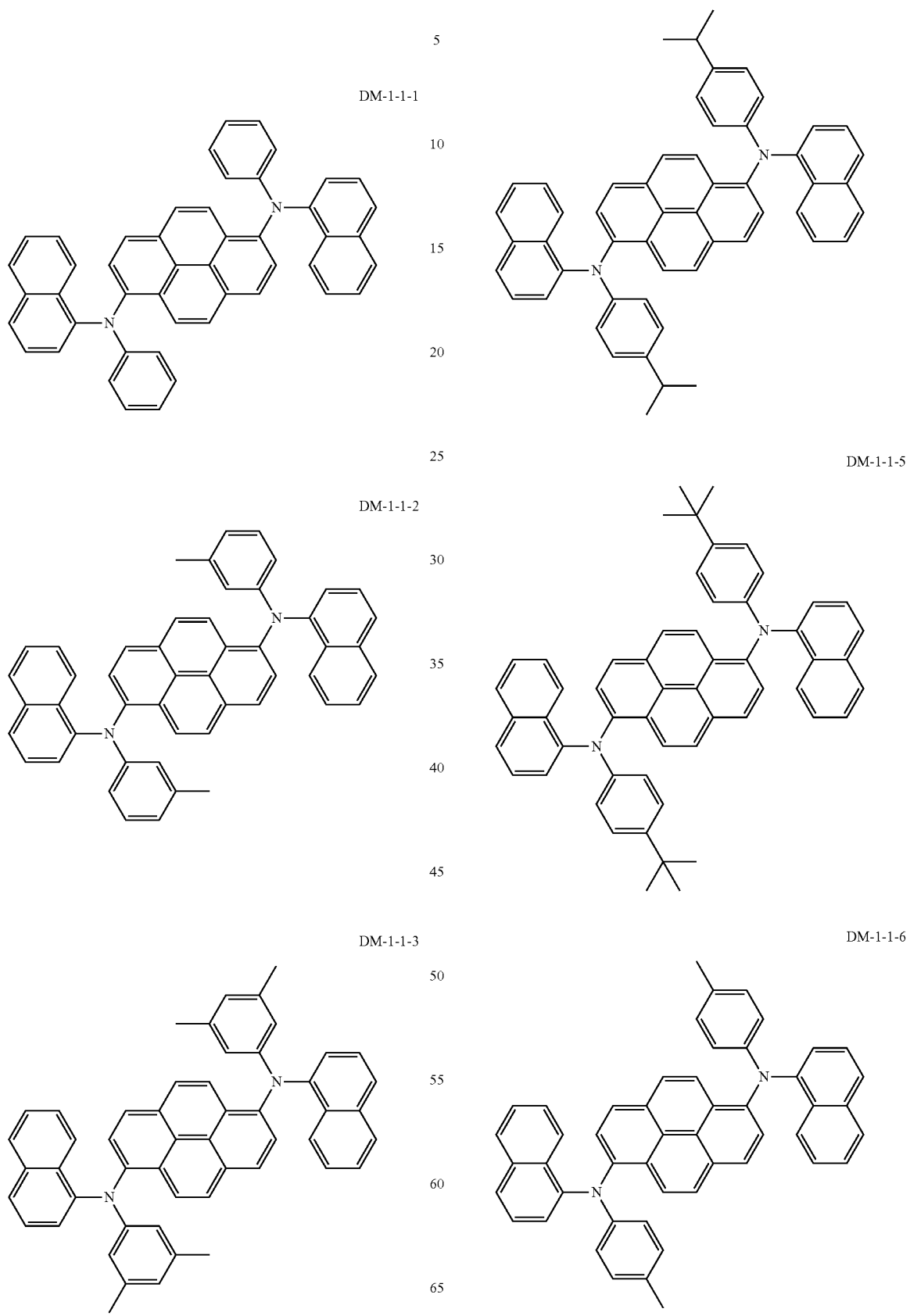

DM-1-1-7
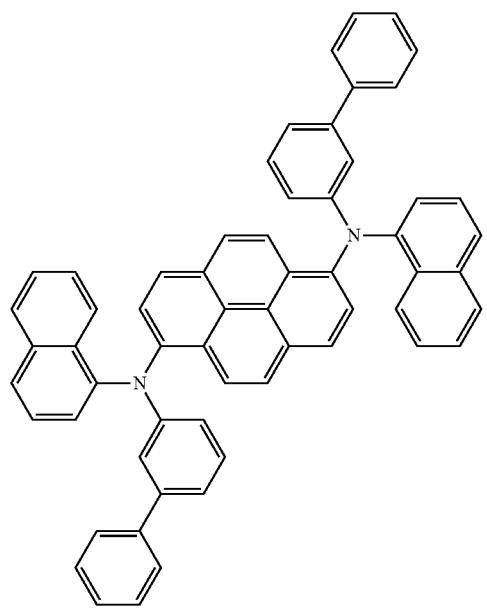
DM-1-1-8
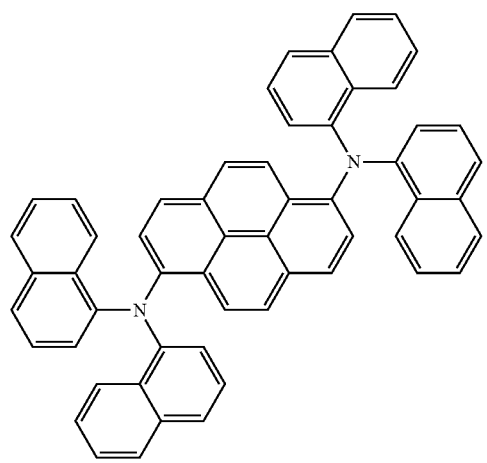
DM-1-1-9
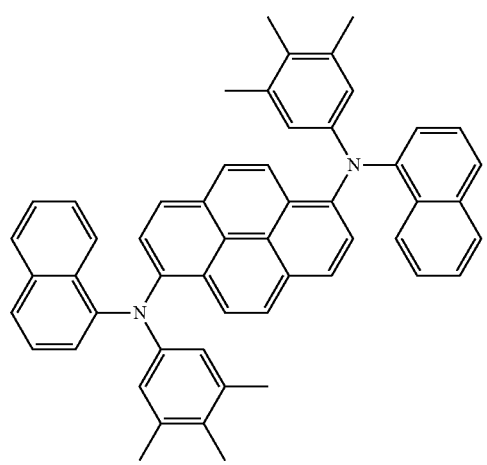
DM-1-2-1
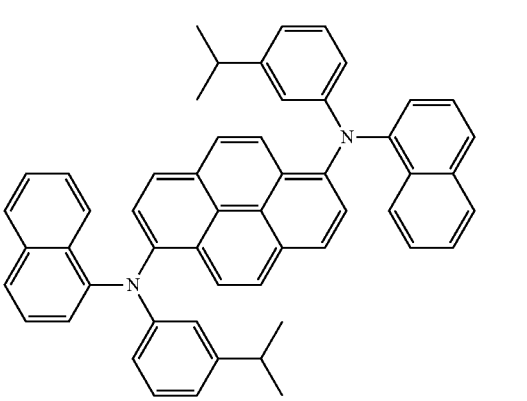
DM-1-2-2
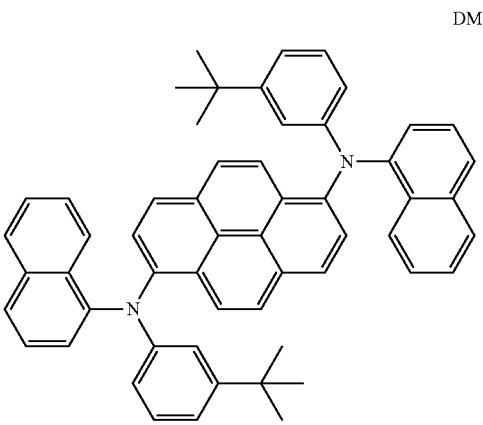
DM-1-2-3
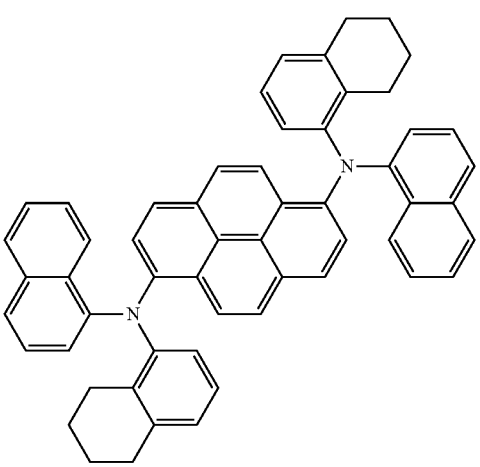

DM-1-2-4
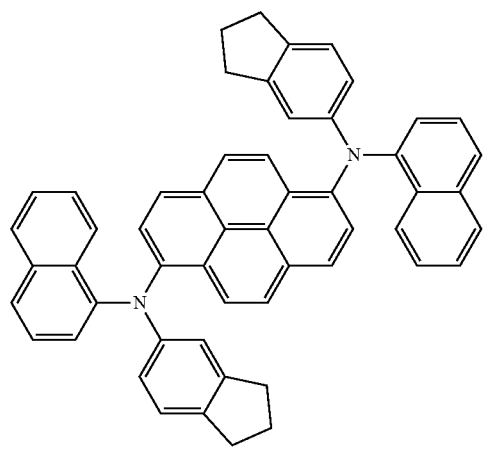
DM-1-2-5
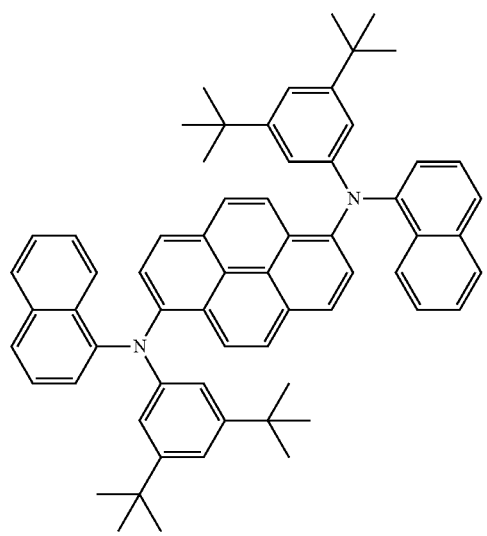
DM-1-2-6
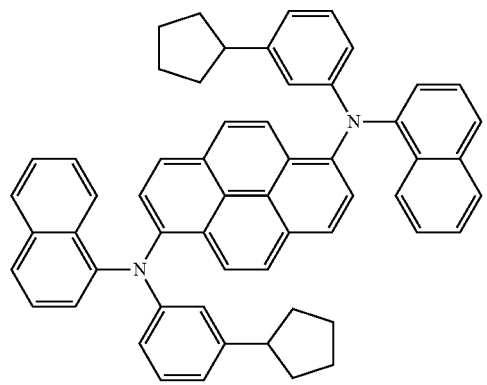
DM-1-2-7
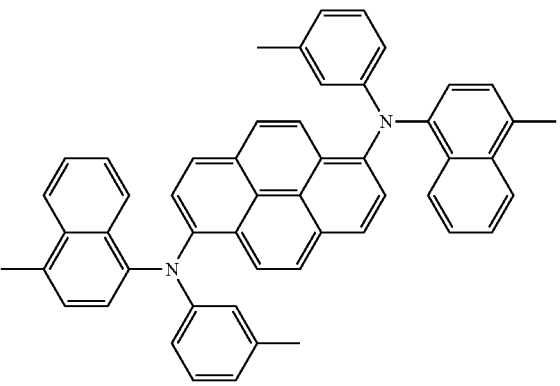
DM-1-2-8
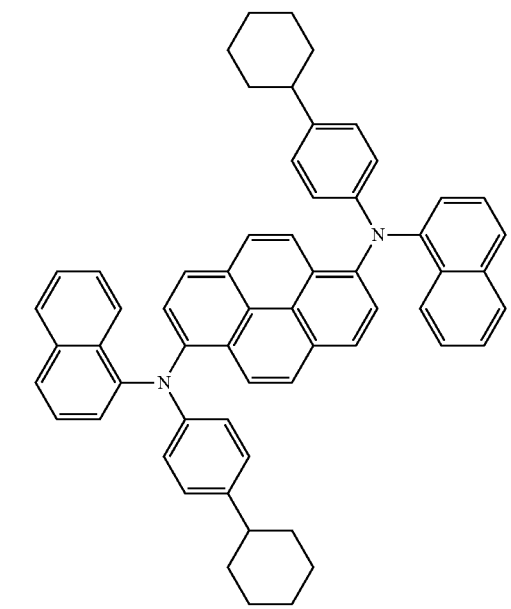
DM-1-2-9
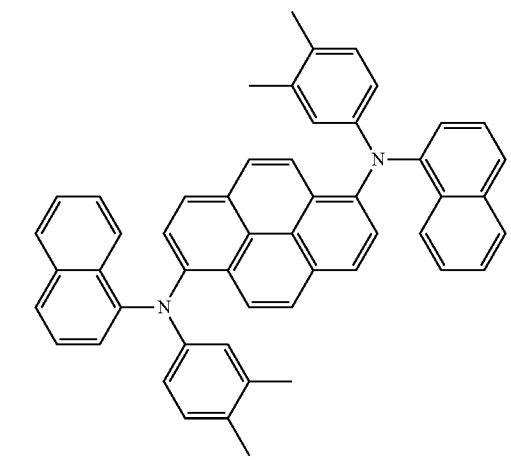
(Anthracene Derivative)
The anthracene derivative according to the present invention is represented by the following formula (1-2).

[Chem 10]

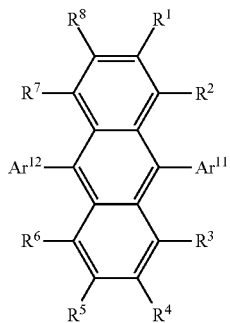

(1-2)

(In the formula (1-2), $Ar^{11}$ and $Ar^{12}$ each independently represent a substituted or unsubstituted aryl group having 6 to 20 ring carbon atoms, and $R^1$ to $R^8$ each independently represent a group selected from a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group.)

The anthracene derivative according to the first invention is preferably any one of the following anthracene derivatives (1-A), (1-B), and (1-C), and is selected depending on the constitution of an organic EL device to which the derivative is applied and characteristics requested of the device.

(Anthracene Derivative (1-A))

The anthracene derivative is such that $Ar^{11}$ and $Ar^{12}$ in the formula (1-2) each independently represent a substituted or unsubstituted, fused aryl group having 10 to 20 ring carbon atoms. The anthracene derivative can be classified into the case where $Ar^{11}$ and $Ar^{12}$ represent the same group, and the case where $Ar^{11}$ and $Ar^{12}$ represent different groups. Specific examples of the derivative include anthracene derivatives represented by the following formulae (1-2-1) to (1-2-3), and an anthracene derivative in which $Ar^{11}$ and $Ar^{12}$ in the formula (1-2) represent different groups.

The anthracene derivative represented by the following formula (1-2-1) is such that $Ar^{11}$ and $Ar^{12}$ each represent a substituted or unsubstituted 9-phenanthrenyl group.

[Chem 11]

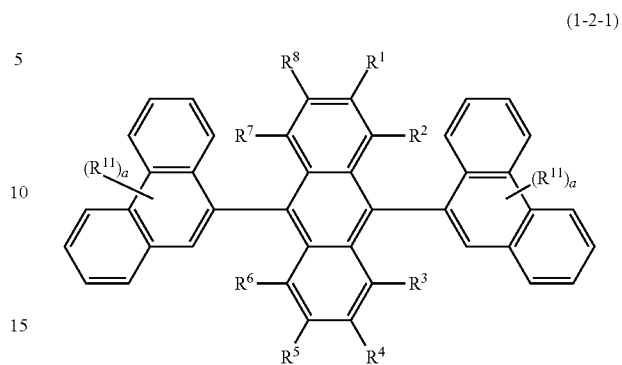

(1-2-1)

(In the formula (1-2-1): $R^{11}$ represents a group selected from a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group; a represents an integer of 0 to 9; when a represents an integer of 2 or more, a plurality of $R^{11}$'s may be identical to or different from each other on condition that the two substituted or unsubstituted phenanthrenyl groups are identical to each other; and the position at which $R^{11}$ is bonded to each phenanthrenyl group is not limited.)

The anthracene derivative represented by the following formula (1-2-2) is such that $Ar^{11}$ and $Ar^{12}$ in the formula (1-2) each represent a substituted or unsubstituted β-naphthyl group.

[Chem 12]

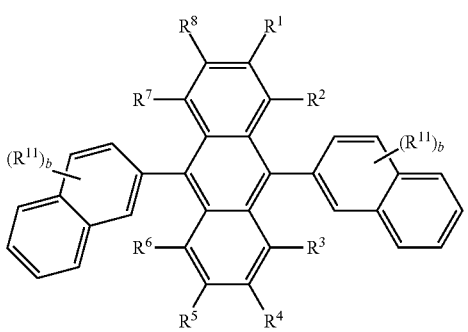

(1-2-2)

(In the formula (1-2-2): $R^1$ to $R^8$ and $R^{11}$ each have the same meaning as that in the formula (1-2-1); b represents an integer of 1 to 7; when b represents an integer of 2 or more, a plurality of $R^{11}$'s may be identical to or different from each other on condition that the two substituted or unsubstituted β-naphthyl groups are identical to each other; and the position at which $R^{11}$ is bonded to each β-naphthyl group is not limited.)

The anthracene derivative represented by the following formula (1-2-3) is such that $Ar^{11}$ and $Ar^{12}$ in the formula (1-2) each represent a substituted or unsubstituted α-naphthyl group.

[Chem 13]

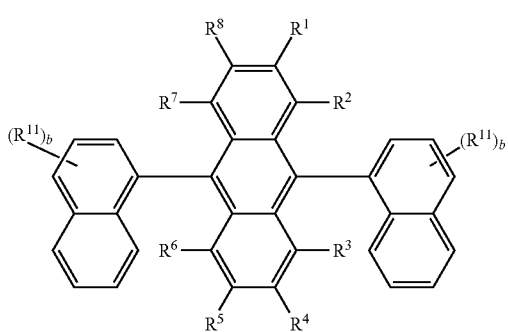

(1-2-3)

(In the formula (1-2-3): $R^1$ to $R^8$ and $R^{11}$, and b each have the same meaning as that in the formula (1-2-1); when b represents an integer of 2 or more, a plurality of $R^{11}$'s may be identical to or different from each other on condition that the two substituted or unsubstituted α-naphthyl groups are identical to each other; and the position at which $R^{11}$ is bonded to each α-naphthyl group is not limited.)

The anthracene derivative in which $Ar^{11}$ and $Ar^{12}$ in the formula (1-2) represent different groups is preferably such that $Ar^{11}$ and $Ar^{12}$ each represent any one of the substituted or unsubstituted 9-phenanthrenyl group, substituted or unsubstituted α-naphthyl group, and substituted or unsubstituted β-naphthyl group described above.

(Anthracene Derivative (1-B))

The anthracene derivative is such that one of $Ar^{11}$ and $Ar^{12}$ in the formula (1-2) represents a substituted or unsubstituted phenyl group, and the other represents a substituted or unsubstituted, fused aryl group having 10 to 20 ring carbon atoms. Specific examples of the anthracene derivative include anthracene derivatives represented by the following formulae (1-2-4) and (1-2-5).

The anthracene derivative represented by the following formula (1-2-4) is such that $Ar^{11}$ in the formula (1-2) represents a substituted or unsubstituted α-naphthyl group, and $Ar^{12}$ in the formula represents a substituted or unsubstituted phenyl group.

[Chem 14]

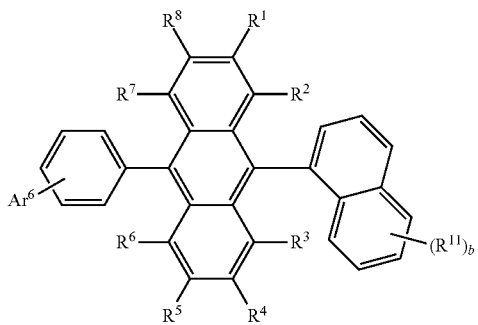

(1-2-4)

(In the formula (1-2-4): $R^1$ to $R^8$ each have the same meaning as that described above; $Ar^6$ represents a substituted or unsubstituted aryl group having 6 to 50 ring carbon atoms, a substituted or unsubstituted alkyl group having 1 to 50 ring carbon atoms, a substituted or unsubstituted cycloalkyl group having 3 to 50 ring carbon atoms, a substituted or unsubstituted aralkyl group having 7 to 50 carbon atoms, or a substituted or unsubstituted heterocyclic group having 5 to 50 ring atoms, and $Ar^6$ may form a substituted or unsubstituted fluorenyl group, or a substituted or unsubstituted dibenzofluorenyl group together with the phenylene group substituted with $Ar^6$; $R^{11}$ and b each have the same meaning as that in the formula (1-2-1); when b represents an integer of 2 or more, a plurality of $R^{11}$'s may be identical to or different from each other; and the position at which $R^{11}$ is bonded to the α-naphthyl group is not limited.)

The anthracene derivative represented by the following formula (1-2-5) is such that $Ar^{11}$ in the formula (1-2) represents a substituted or unsubstituted β-naphthyl group, and $Ar^{12}$ in the formula represents a substituted or unsubstituted phenyl group.

[Chem 15]

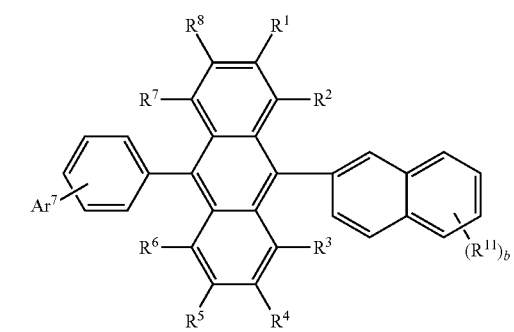

(1-2-5)

(In the formula (1-2-5): $Ar^7$ is the same as $Ar^6$ in the formula (1-2-4); $R^1$ to $R^8$ and $R^{11}$, and b each have the same meaning as that in the formula (1-2-1); when b represents an integer of 2 or more, a plurality of $R^{11}$'s may be identical to or different from each other; and the position at which $R^{11}$ is bonded to the β-naphthyl group is not limited.)

(Anthracene Derivative (1-C))

The anthracene derivative is represented by the following formula (1-2-6). To be specific, the derivative is preferably a derivative represented by any one of the following formulae (1-2-6-1), (1-2-6-2), and (1-2-6-3).

[Chem 16]

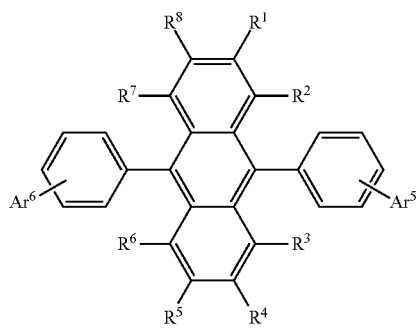

(1-2-6)

(In the formula (1-2-6), $R^1$ to $R^8$ each have the same meaning as that in the formula (1-2), and $Ar^5$ is the same as $Ar^6$ in the formula (1-2-4) and selected independently of $Ar^6$.)

[Chem 17]

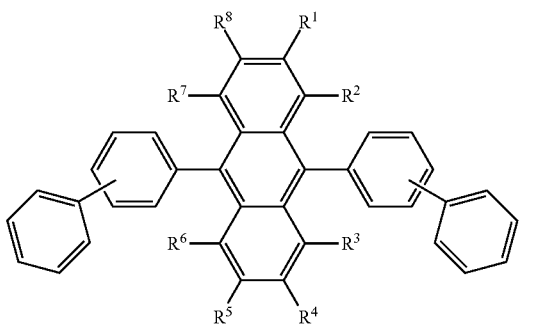

(1-2-6-1)

(In the formula (1-2-6-1), $R^1$ to $R^8$ each have the same meaning as that in the formula (1-2).)

[Chem 18]

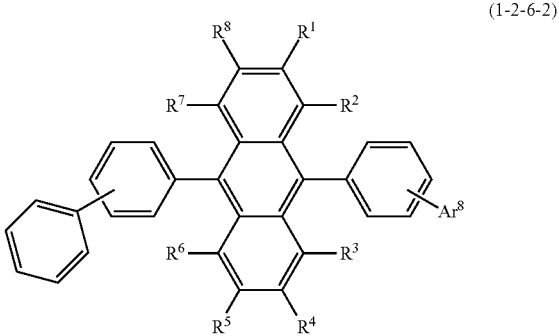

(1-2-6-2)

(In the formula (1-2-6-2), $R^1$ to $R^8$ each have the same meaning as that in the formula (1-2), and $Ar^8$ represents a substituted or unsubstituted, fused aryl group having 10 to 20 ring carbon atoms.)

[Chem 19]

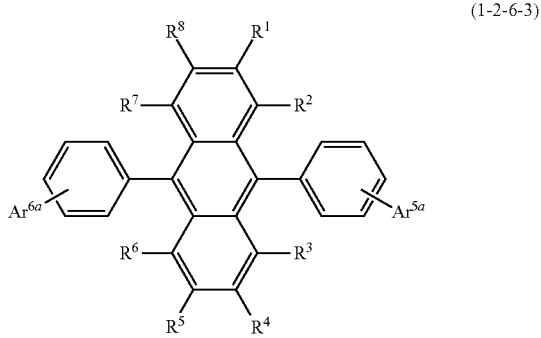

(1-2-6-3)

(In the formula (1-2-6-3), $R^1$ to $R^8$ each have the same meaning as that in the formula (1-2), and $Ar^{5a}$ and $Ar^{6a}$ each independently represent a substituted or unsubstituted, fused aryl group having 10 to 20 ring carbon atoms.)

Examples of the substituted or unsubstituted aryl group having 6 to 20 ring carbon atoms represented by any one of $Ar^{11}$ and $Ar^{12}$ include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 6-chrysenyl group, a 1-benzo[c]phenanthryl group, a 2-benzo[c]phenanthryl group, a 3-benzo[c]phenanthryl group, a 4-benzo[c]phenanthryl group, a 5-benzo[c]phenanthryl group, a 6-benzo[c]phenanthryl group, a 1-benzo[g]chrysenyl group, a 2-benzo[g]chrysenyl group, a 3-benzo[g]chrysenyl group, a 4-benzo[g]chrysenyl group, a 5-benzo[g]chrysenyl group, a 6-benzo[g]chrysenyl group, a 7-benzo[g]chrysenyl group, an 8-benzo[g]chrysenyl group, a 9-benzo[g]chrysenyl group, a 10-benzo[g]chrysenyl group, an 11-benzo[g]chrysenyl group, a 12-benzo[g]chrysenyl group, a 13-benzo[g]chrysenyl group, a 14-benzo[g]chrysenyl group, a 1-triphenyl group, a 2-triphenyl group, a 2-fluorenyl group, a 9,9-dimethylfluoren-2-yl group, a benzofluorenyl group, a dibenzofluorenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, a no-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, and a 4''-t-butyl-p-terphenyl-4-yl group. Of those, a substituted or unsubstituted aryl group having 10 to 14 ring carbon atoms is preferred, and a 1-naphthyl group, a 2-naphthyl group, and a 9-phenanthryl group are particularly preferred.

In addition, examples of the substituted or unsubstituted, fused aryl group having 10 to 20 ring carbon atoms represented by any one of $Ar^{5a}$, $Ar^{6a}$, and $Ar^8$ include a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 6-chrysenyl group, a 1-benzo[c]phenanthryl group, a 2-benzo[c]phenanthryl group, a 3-benzo[c]phenanthryl group, a 4-benzo[c]phenanthryl group, a 5-benzo[c]phenanthryl group, a 6-benzo[c]phenanthryl group, a 1-benzo[g]chrysenyl group, a 2-benzo[g]chrysenyl group, a 3-benzo[g]chrysenyl group, a 4-benzo[g]chrysenyl group, a 5-benzo[g]chrysenyl group, a 6-benzo[g]chrysenyl group, a 7-benzo[g]chrysenyl group, an 8-benzo[g]chrysenyl group, a 9-benzo[g]chrysenyl group, a 10-benzo[g]chrysenyl group, an 11-benzo[g]chrysenyl group, a 12-benzo[g]chrysenyl group, a 13-benzo[g]chrysenyl group, a 14-benzo[g]chrysenyl group, a 1-triphenyl group, a 2-triphenyl group, a benzofluorenyl group, and a dibenzofluorenyl group. Of those, a 1-naphthyl group, a 2-naphthyl group, and a 9-phenanthryl group are particularly preferred.

Examples of the substituted or unsubstituted aryl group having 6 to 50 carbon atoms represented by any one of $R^1$ to $R^8$, $R^{11}$, and $Ar^5$ to $Ar^7$ include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 6-chrysenyl group, a 1-benzo[c]phenanthryl group, a 2-benzo[c]phenanthryl group, a 3-benzo[c]phenanthryl group, a 4-benzo[c]phenanthryl group, a 5-benzo[c]phenanthryl group, a 6-benzo[c]phenanthryl group, a 1-benzo[g]chrysenyl group, a 2-benzo[g]chrysenyl group, a 3-benzo[g]chrysenyl group, a 4-benzo

[g]chrysenyl group, a 5-benzo[g]chrysenyl group, a 6-benzo[g]chrysenyl group, a 7-benzo[g]chrysenyl group, an 8-benzo[g]chrysenyl group, a 9-benzo[g]chrysenyl group, a 10-benzo[g]chrysenyl group, an 11-benzo[g]chrysenyl group, a 12-benzo[g]chrysenyl group, a 13-benzo[g]chrysenyl group, a 14-benzo[g]chrysenyl group, a 1-triphenyl group, a 2-triphenyl group, a 2-fluorenyl group, a 9,9-dimethylfluoren-2-yl group, a benzofluorenyl group, a dibenzofluorenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, and a 4"-t-butyl-p-terphenyl-4-yl group.

Examples of the substituted or unsubstituted heterocyclic group having 5 to 50 ring atoms represented by any one of $R^1$ to $R^8$, $R^{11}$, and $Ar^5$ to $Ar^7$ include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, aquinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenazinyl group, a 2-phenazinyl group, a 1-phenothiazinyl group, a 2-phenothiazinyl group, a 3-phenothiazinyl group, a 4-phenothiazinylgroup, a 10-phenothiazinylgroup, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

Examples of the substituted or unsubstituted alkyl group having 1 to 50 carbon atoms represented by any one of $R^1$ to $R^8$, $R^{11}$, and $Ar^5$ to $Ar^7$ include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, and a 1,2,3-trinitropropyl group.

Examples of the substituted or unsubstituted cycloalkyl group having 3 to 50 ring carbon atoms as the substituent represented by any one of $R^1$ to $R^8$, $R^{11}$, and $Ar^5$ to $Ar^7$ include a cyclopropyl group, a cyclobutyl group, a cyclopentyl group, a cyclohexyl group, a 4-methylcyclohexyl group, a 1-adamantyl group, a 2-adamantyl group, a 1-norbornyl group, and a 2-norbornyl group.

The substituted or unsubstituted alkoxy group having 1 to 50 carbon atoms represented by any one of $R^1$ to $R^8$ and $R^{11}$ is a group represented as —OZ, and Z is selected from the substituted or unsubstituted alkyl groups each having 1 to 50 carbon atoms represented by $R^1$ to $R^8$, $R^{11}$, and $Ar^5$ to $Ar^7$.

Examples of the substituted or unsubstituted aralkyl group having 7 to 50 carbon atoms (the aryl portion having 6 to 49 carbon atoms and the alkyl portion having 1 to 44 carbon atoms) as the substituent represented by any one of $R^1$ to $R^8$, $R^{11}$, and $Ar^5$ to $Ar^7$ include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, an m-methylbenzyl group, an o-methylbenzyl group, a p-chlorobenzyl group, an m-chlorobenzyl group, an o-chlorobenzyl group, a p-bromobenzyl group, an m-bromobenzyl group, an o-bromobenzyl group, a p-iodobenzyl group, an m-iodobenzyl group, an o-iodobenzyl group, a p-hydroxybenzyl group, an m-hydroxybenzyl group, an o-hydroxybenzyl group, a p-aminobenzyl group, an m-aminobenzyl group, an o-aminobenzyl group, a p-nitrobenzyl group, an m-nitrobenzyl group, an o-nitrobenzyl group, a p-cyanobenzyl group, an m-cyanobenzyl group, an o-cyanobenzyl group, a 1-hydroxy-2-phenylisopropyl group, and a 1-chloro-2-phenylisopropyl group.

The substituted or unsubstituted aryloxy group having 6 to 50 ring carbon atoms and the substituted or unsubstituted arylthio group having 6 to 50 ring carbon atoms each represented by any one of $R^1$ to $R^8$ and $R^{11}$ are represented as —OY and —SY, respectively. Each Y is selected from the substituted or unsubstituted aryl groups each having 6 to 50 ring carbon atoms represented by $R^1$ to $R^8$ and $R^{11}$.

The substituted or unsubstituted alkoxycarbonyl group having 2 to 50 carbon atoms (the alkyl portion having 1 to 49 carbon atoms) represented by any one of $R^1$ to $R^8$ and $R^{11}$ is represented as —COOZ. Z is selected from the substituted or unsubstituted alkyl groups each having 1 to 49 carbon atoms represented by $R^1$ to $R^8$, $R^{11}$, and $Ar^5$ to $Ar^7$.

Examples of the substituted silyl group represented by any one of $R^1$ to $R^8$ and $R^{11}$ include a trimethylsilyl group, a triethylsilyl group, a t-butyldimethylsilyl group, a vinyldimethylsilyl group, a propyldimethylsilyl group, and a triphenylsilyl group.

Examples of the halogen atom represented by any one of $R^1$ to $R^8$ and $R^{11}$ include fluorine, chlorine, bromine, and iodine.

Specific examples of the anthracene derivative represented by the formula (1-2) include derivatives represented by the following formulae.

[Chem 20]

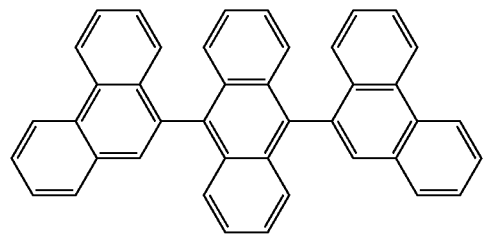

EM1-1

[Chem 21]

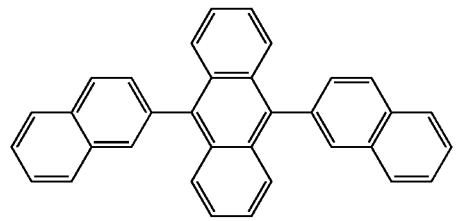

EM1-2

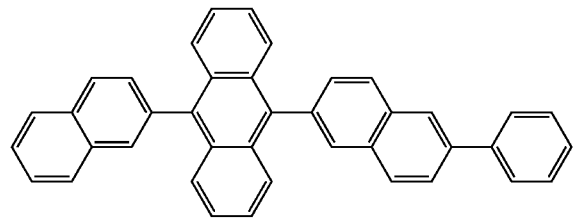

EM1-3

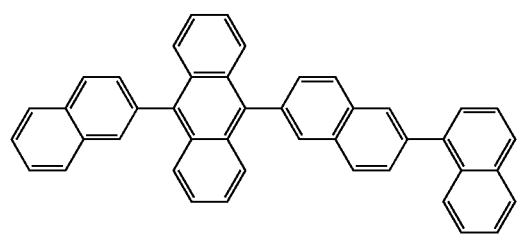

EM1-4

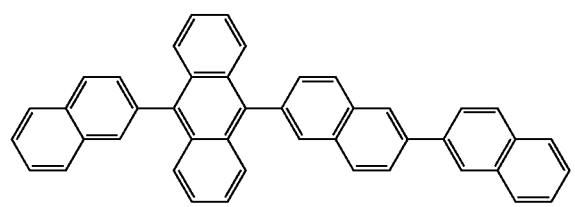

EM1-5

-continued
EM1-6
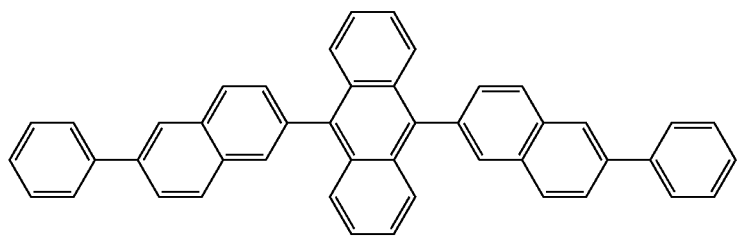
EM1-7
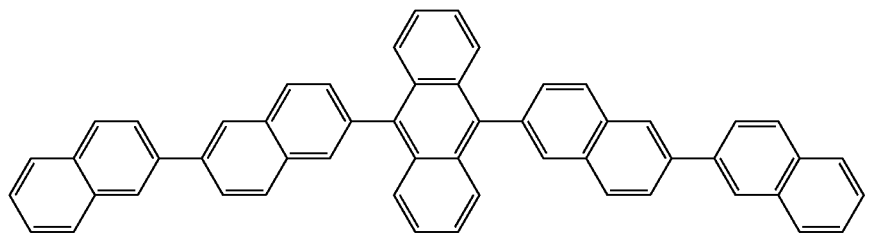
EM1-8
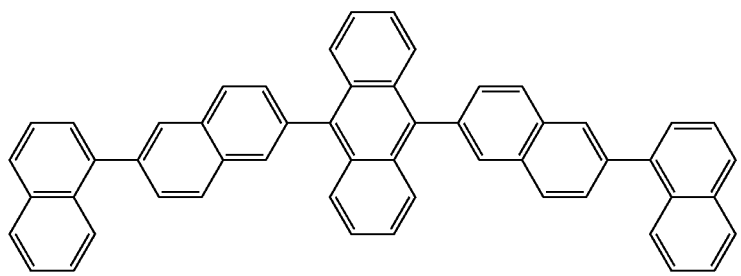
[Chem 22]
EM1-9
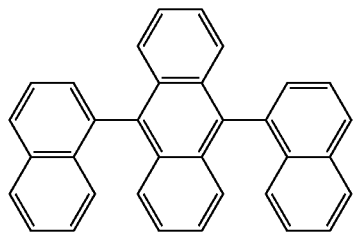
EM1-10
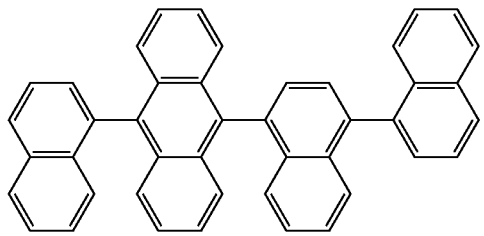
EM1-11
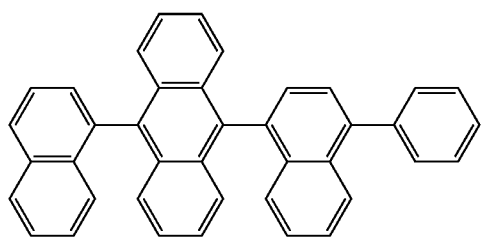
EM1-12
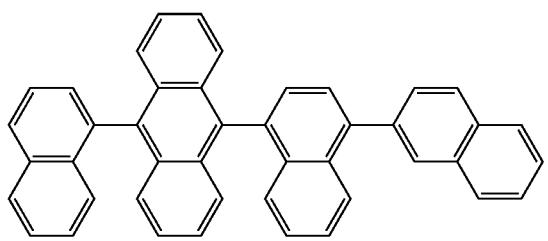
[Chem 23]
EM1-13
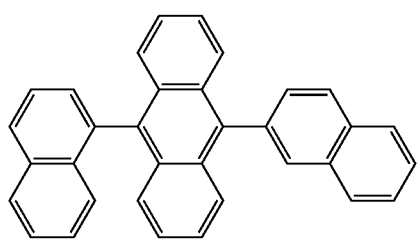
EM1-14
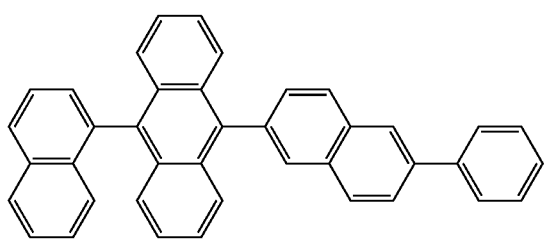

EM1-15
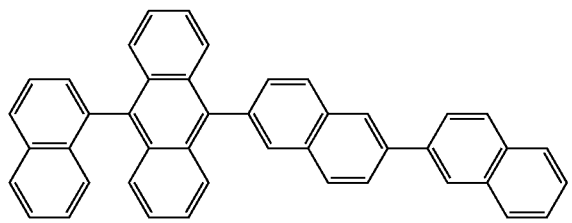
EM1-16
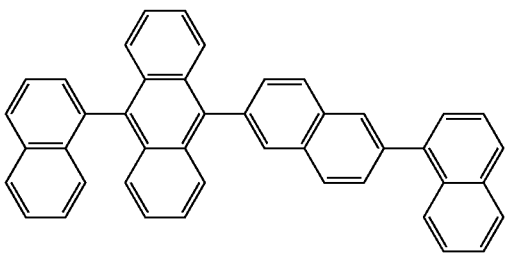
EM1-17
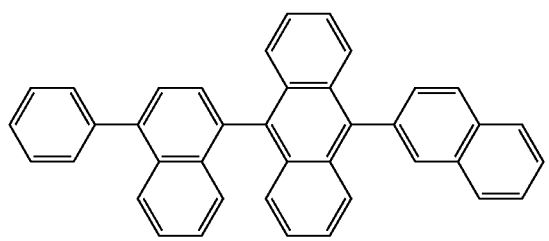
EM1-18
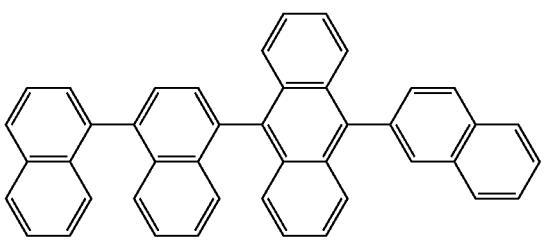
EM1-19
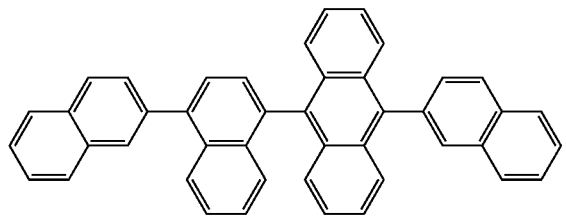
EM1-20
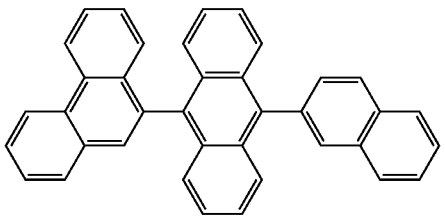
EM1-21
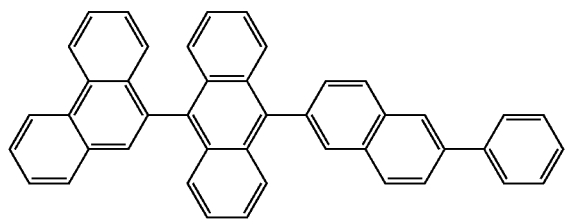
EM1-22
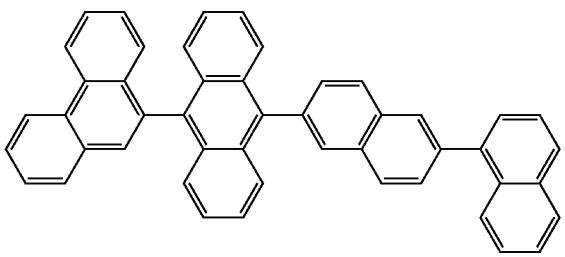
EM1-23
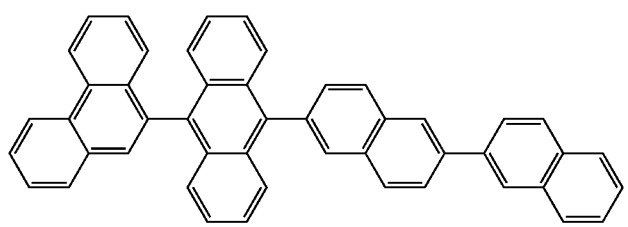
[Chem 24]
EM1-24
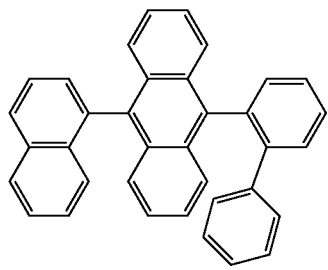
EM1-25
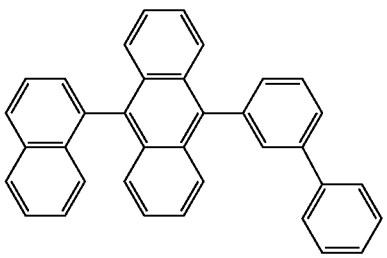

EM1-26
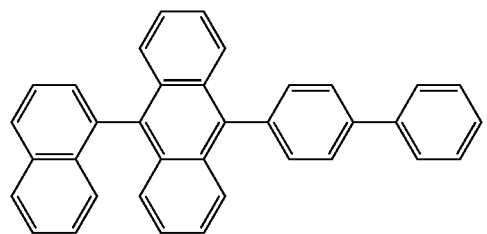
EM1-27
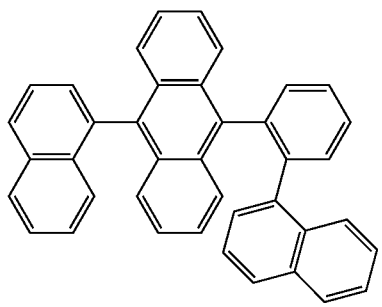
EM1-28
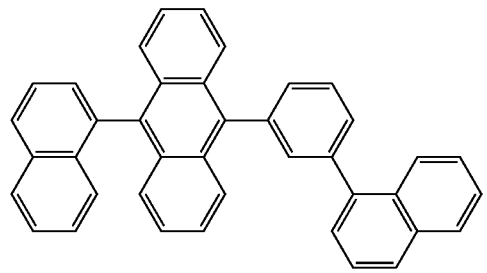
EM1-29
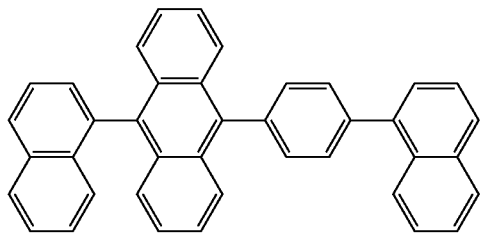
EM1-30
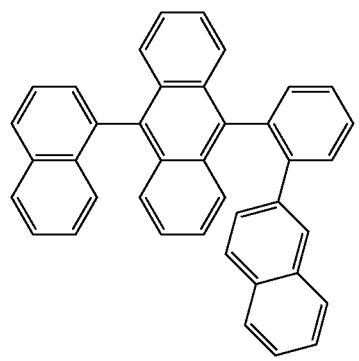
EM1-31
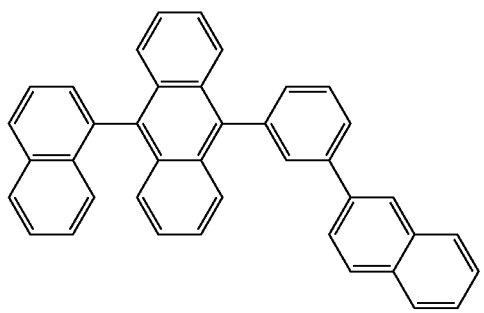
EM1-32
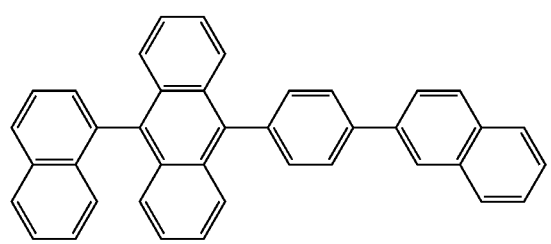
EM1-33
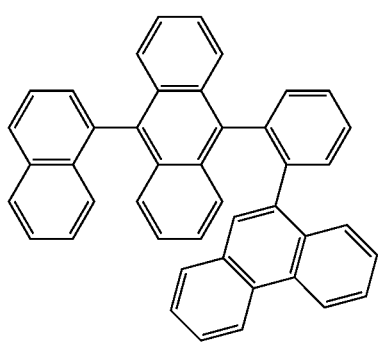
EM1-34
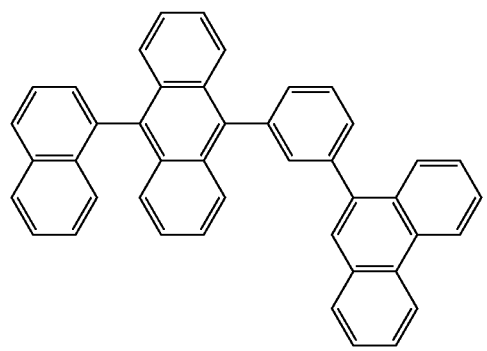
EM1-35
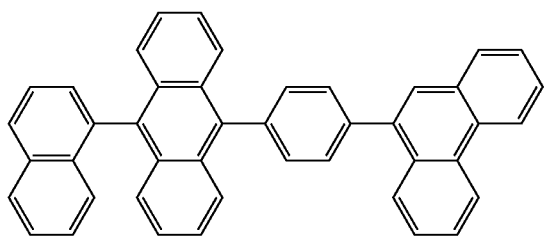

[Chem 25]
EM1-36
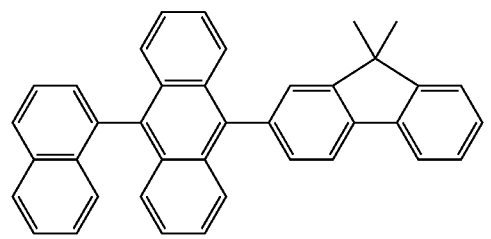
EM1-37
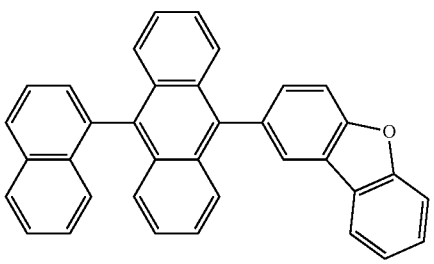
EM1-38
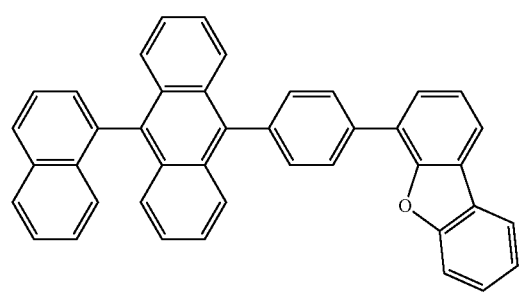
EM1-39
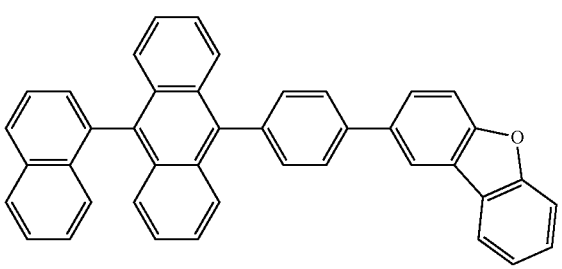
EM1-40
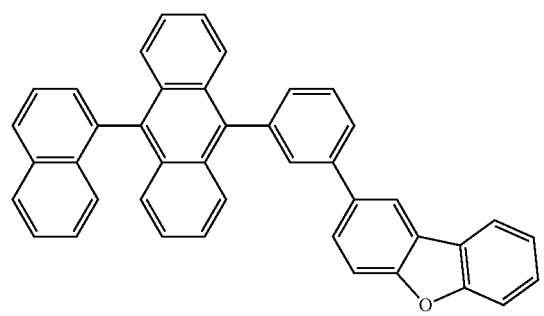
EM1-41
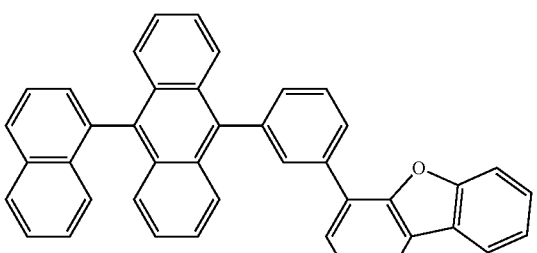
EM1-42
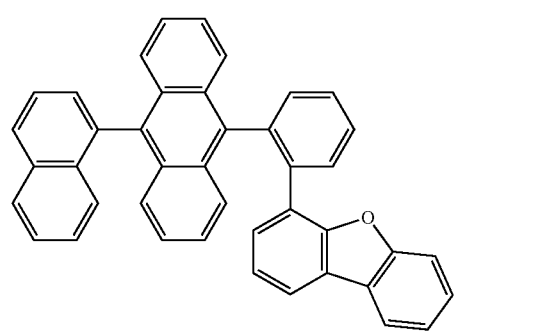
EM1-43
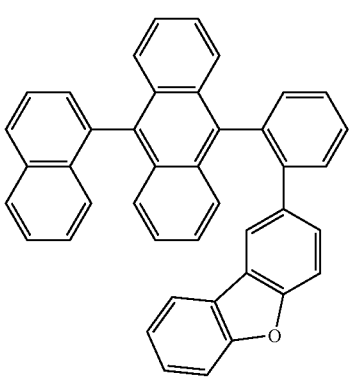
EM1-44
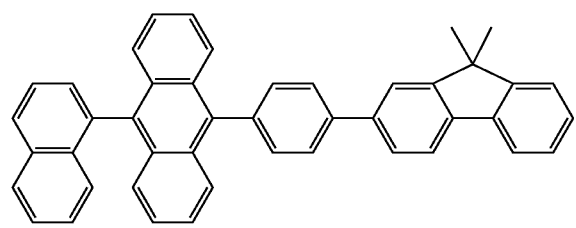
EM1-45
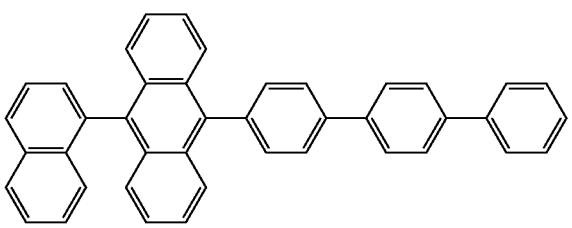

-continued
EM1-46
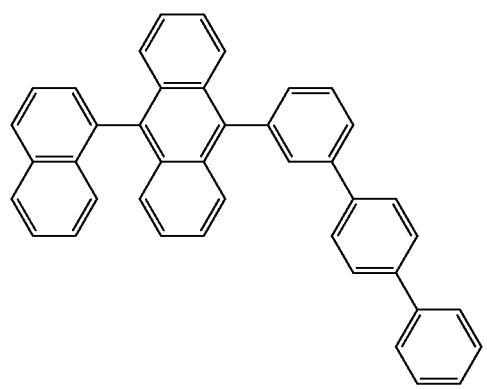
EM1-47
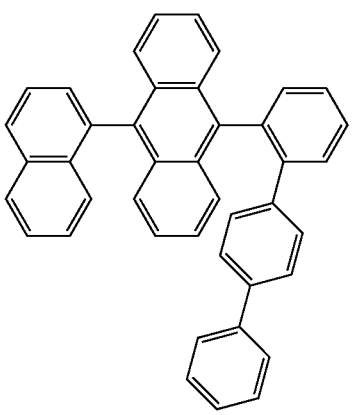
[Chem 26]
EM1-48
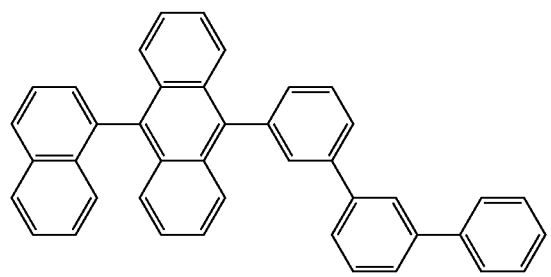
EM1-49
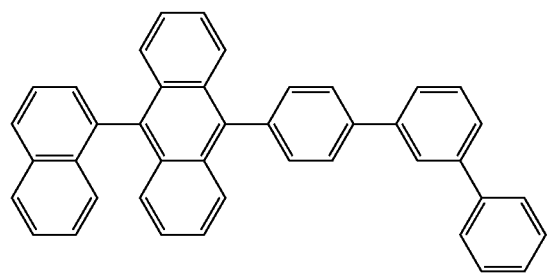
EM1-50
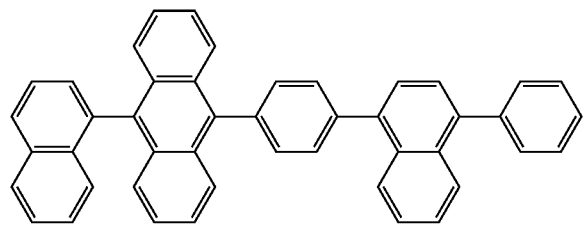
EM1-51
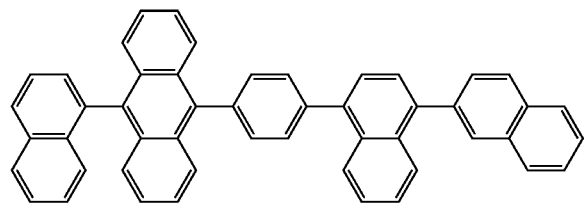
EM1-52
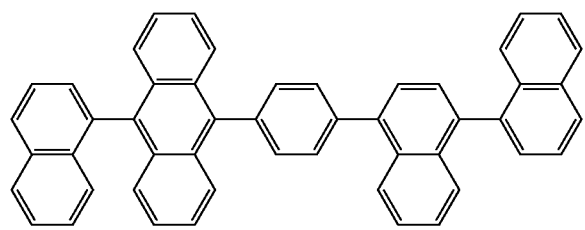
EM1-53
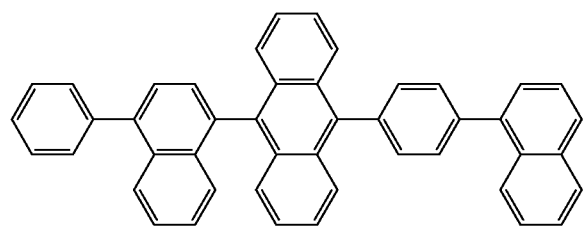
EM1-54
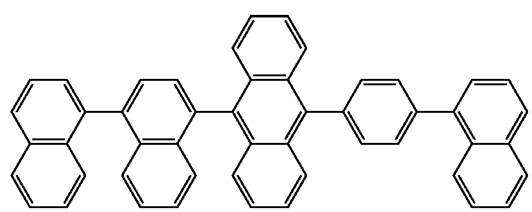
EM1-55
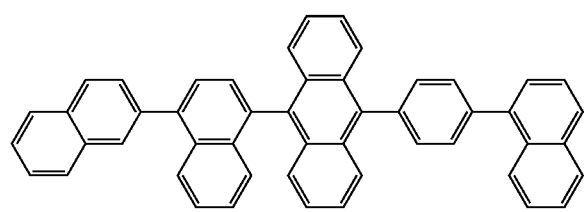

EM1-56
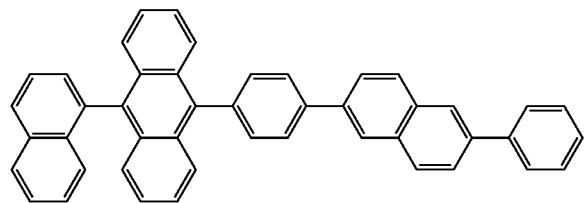
EM1-57
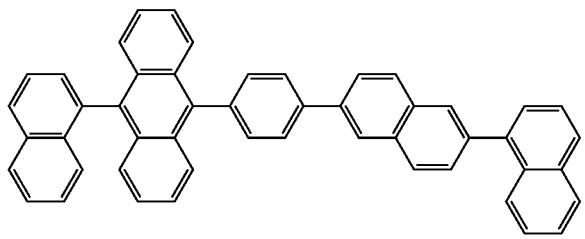
EM1-58
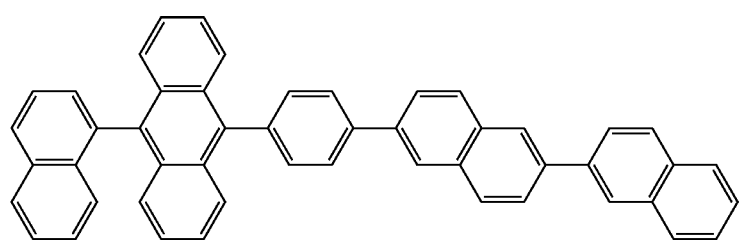
[Chem 27]
EM1-59
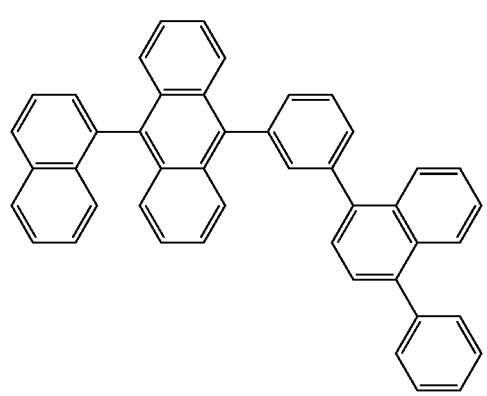
EM1-60
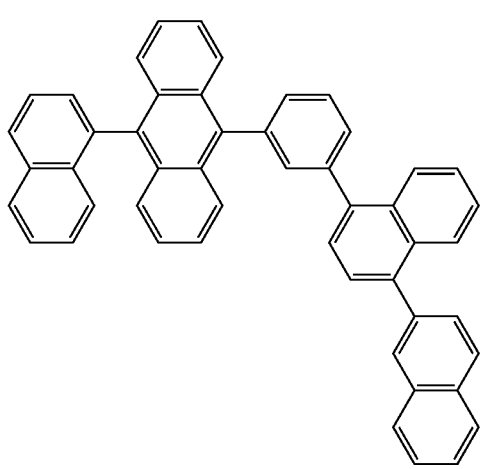
EM1-61
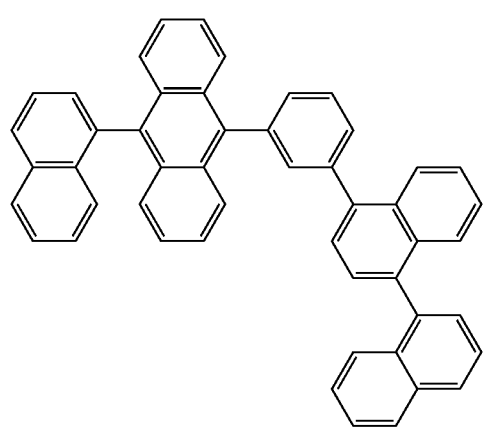
EM1-62
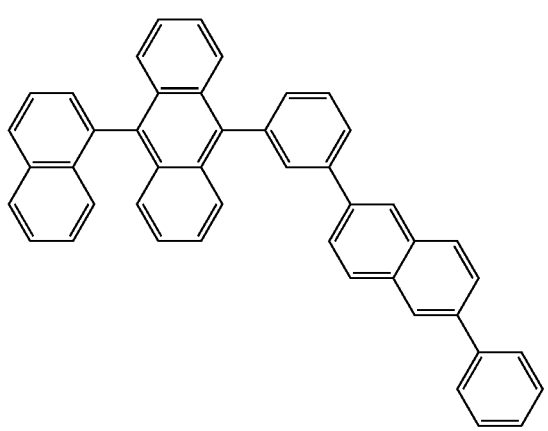

-continued
EM1-63
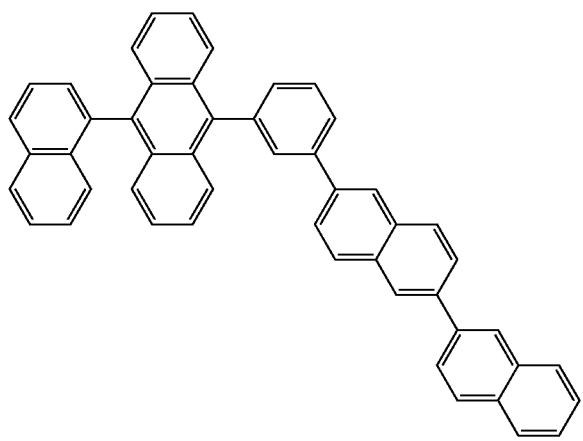
EM1-64
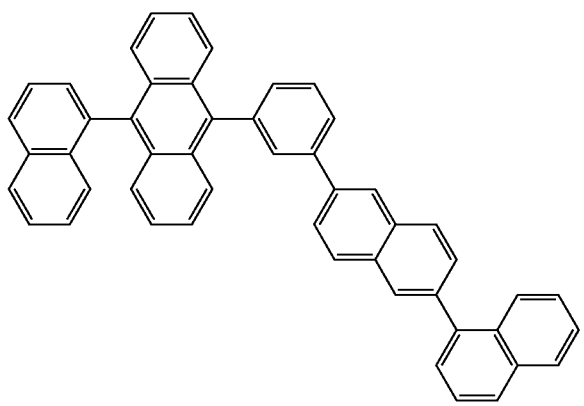
[Chem 28]
EM1-65
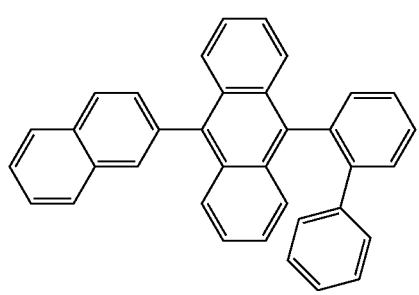
EM1-66
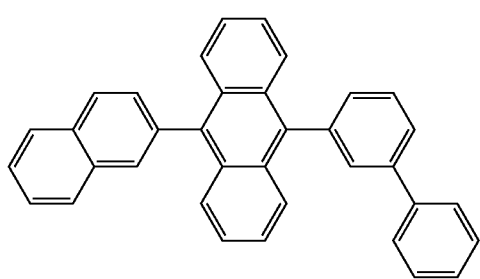
EM1-67
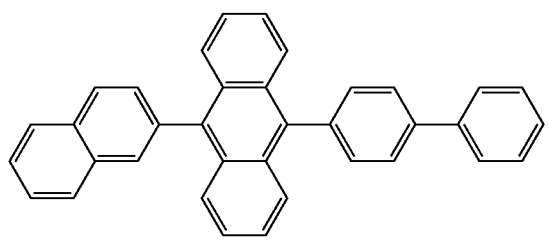
EM1-68
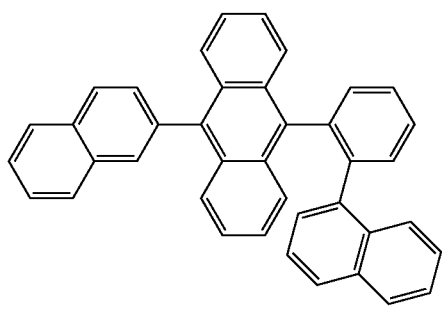
EM1-69
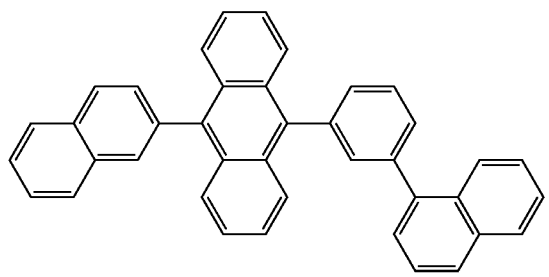
EM1-70
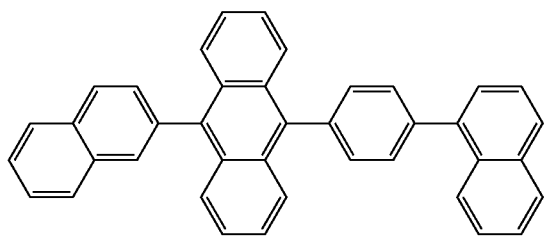

-continued
EM1-71
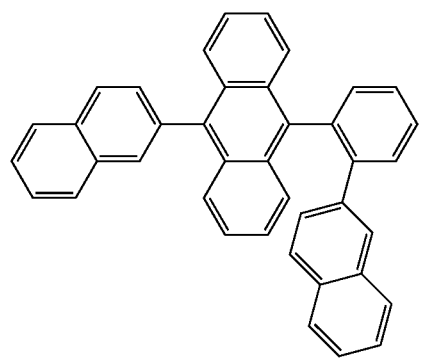
EM1-72
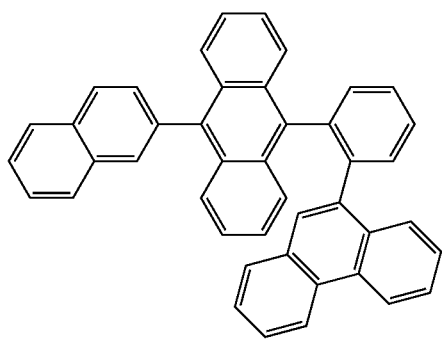
EM1-73
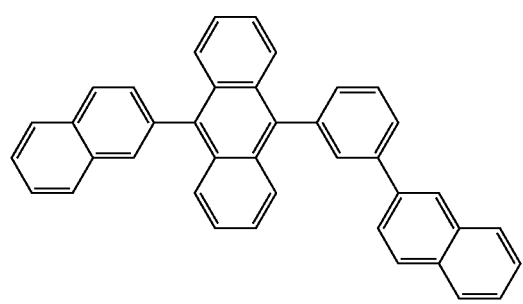
EM1-74
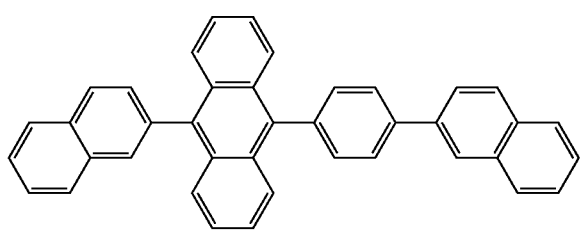
EM1-75
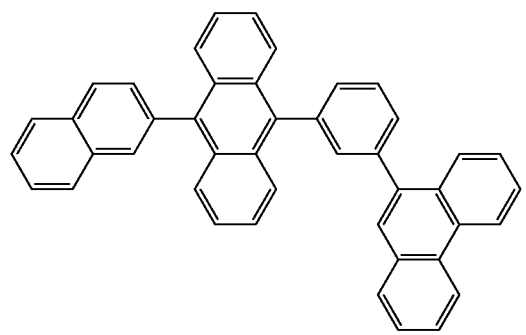
EM1-76
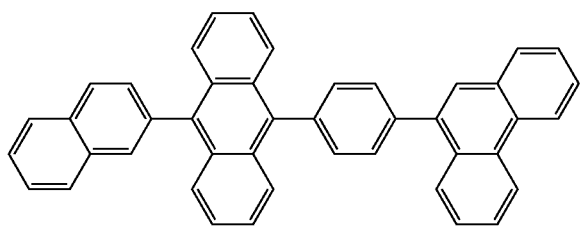
EM1-77
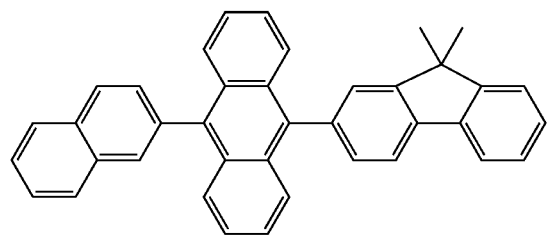
EM1-78
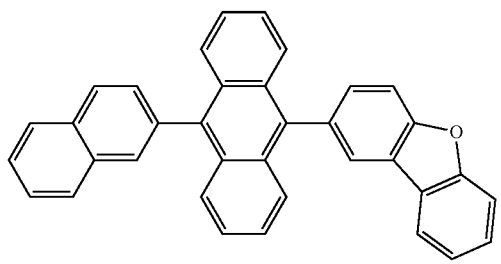
[Chem 29]
EM1-79
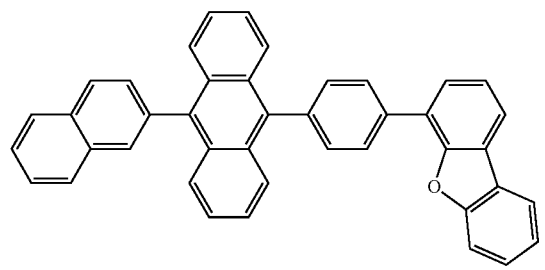
EM1-80
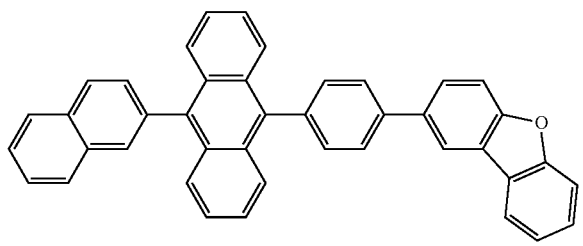

-continued
EM1-81
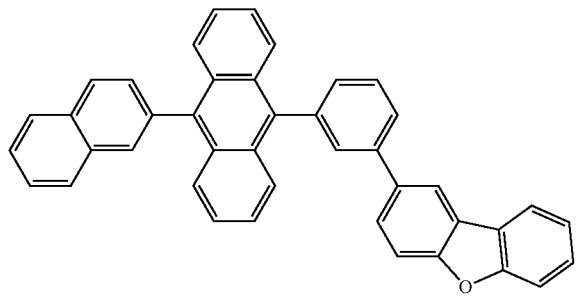
EM1-82
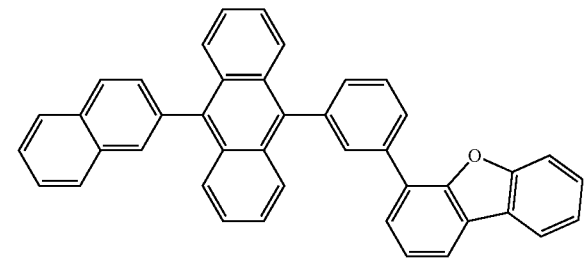
EM1-83
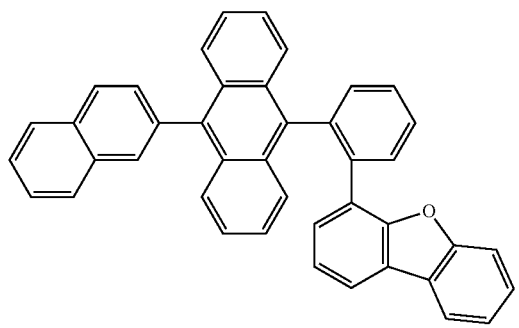
EM1-84
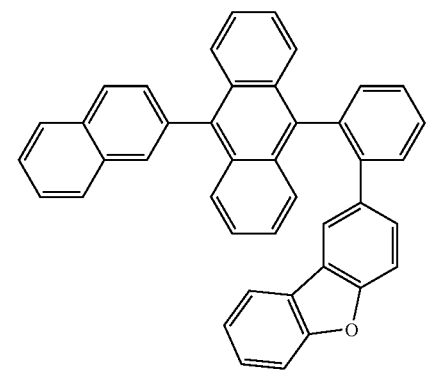
EM1-85
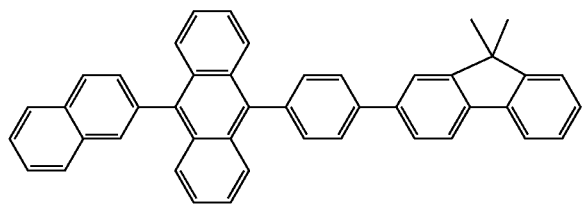
EM1-86
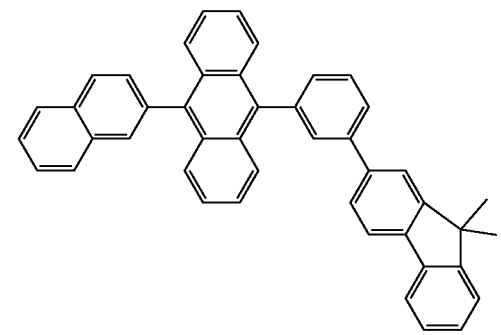
EM1-87
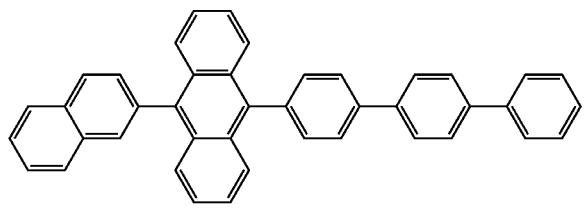
EM1-88
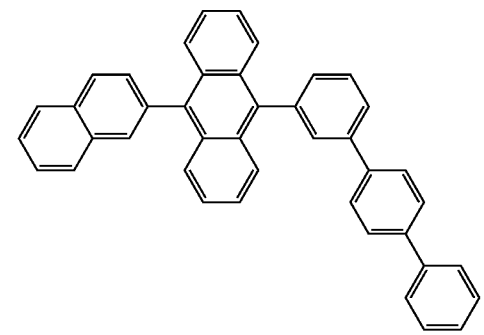

EM1-89
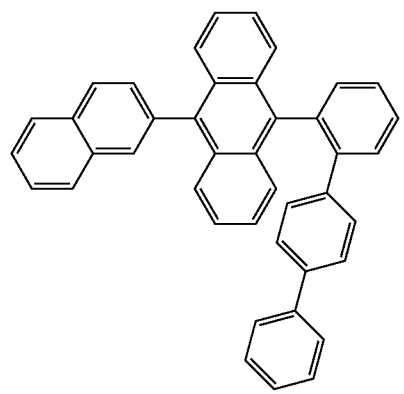
EM1-90
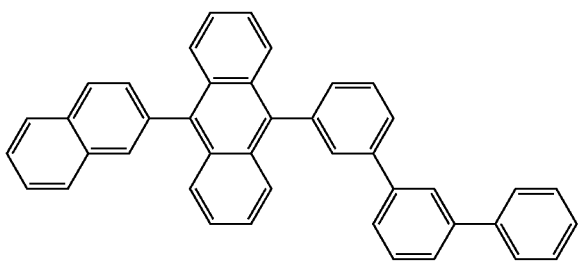
EM1-91
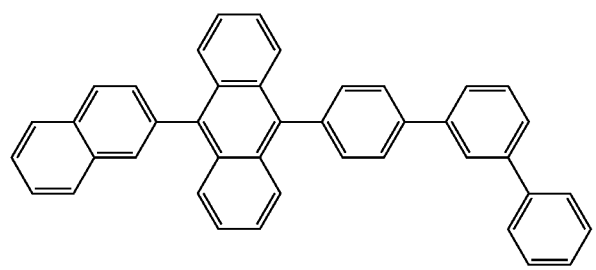
[Chem 30]
EM1-92
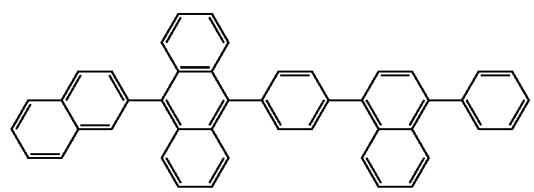
EM1-93
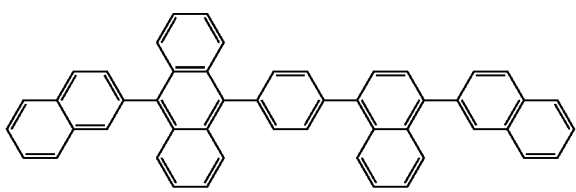
EM1-94
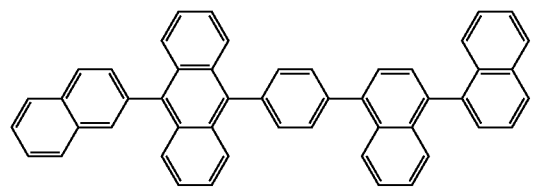
EM1-95
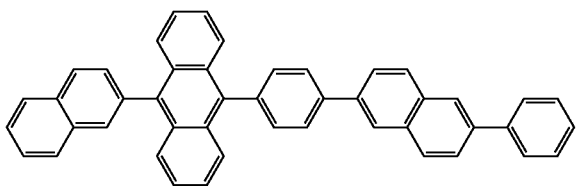
EM1-96
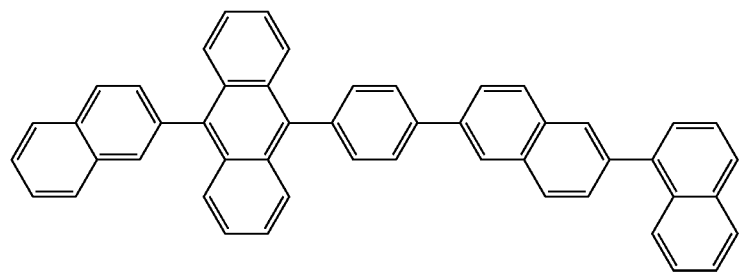

EM1-97
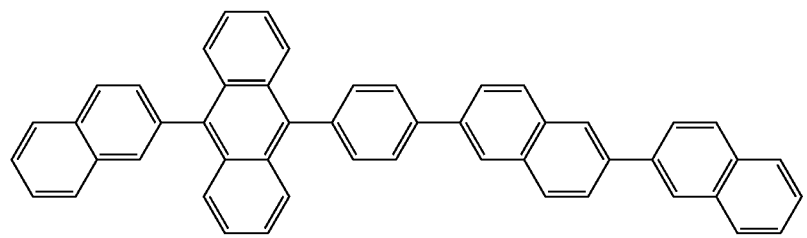
EM1-98
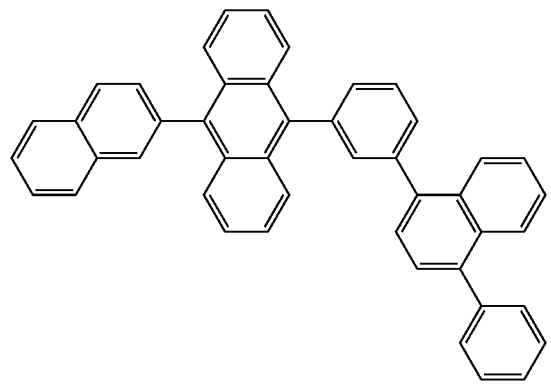
EM1-99
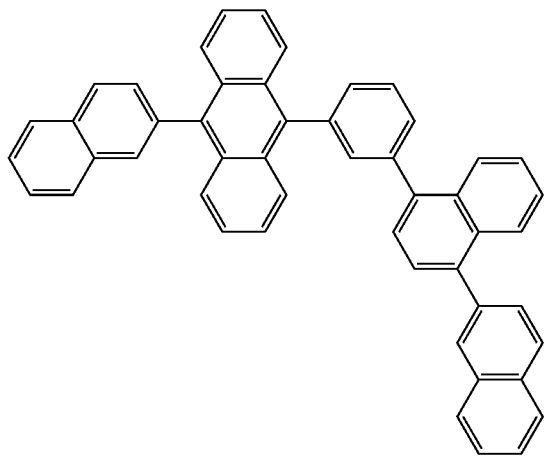
EM1-100
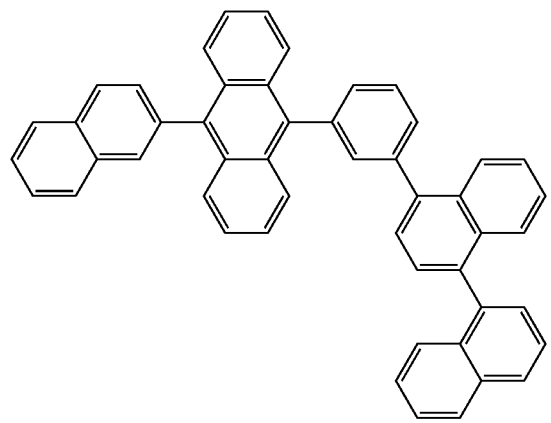
[Chem 31]
EM1-101
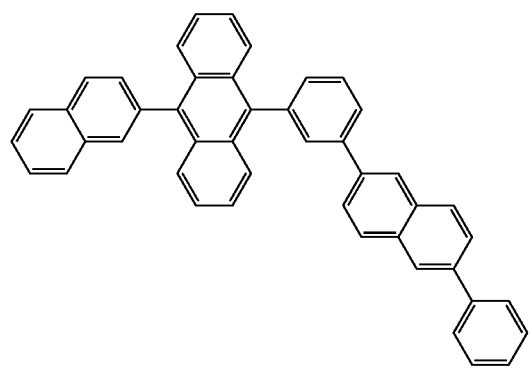
EM1-102
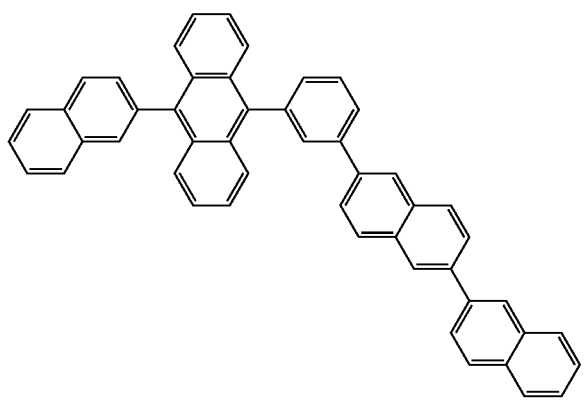

EM1-103
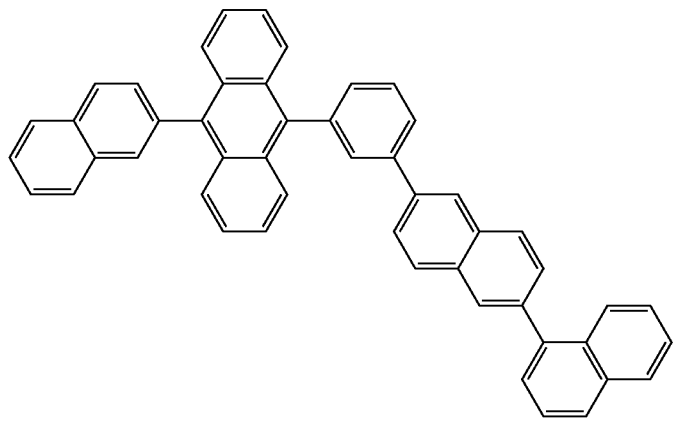
[Chem 32]
EM1-104
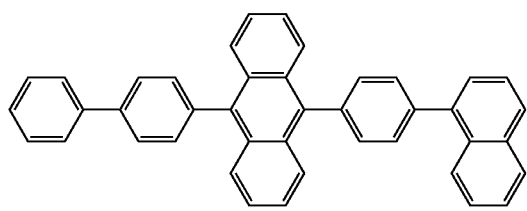
EM1-105
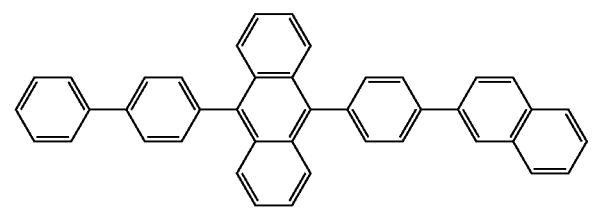
EM1-106
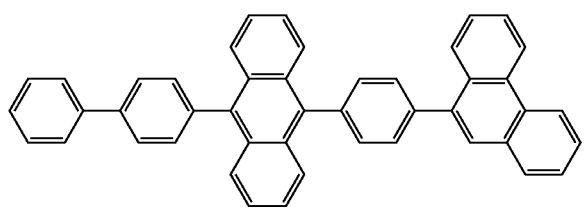
EM1-107
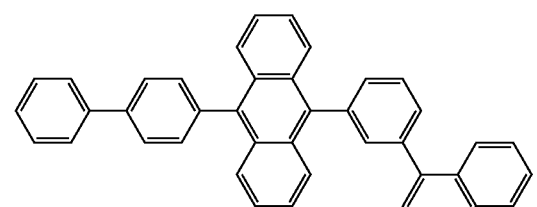
EM1-108
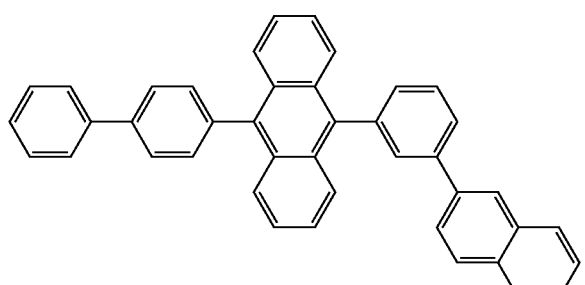
EM1-109
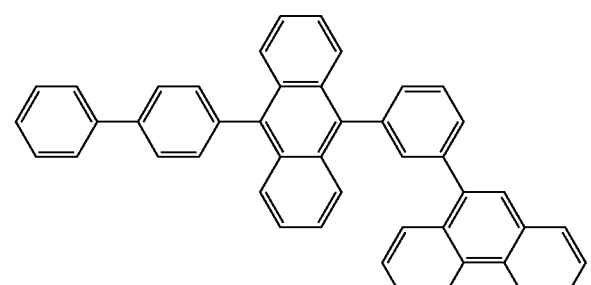
EM1-110
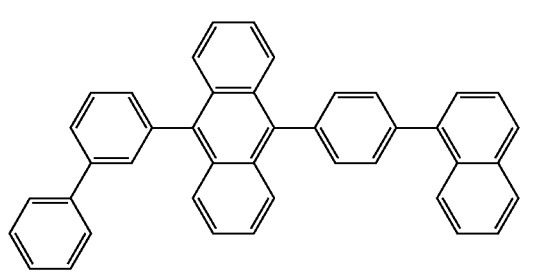
EM1-111
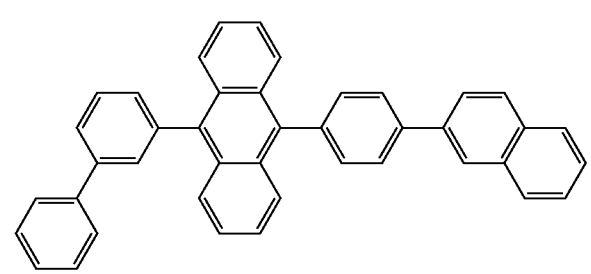

-continued
EM1-112
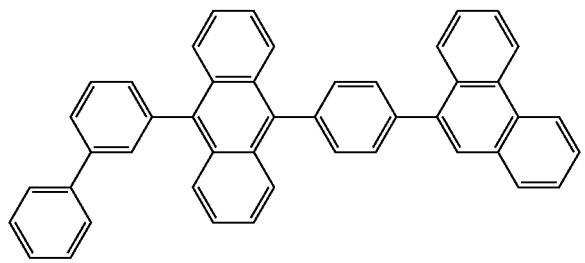
EM1-113
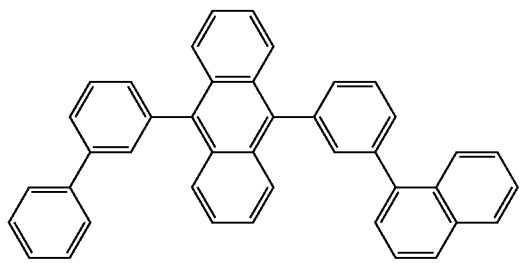
EM1-114
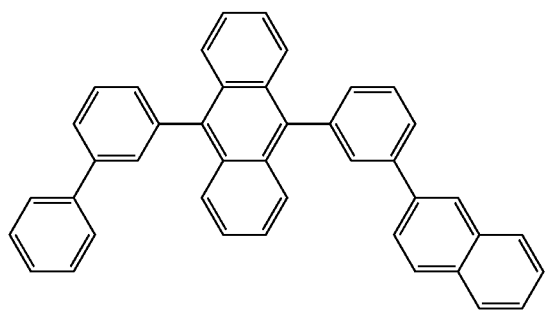
EM1-115
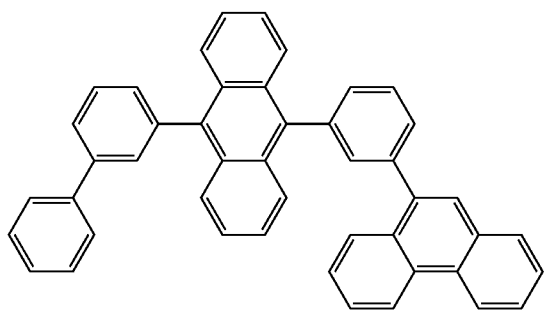
[Chem 33]
EM1-116
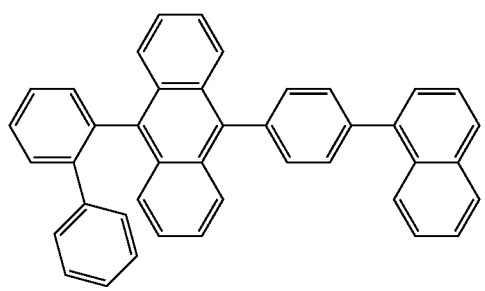
EM1-117
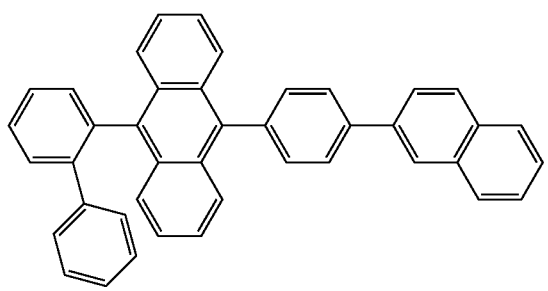
EM1-118
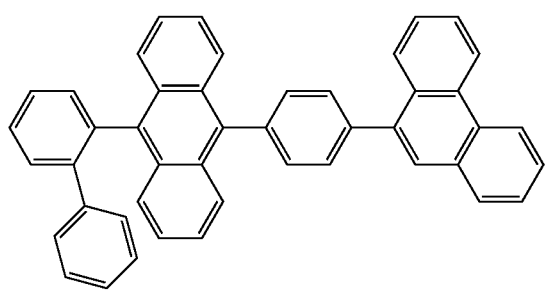
EM1-119
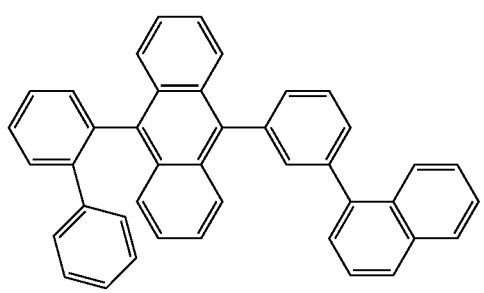
EM1-120
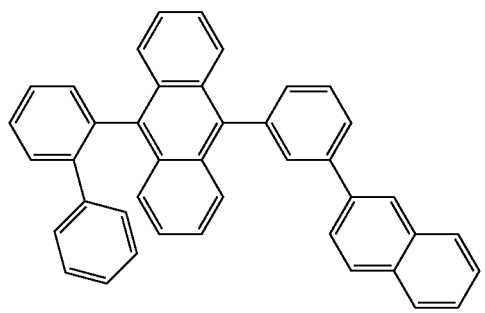
EM1-121
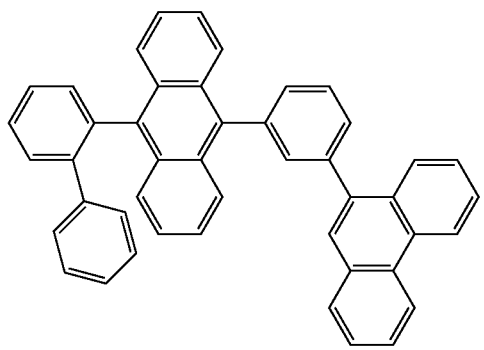

[Chem 34]
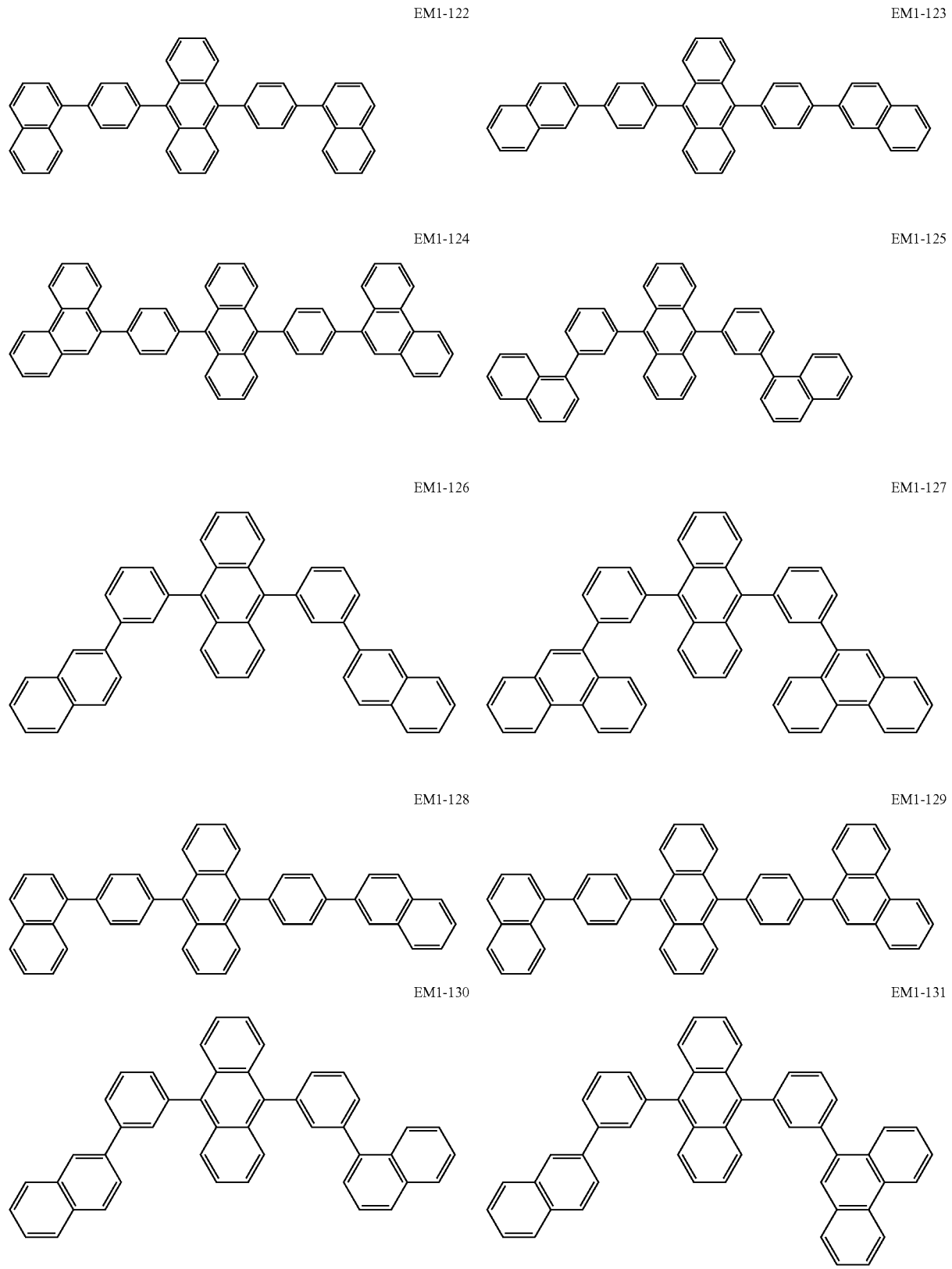

EM1-132
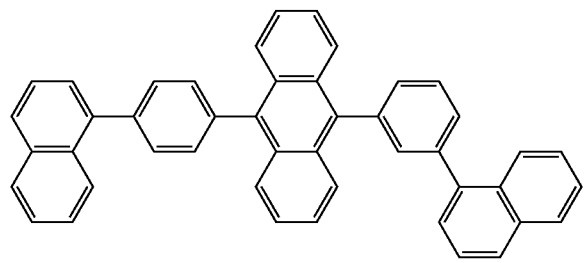
[Chem 35]
EM1-133
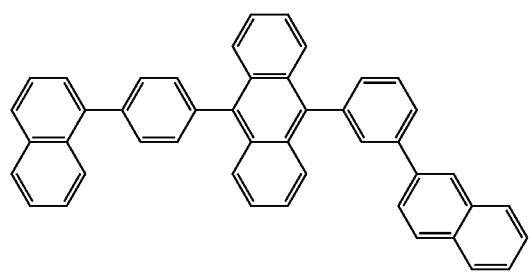
EM1-134
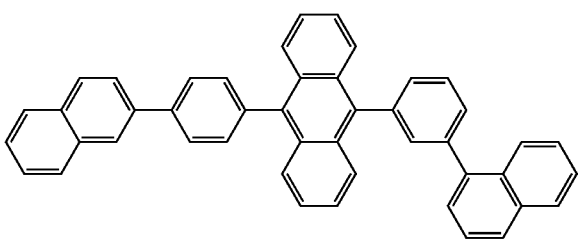
EM1-135
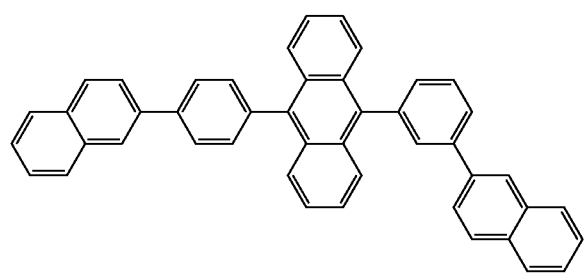
EM1-136
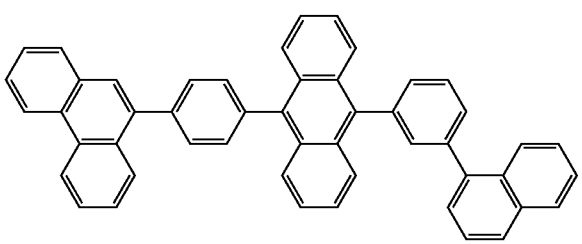
EM1-137
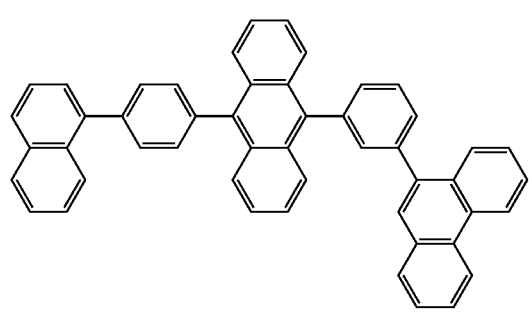
EM1-138
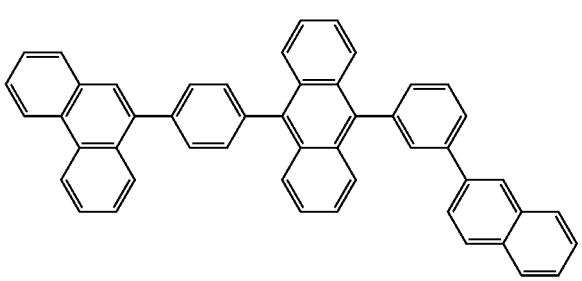
EM1-139
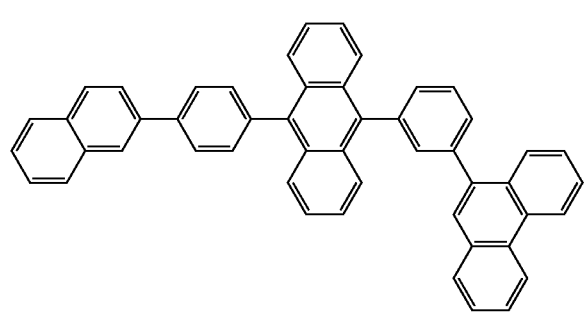
EM1-140
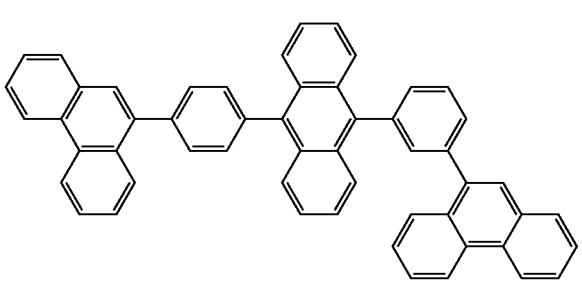
In addition, other specific examples of the anthracene derivative represented by the formula (1-2) include derivatives represented by the following formulae.

[Chem 36]
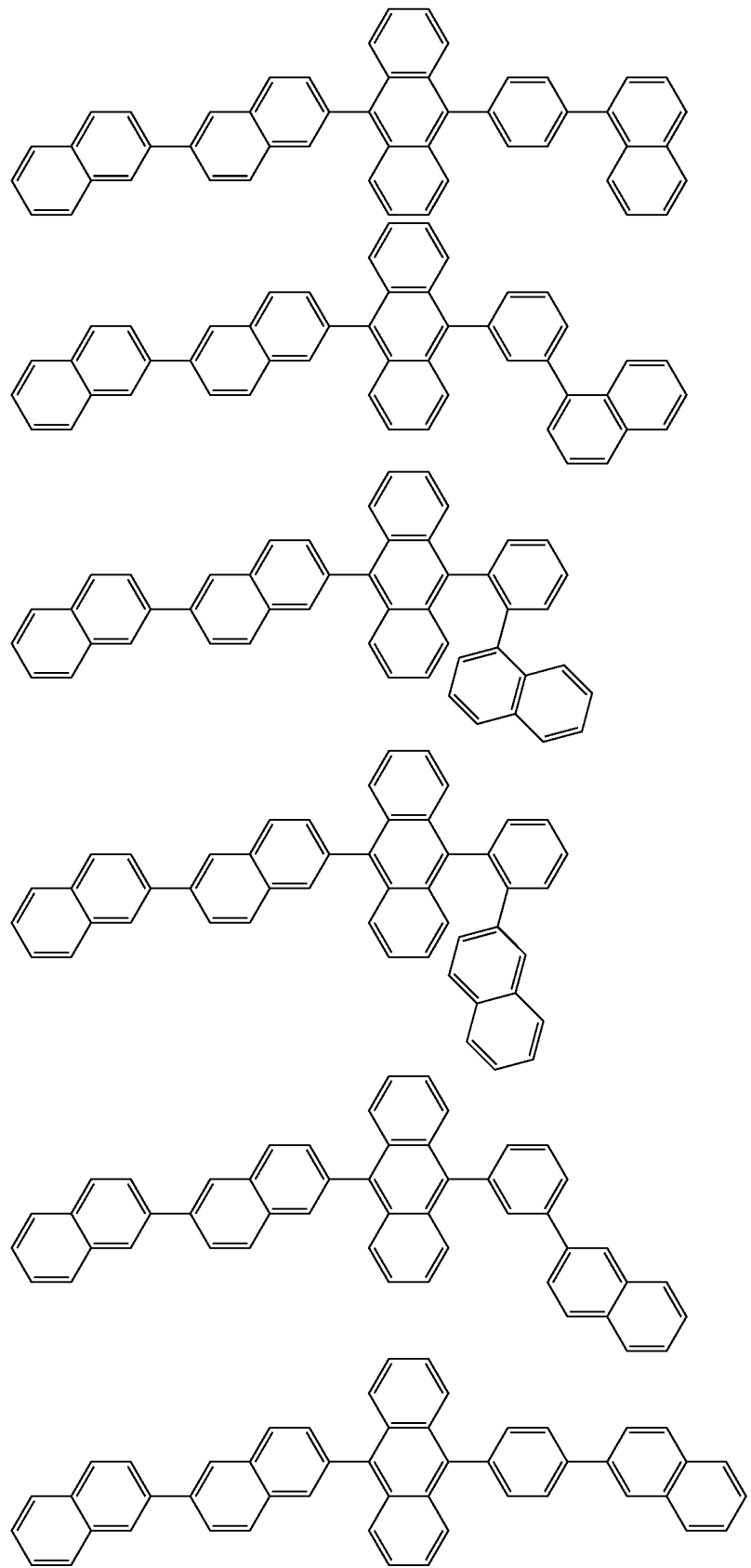

-continued
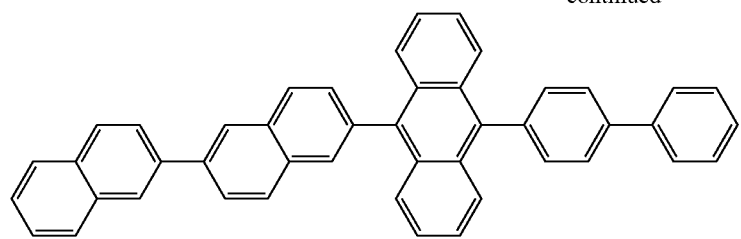
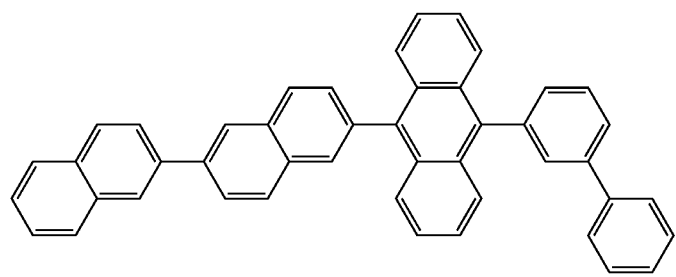
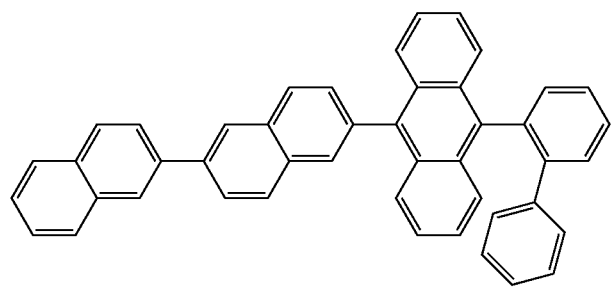
[Chem 37]
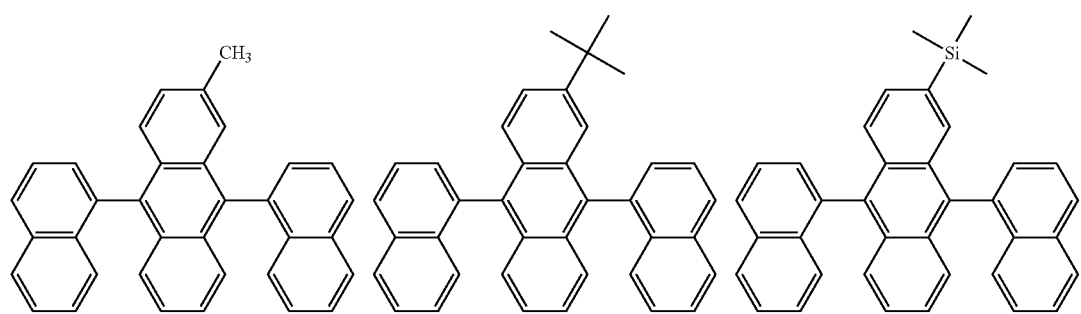
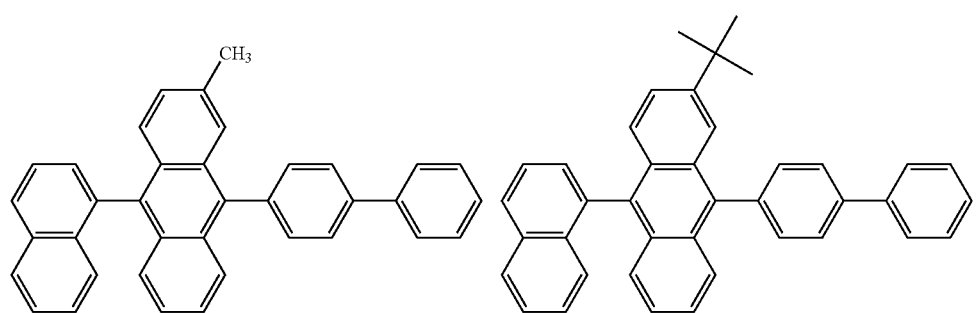

-continued
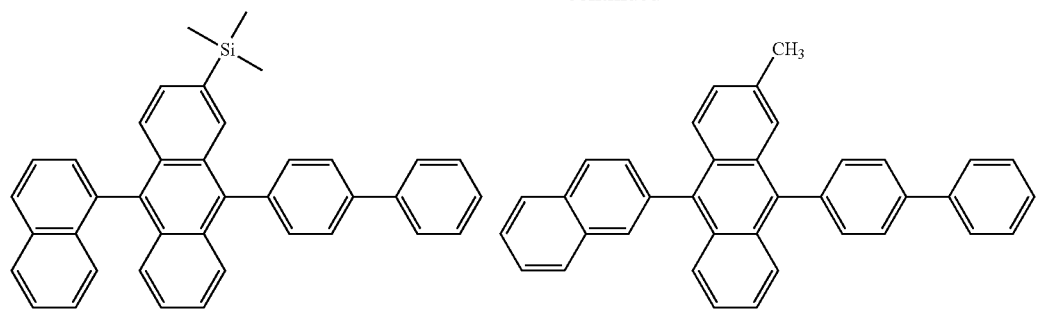
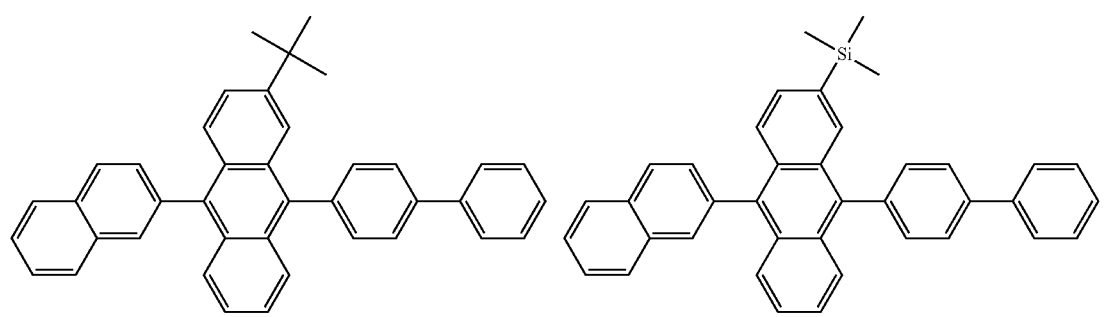
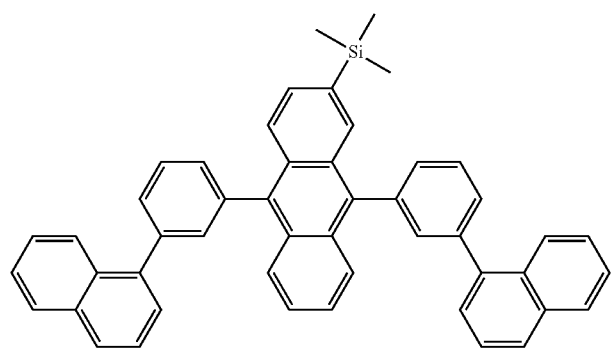
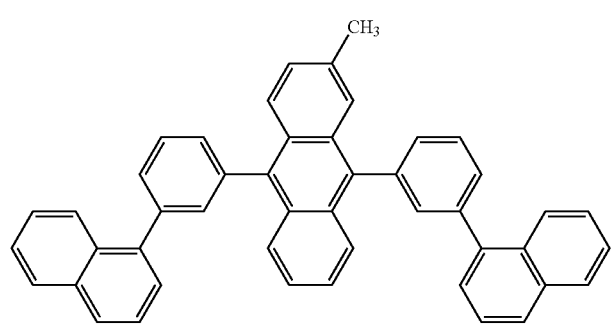
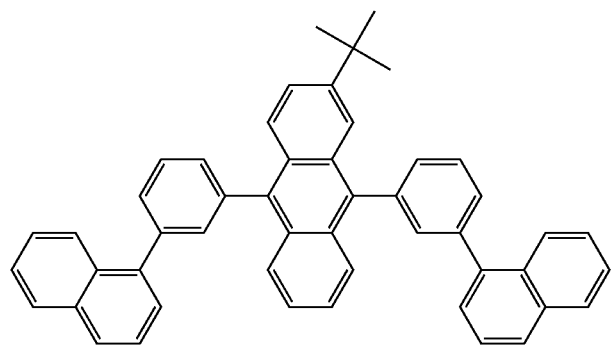

-continued
[Chem 38]
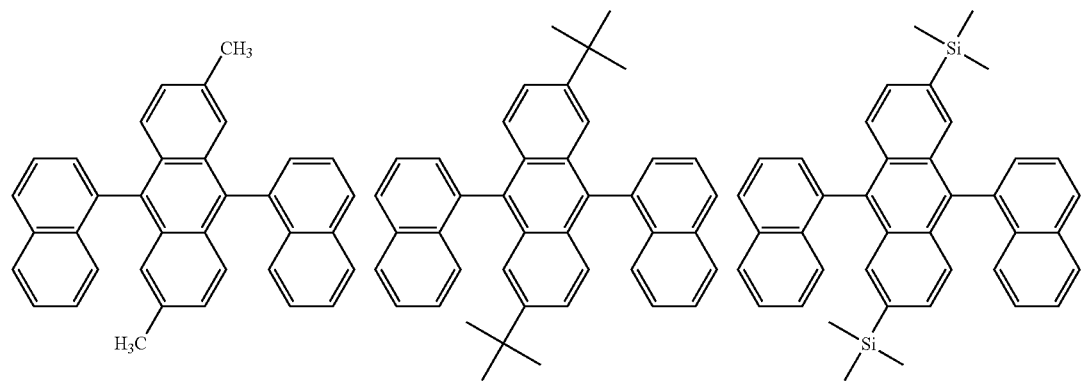
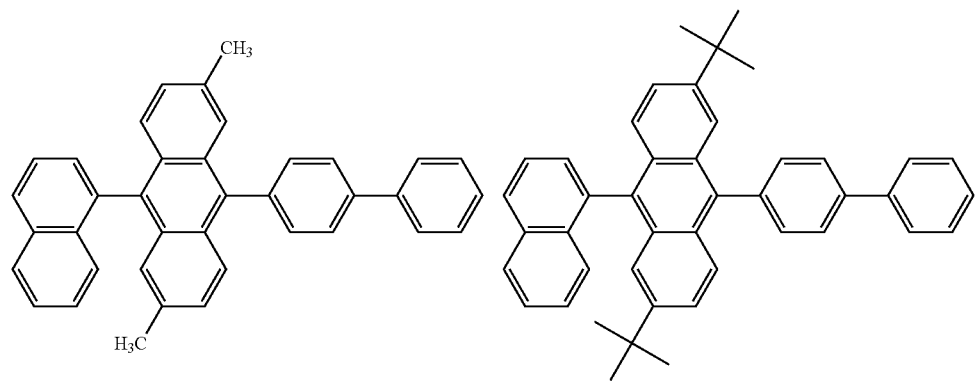
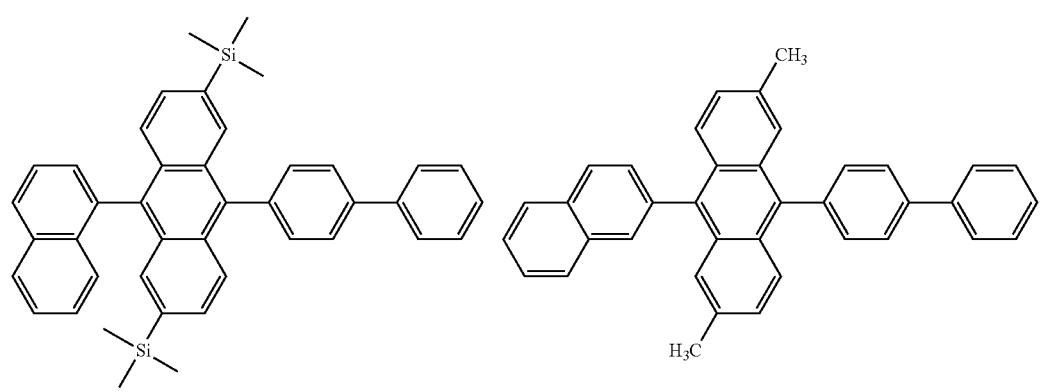
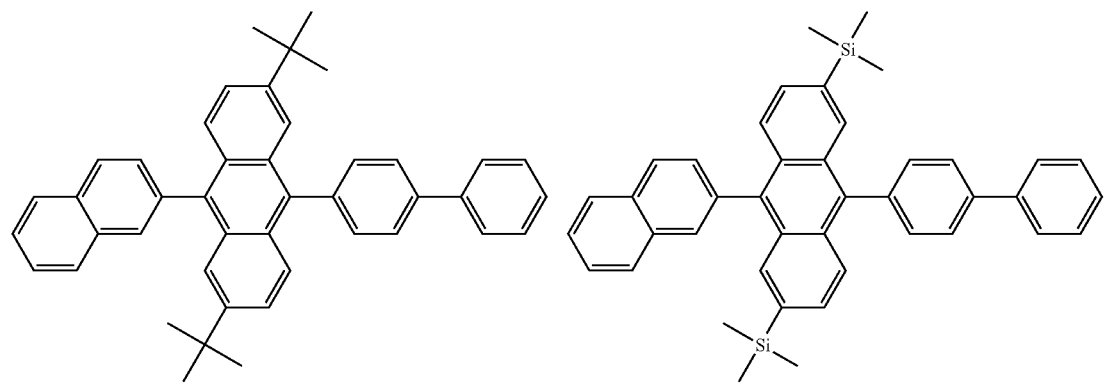

-continued
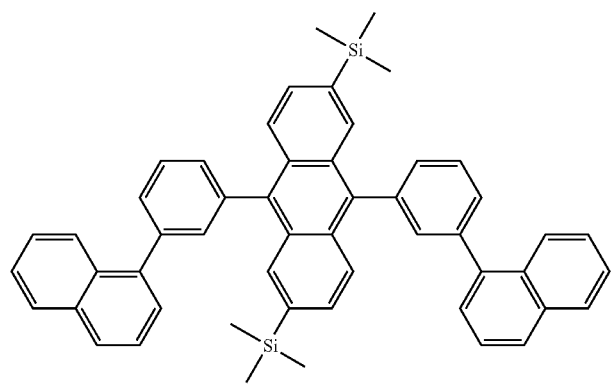
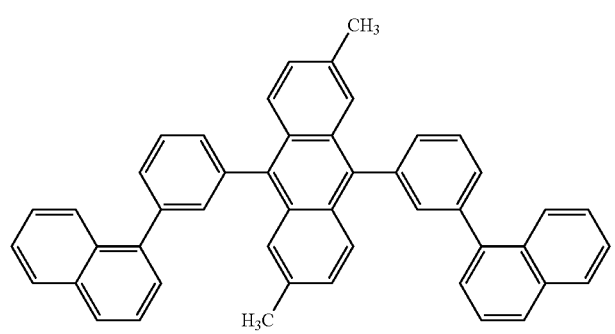
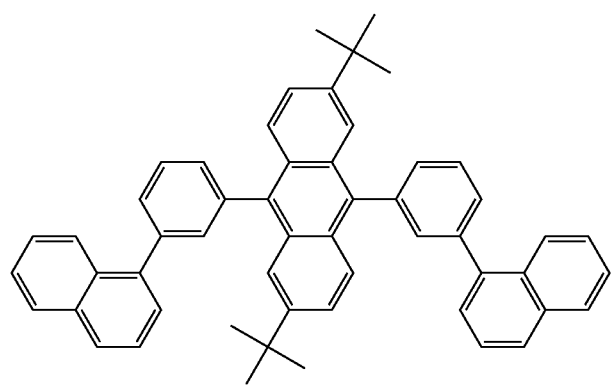
[Chem 39]
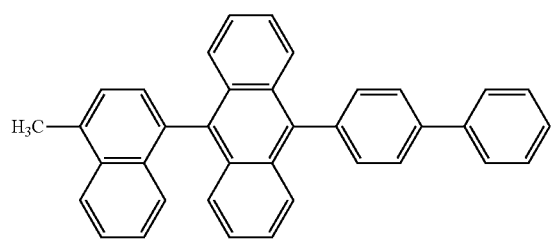 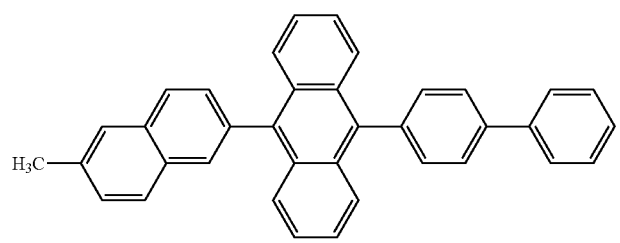
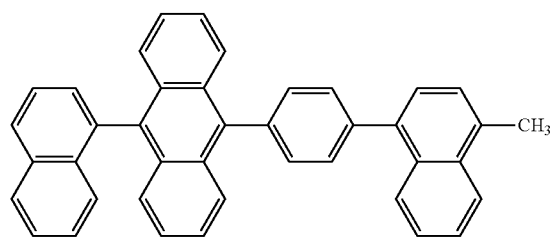 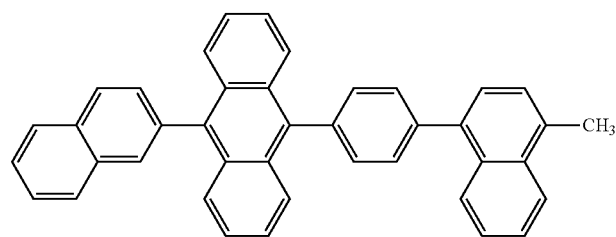

-continued
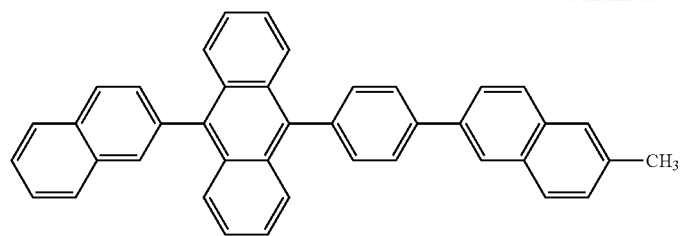
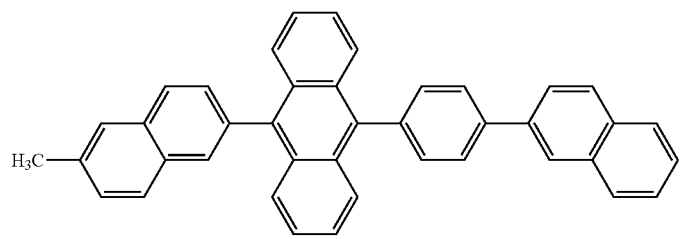
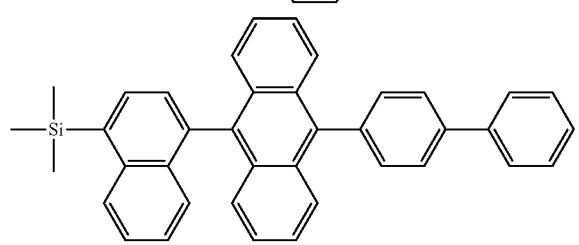
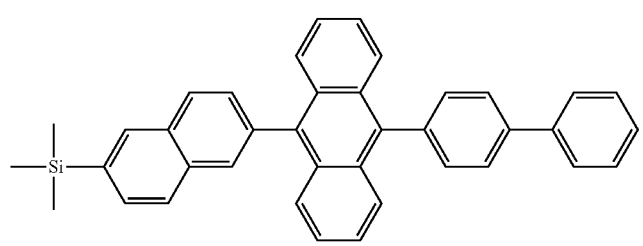
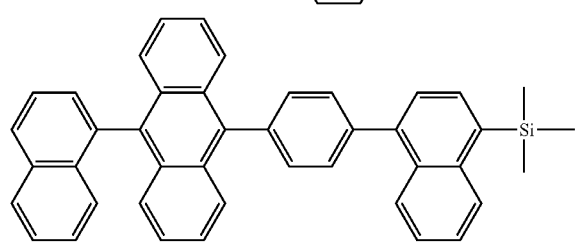
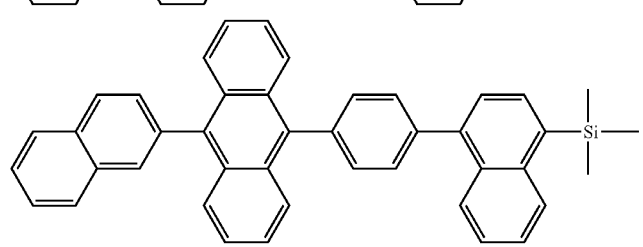
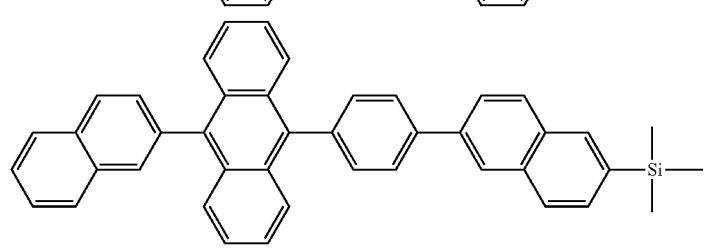

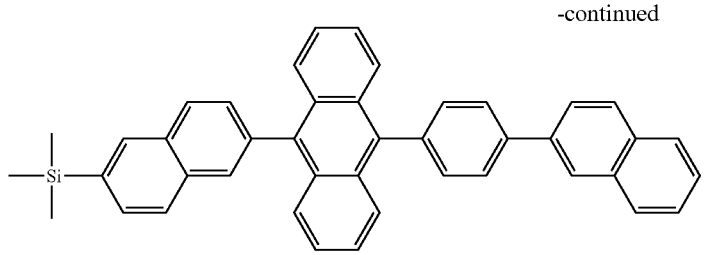

The diaminopyrene derivative represented by the formula (1-1) can be synthesized by, for example, causing a dibromopyrene obtained by brominating commercially available pyrene to react with the corresponding secondary amine compound in the presence of a metal catalyst. In addition, the anthracene derivative represented by the formula (1-2) can be synthesized by, for example, a method described in WO 2004/018587 A1.

The organic luminescent medium of the first invention is in a state where such diaminopyrene derivative represented by the formula (1-1) and anthracene derivative represented by the formula (1-1) and the formula (1-2) as described above coexist. A mass ratio between the diaminopyrene derivative represented by the formula (1-1) and the anthracene derivative represented by the formula (1-2) is preferably 50:50 to 0.1:99.9, or more preferably 20:80 to 1:99.

[Second Invention]
[Organic Luminescent Medium]

An organic luminescent medium of a second invention contains a specific diaminopyrene derivative and a specific anthracene derivative. The organic luminescent medium contributes as a constituting component for an organic thin film layer of an organic EL device to light emission, and is present as, for example, a deposited product in the layer. In addition, when the medium is used in the organic EL device, the medium enables the emission of light having a short wavelength typified by the emission of blue light with high color purity, and can contribute to the lengthening of the lifetime of the device. Hereinafter, the diaminopyrene derivative and the anthracene derivative according to the second invention are described.

(Diaminopyrene Derivative)

The diaminopyrene derivative according the second invention is represented by the following formula (2-1).

[Chem 40]

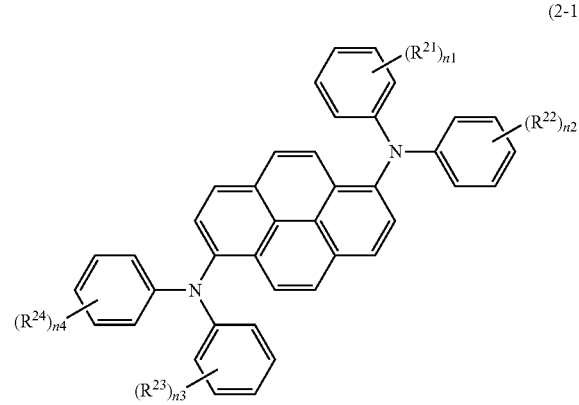

(2-1)

(In the formula (2-1), $R^{21}$ to $R^{24}$ each independently represent a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, or a substituted or unsubstituted aralkyl group having 7 to 50 carbon atoms, and when adjacent alkyl groups are present on the same benzene ring, the adjacent alkyl groups may be bonded to each other to form a substituted or unsubstituted, divalent bonding group, provided that a case where the adjacent alkyl groups form a α-naphthyl group together with the benzene ring to which the groups are bonded is excluded; and n1 to n4 each independently represent an integer of 0 to 5, and at least one of n1 to n4 represents an integer of 1 to 5.)

It should be noted that, in the second invention, the term "ring carbon atoms" means carbon atoms of which a saturated ring, unsaturated ring, or aromatic ring is constituted, and the term "ring atoms" means carbon atoms and heteroatoms of which heterocycles (including a saturated ring, an unsaturated ring, and an aromatic ring) are constituted.)

In addition, in the definition of each formula of the second invention, examples of a substituent in "substituted or unsubstituted . . . " include an alkyl group, an aryl group, a cycloalkyl group, an alkoxy group, a heterocyclic group, an aralkyl group, an aryloxy group, an arylthio group, an alkoxycarbonyl group, a halogen atom, a hydroxyl group, a nitro group, a cyano group, and a carboxyl group as described below.

Examples of the aryl group represented by any one of $R^{21}$ to $R^{24}$ include a phenyl group, a 2-methylphenyl group, a 3-methylphenyl group, a 4-methylphenyl group, a 4-ethylphenyl group, a biphenyl group, a 4-methylbiphenyl group, a 4-ethylbiphenyl group, a 4-cyclohexylbiphenyl group, a terphenyl group, a 3,5-dichlorophenyl group, a 1-naphthyl group, a 2-naphthyl group, a 5-methylnaphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 6-chrysenyl group, a 1-benzo[c]phenanthryl group, a 2-benzo[c]phenanthryl group, a 3-benzo[c]phenanthryl group, a 4-benzo[c]phenanthryl group, a 5-benzo[c]phenanthryl group, a 6-benzo[c]phenanthryl group, a 1-benzo[g]chrysenyl group, a 2-benzo[g]chrysenyl group, a 3-benzo[g]chrysenyl group, a 4-benzo[g]chrysenyl group, a 5-benzo[g]chrysenyl group, a 6-benzo[g]chrysenyl group, a 7-benzo[g]chrysenyl group, an 8-benzo[g]chrysenyl group, a 9-benzo[g]chrysenyl group, a 10-benzo[g]chrysenyl group, an 11-benzo[g]chrysenyl group, a 12-benzo[g]chrysenyl group, a 13-benzo[g]chrysenyl group, a 14-benzo[g]chrysenyl group, a 1-triphenyl group, a 2-triphenyl group, a 2-fluorenyl group, a 9,9-dimethylfluoren-2-yl group, a benzofluorenyl group, a dibenzofluorenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl) phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a fluoranthenyl group, and a perylenyl group. Of those, a substituted or unsubstituted aryl group having 10 to 14 ring carbon atoms is preferred, and a 1-naphthyl group, a 2-naphthyl group, and a 9-phenanthryl group are particularly preferred.

Examples of the alkyl group represented by any one of $R^{21}$ to $R^{24}$ include a methyl group, an ethyl group, a propyl group, an isopropyl group, a butyl group, a sec-butyl group, a tert-butyl group, a pentyl group, a hexyl group, a heptyl group, an octyl group, a stearyl group, a 2-phenylisopropyl group, a trichloromethyl group, and a trifluoromethyl group.

When one pair of adjacent alkyl groups is, or two pairs of adjacent alkyl groups are, present on the same benzene ring (benzene ring directly bonded to a nitrogen atom), the respective adjacent alkyl groups may be bonded to each other to form a substituted or unsubstituted, divalent, saturated or unsaturated bonding group. For example, the adjacent alkyl groups may form any one of the following structures (substituents are omitted) together with the benzene ring to which the groups are bonded, provided that the case where an α-naphthyl group is formed is excluded.
[Chem 41]

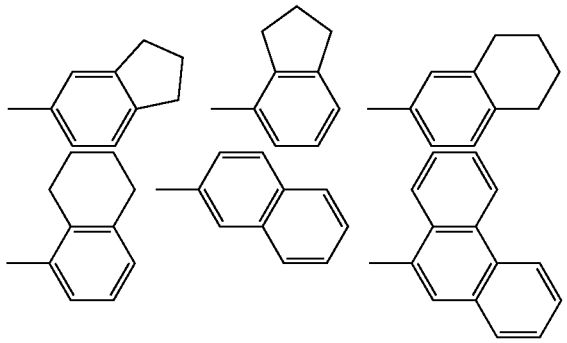

Examples of the cycloalkyl group represented by any one of $R^{21}$ to $R^{24}$ include a cyclopropyl group, a cyclobutyl group, a cyclopentyl group, a cyclohexyl group, a cycloheptyl group, a cyclooctyl group, a cyclononyl group, a bicycloheptyl group, a bicyclooctyl group, a tricycloheptyl group, and an adamantyl group. Of those, a cyclopentyl group, a cyclohexyl group, a cycloheptyl group, a bicycloheptyl group, a bicyclooctyl group, and an adamantyl group are preferred.

Examples of the aralkyl group represented by any one of $R^{21}$ to $R^{24}$ include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, an m-methylbenzyl group, an o-methylbenzyl group, a p-chlorobenzyl group, an m-chlorobenzyl group, an o-chlorobenzyl group, a p-bromobenzyl group, an m-bromobenzyl group, an o-bromobenzyl group, a p-iodobenzyl group, an m-iodobenzyl group, an o-iodobenzyl group, a p-hydroxybenzyl group, an m-hydroxybenzyl group, an o-hydroxybenzyl group, a p-aminobenzyl group, an m-aminobenzyl group, an o-aminobenzyl group, a p-nitrobenzyl group, an m-nitrobenzyl group, an o-nitrobenzyl group, a p-cyanobenzyl group, an m-cyanobenzyl group, an o-cyanobenzyl group, a 1-hydroxy-2-phenylisopropyl group, a 1-chloro-2-phenylisopropyl group, an α-phenoxybenzyl group, an α,α-dimethylbenzyl group, an α,α-methylphenylbenzyl group, an α,α-ditrifluoromethylbenzyl group, a triphenylmethyl group, and an α-benzyloxybenzyl group.

In a preferred embodiment of the second invention, the diaminopyrene derivative represented by the formula (2-1) is represented by any one of the following formulae.

[Chem 42]

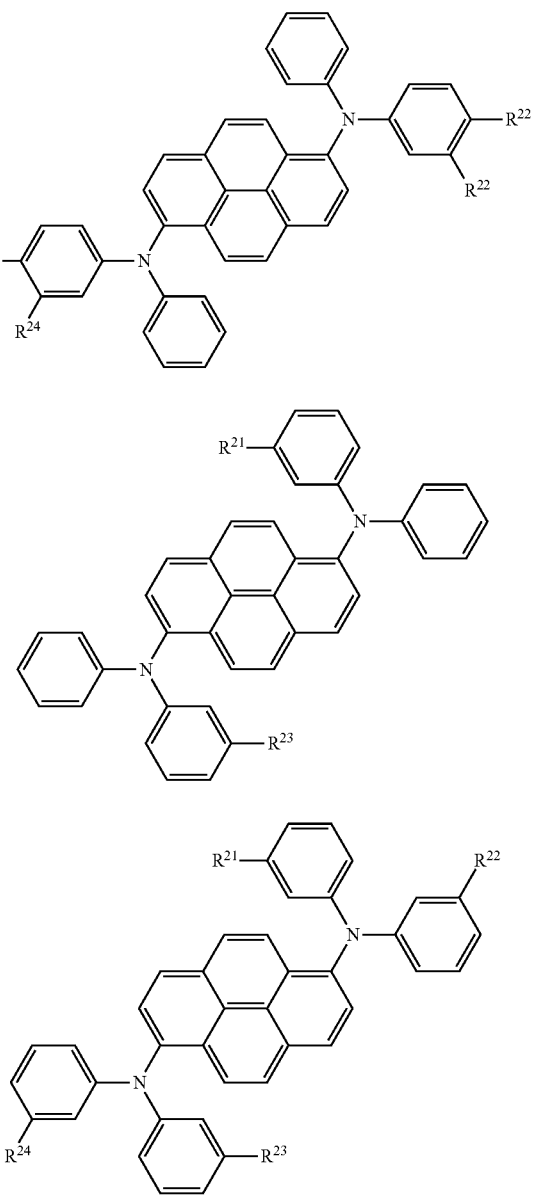

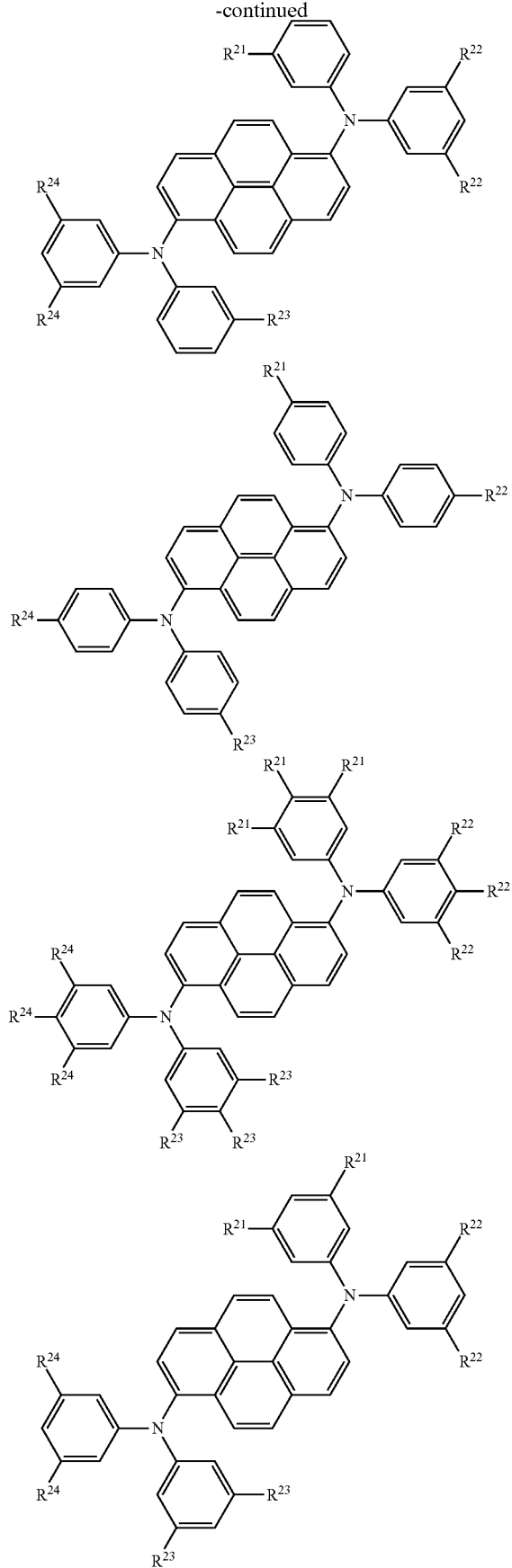

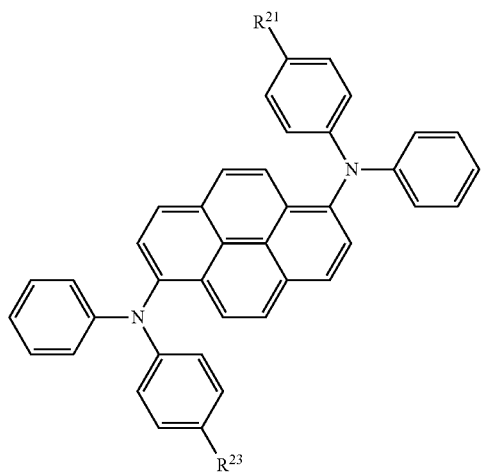
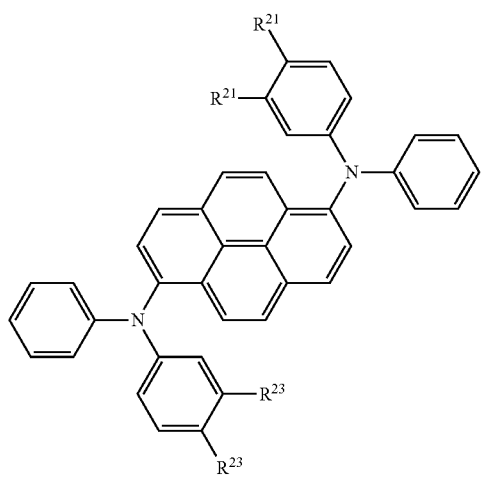
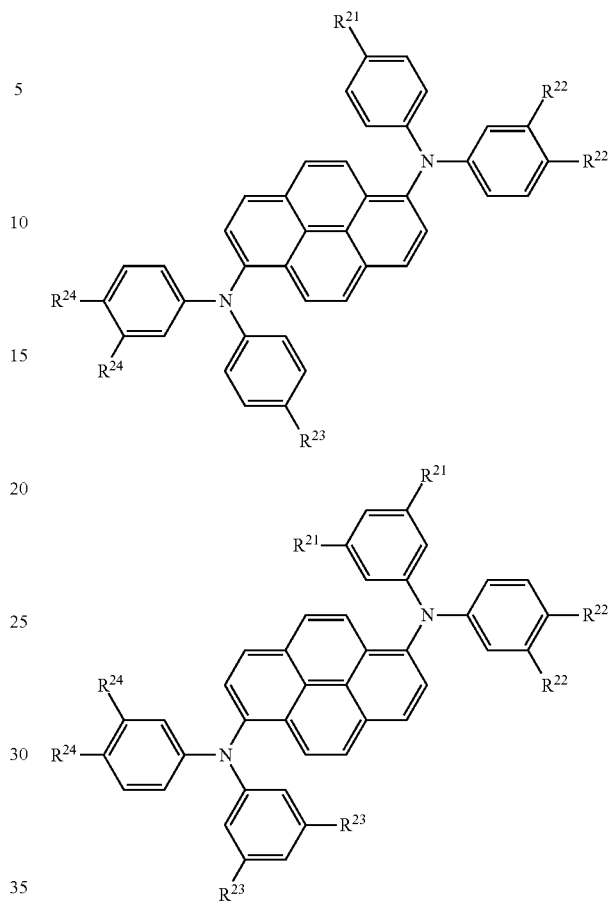

In the above formulae, $R^{21}$ to $R^{24}$ each have the same meaning as that described above. Although $R^{21}$ to $R^{24}$ may be identical to or different from one another, it is preferred that: $R^{21}$ and $R^{23}$ be identical to each other; and $R^{22}$ and $R^{24}$ be identical to each other.

Specific examples of the diaminopyrene derivative represented by the formula (2-1) include compounds represented by the following formulae.

[Chem 43]

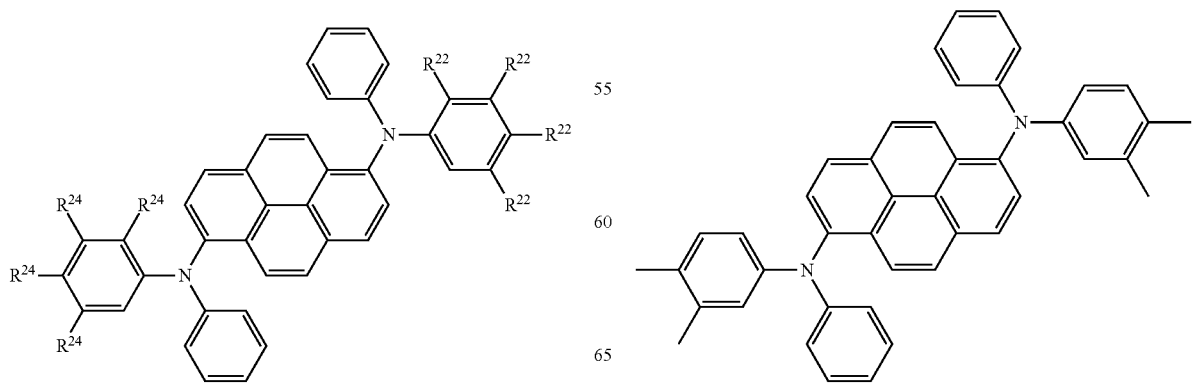

DM-2-1-1

DM-2-1-2
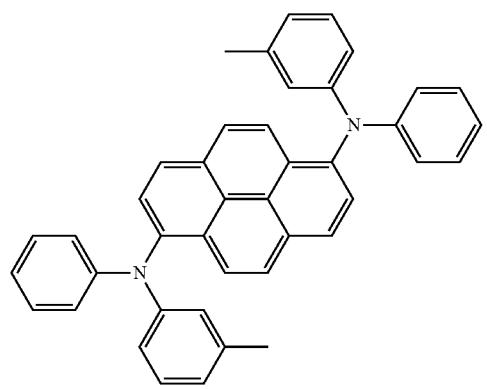
DM-2-1-3
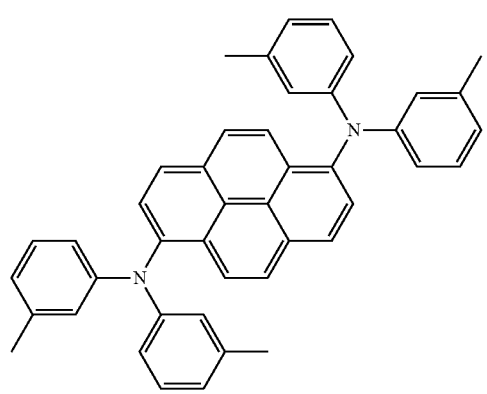
DM-2-1-4
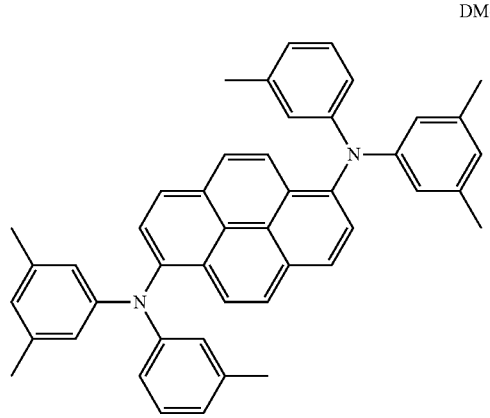
DM-2-1-5
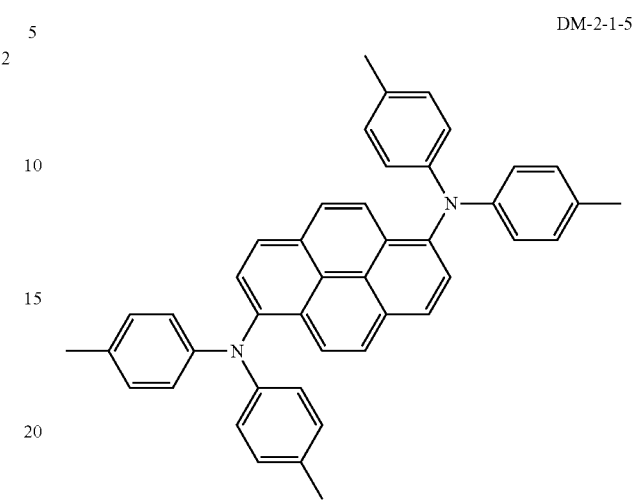
DM-2-1-6
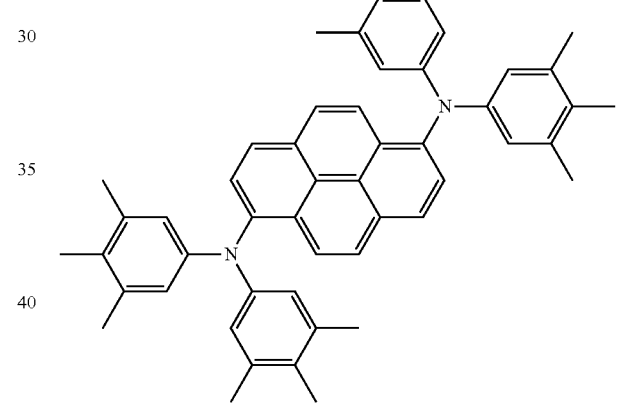
DM-2-1-7
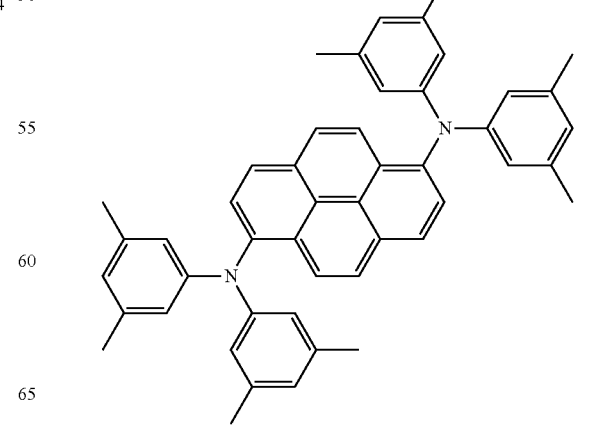

DM-2-1-8
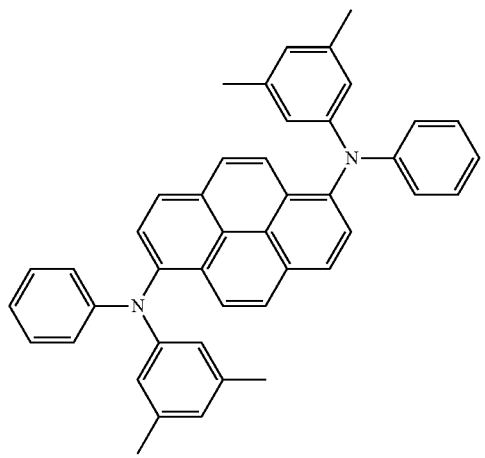
DM-2-1-9
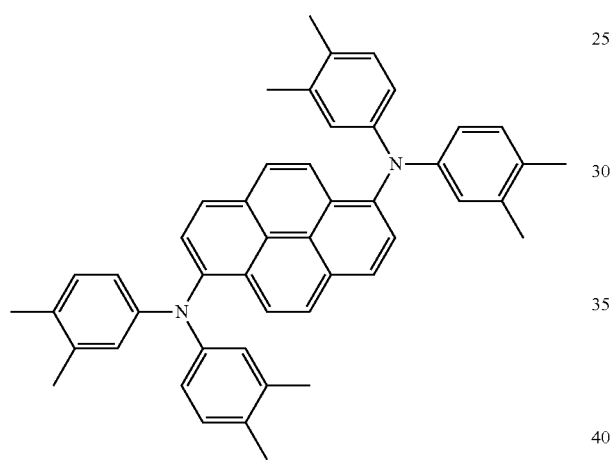
[Chem 44]
DM-2-2-1
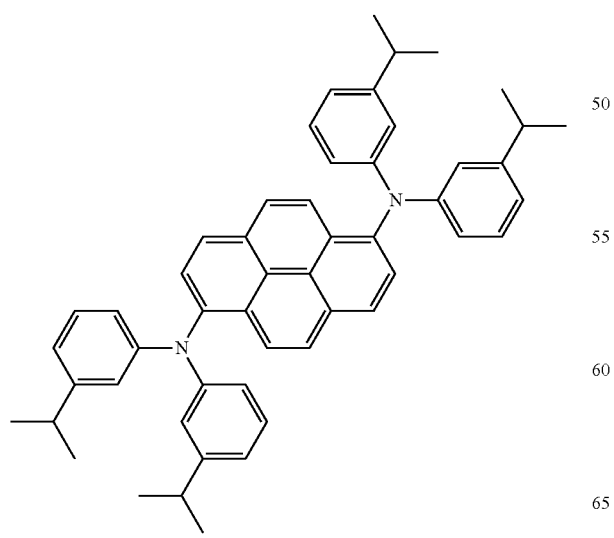
DM-2-2-2
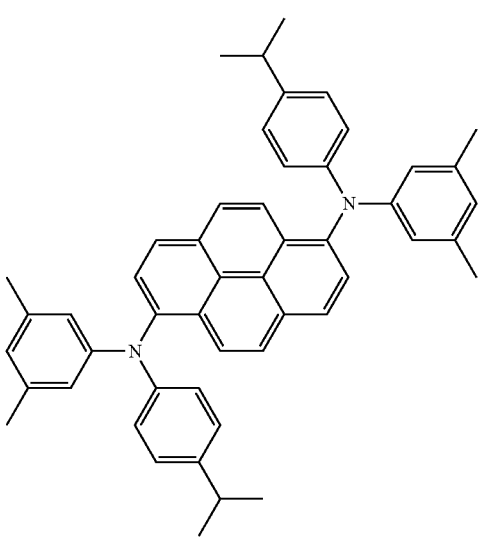
DM-2-2-3
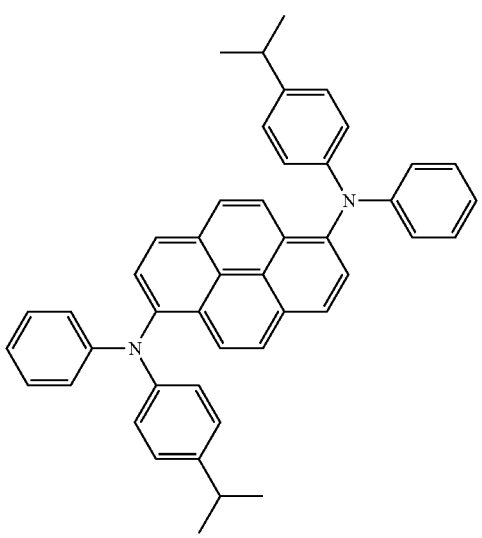
DM-2-2-4
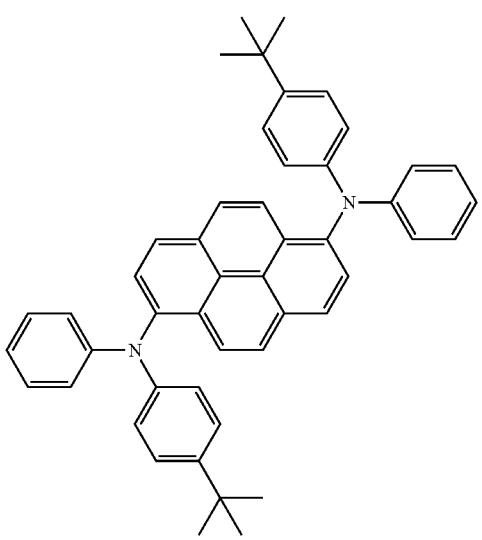

DM-2-2-5
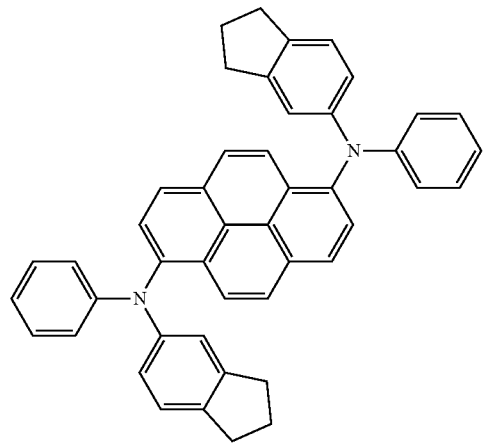
DM-2-2-8
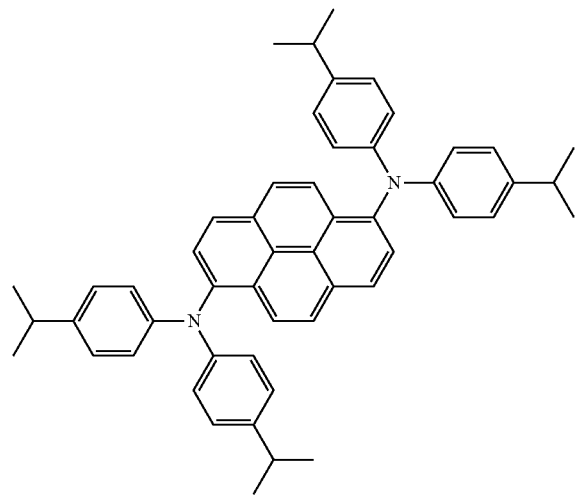
DM-2-2-6
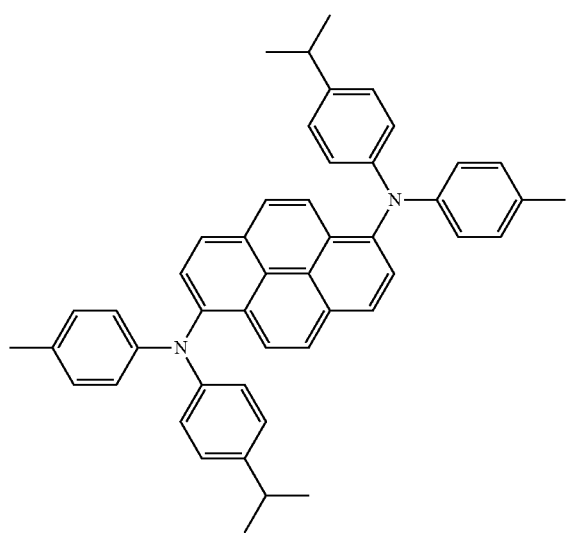
DM-2-2-9
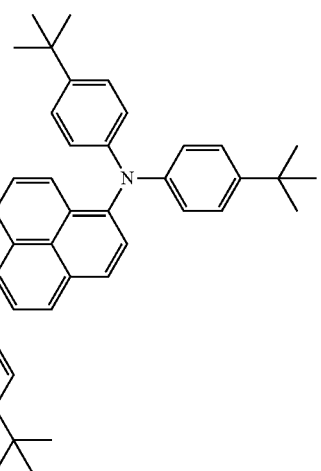
[Chem 45]
DM-2-2-7
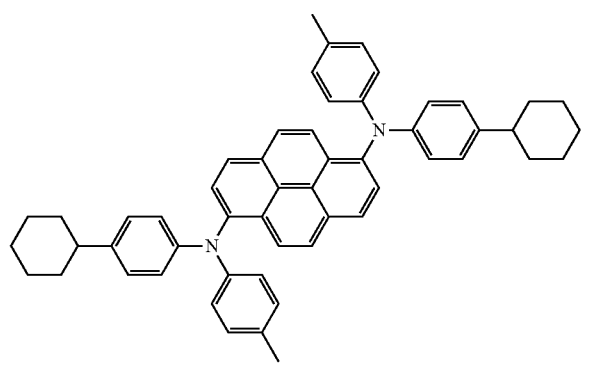
DM-2-4-1
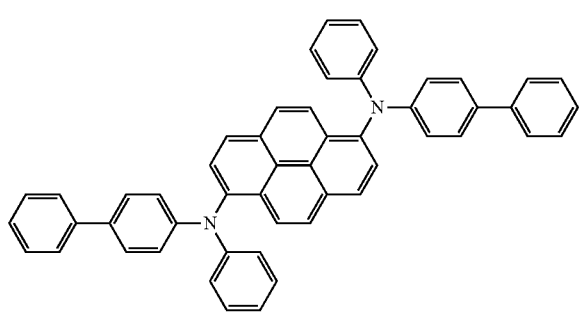

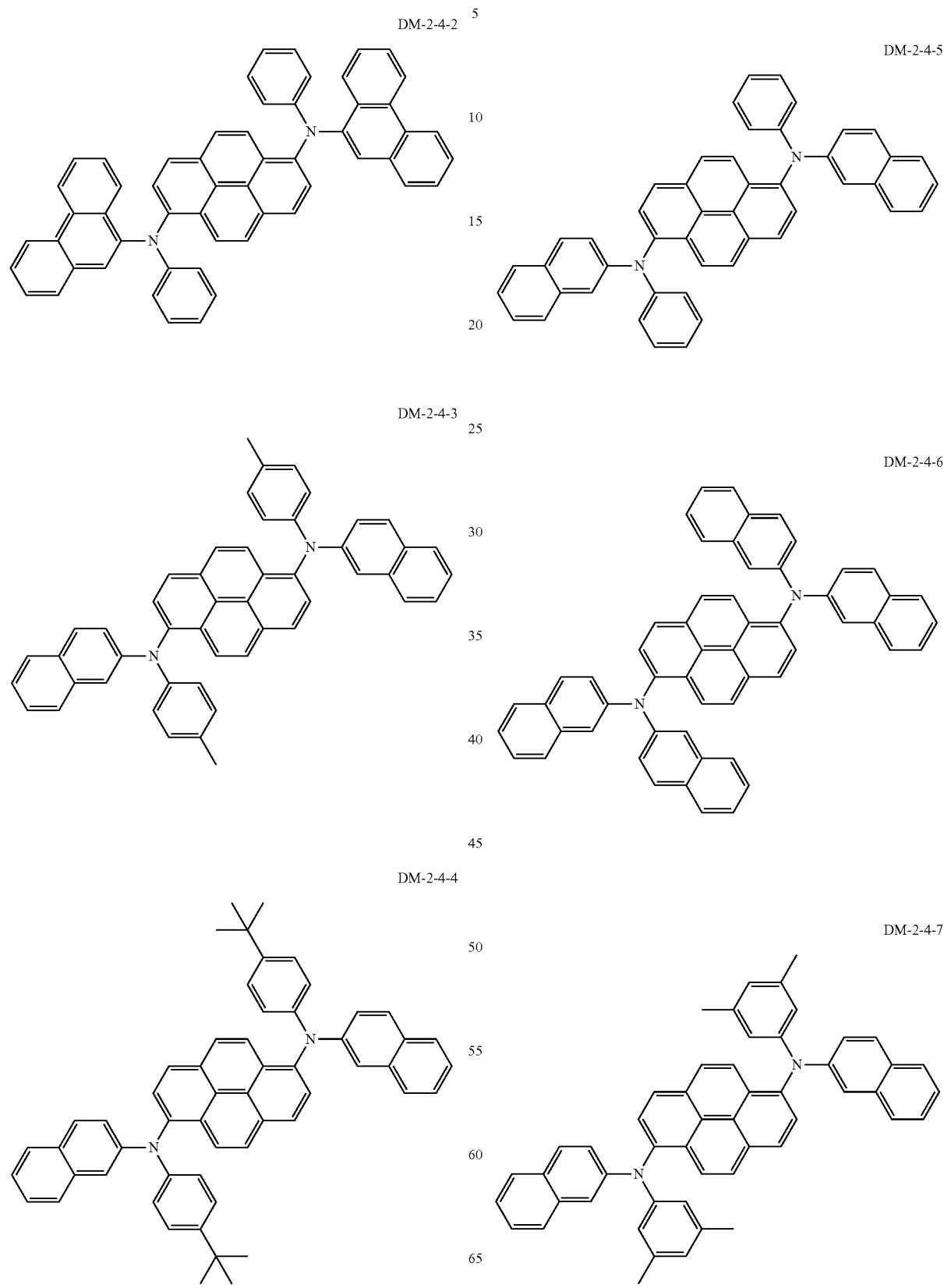

DM-2-4-8

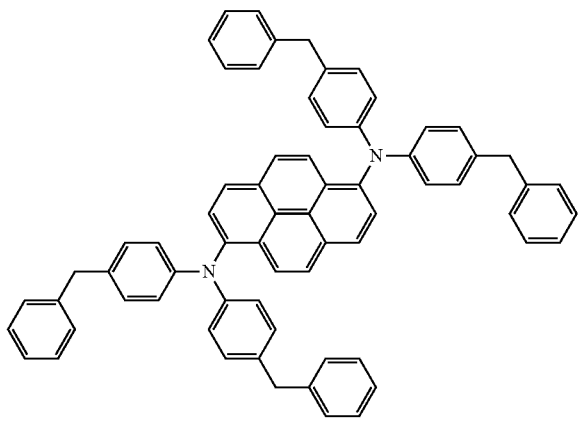

DM-2-4-9

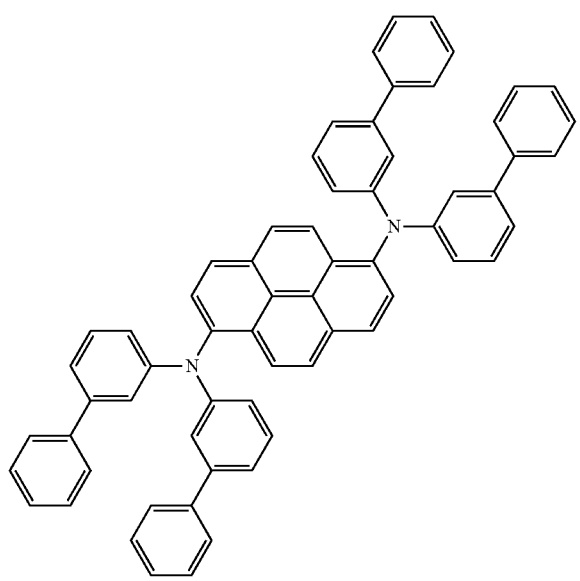

(Anthracene Derivative)

The anthracene derivative according to the present invention is represented by the following formula (2-2).

[Chem 46]

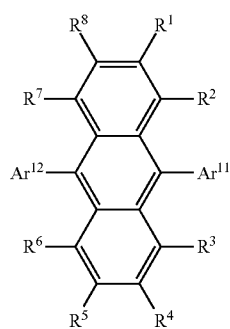

(2-2)

(In the formula (2-2), $Ar^{11}$ and $Ar^{12}$ each independently represent a substituted or unsubstituted aryl group having 6 to 20 ring carbon atoms, and $R^1$ to $R^8$ each independently represent a group selected from a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group, provided that, when one of $Ar^{11}$ and $Ar^{12}$ represents a substituted or unsubstituted β-naphthyl group, the other represents a group excluding a substituted or unsubstituted arylphenylene group and a substituted or unsubstituted fluorenylphenylene group.)

The anthracene derivative according to the second invention is preferably any one of the following anthracene derivatives (2-A), (2-B), and (2-C), and is selected depending on the constitution of an organic EL device to which the derivative is applied and characteristics requested of the device.

(Anthracene Derivative (2-A))

The anthracene derivative is such that $Ar^{11}$ and $Ar^{12}$ in the formula (2-2) each independently represent a substituted or unsubstituted, fused aryl group having 10 to 20 ring carbon atoms. The anthracene derivative can be classified into the case where $Ar^{11}$ and $Ar^{12}$ represent the same substituted or unsubstituted, fused aryl group, and the case where $Ar^{11}$ and $Ar^{12}$ represent different substituted or unsubstituted, fused aryl groups. Specific examples of the derivative include anthracene derivatives represented by the following formulae (2-2-1) to (2-2-3), and an anthracene derivative in which $Ar^{11}$ and $Ar^{12}$ in the formula (2-2) represent different substituted or unsubstituted, fused aryl groups.

The anthracene derivative represented by the following formula (2-2-1) is such that $Ar^{11}$ and $Ar^{12}$ each represent a substituted or unsubstituted 9-phenanthrenyl group.

[Chem 47]

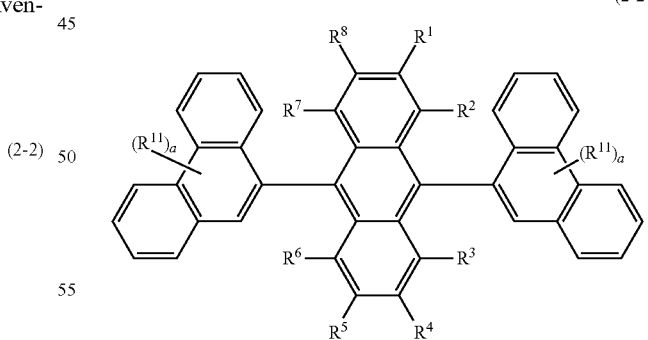

(2-2-1)

(In the formula (2-2-1): $R^1$ to $R^8$ each have the same meaning as that described above; $R^{11}$ represents a group selected from a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group; a represents an integer of 0 to 9; when a represents an integer of 2 or more, a plurality of $R^{11}$'s may be identical to or different from each other on condition that the two substituted or unsubstituted phenanthrenyl groups are identical to each other; and the position at which $R^{11}$ is bonded to each phenanthrenyl group is not limited.)

The anthracene derivative represented by the following formula (2-2-2) is such that $Ar^{11}$ and $Ar^{12}$ in the formula (2-2) each represent a substituted or unsubstituted β-naphthyl group.

[Chem 48]

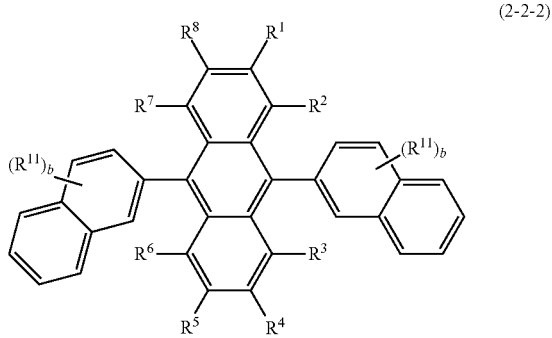

(2-2-2)

(In the formula (2-2-2): $R^1$ to $R^8$ and $R^{11}$ each have the same meaning as that described above; b represents an integer of 1 to 7; when b represents an integer of 2 or more, a plurality of $R^{11}$'s may be identical to or different from each other on condition that the two substituted or unsubstituted β-naphthyl groups are identical to each other; and the position at which $R^{11}$ is bonded to each β-naphthyl group is not limited.)

The anthracene derivative represented by the following formula (2-2-3) is such that $Ar^{11}$ and $Ar^{12}$ in the formula (2-2) each represent a substituted or unsubstituted α-naphthyl group.

[Chem 49]

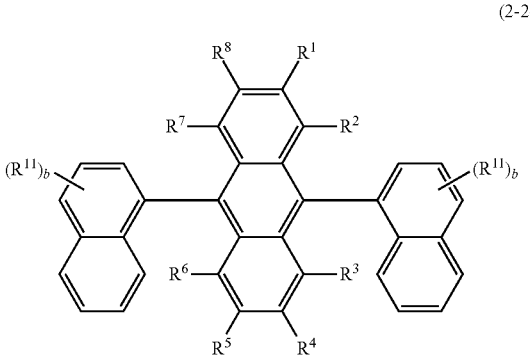

(2-2-3)

(In the formula (2-2-3): $R^1$ to $R^8$ and $R^{11}$, and b each have the same meaning as that described above; when b represents an integer of 2 or more, a plurality of $R^{11}$'s may be identical to or different from each other on condition that the two substituted or unsubstituted a-naphthyl groups are identical to each other; and the position at which $R^{11}$ is bonded to each α-naphthyl group is not limited.)

The anthracene derivative in which $Ar^{11}$ and $Ar^{12}$ in the formula (2-2) represent different substituted or unsubstituted, fused aryl groups is preferably such that $Ar^{11}$ and $Ar^{12}$ each represent any one of the formulae (2-2-1) to (2-2-3), the substituted or unsubstituted 9-phenanthrenyl group, the substituted or unsubstituted α-naphthyl group, and the substituted or unsubstituted β-naphthyl group.

(Anthracene Derivative (2-B))

The anthracene derivative is such that one of $Ar^{11}$ and $Ar^{12}$ in the formula (2-2) represents a substituted or unsubstituted phenyl group, and the other represents a substituted or unsubstituted, fused aryl group having 10 to 20 ring carbon atoms. Specific examples of the anthracene derivative include anthracene derivatives represented by the following formulae (2-2-4) and (2-2-5).

The anthracene derivative represented by the following formula (2-2-4) is such that $Ar^{11}$ in the formula (2-2) represents a substituted or unsubstituted α-naphthyl group, and $Ar^{12}$ in the formula represents a substituted or unsubstituted phenyl group.

[Chem 50]

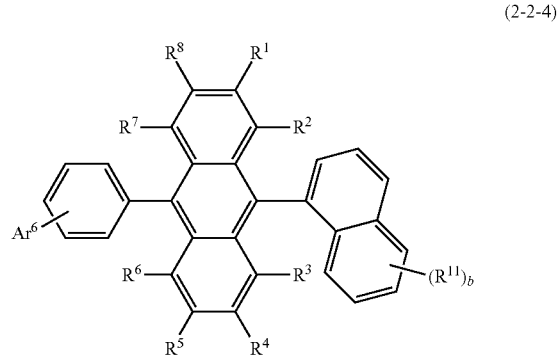

(2-2-4)

(In the formula (2-2-4): $R^1$ to $R^8$ and $R^{11}$, and b each have the same meaning as that described above; $Ar^6$ represents a substituted or unsubstituted aryl group having 6 to 50 ring carbon atoms, a substituted or unsubstituted alkyl group having 1 to 50 ring carbon atoms, a substituted or unsubstituted cycloalkyl group having 3 to 50 ring carbon atoms, a substituted or unsubstituted aralkyl group having 7 to 50 carbon atoms, a substituted or unsubstituted heterocyclic group having 5 to 50 ring atoms, a 9,9-dimethylfluoren-1-yl group, a 9,9-dimethylfluoren-2-yl group, a 9,9-dimethylfluoren-3-yl group, a 9,9-dimethylfluoren-4-yl group, a dibenzofuran-1-yl group, a dibenzofuran-2-yl group, a dibenzofuran-3-yl group, or a dibenzofuran-4-yl group, and $Ar^6$ may form a substituted or unsubstituted fluorenyl group, or a substituted or unsubstituted dibenzofluorenyl group together with the benzene ring to which $Ar^6$ is bonded; when b represents an integer of 2 or more, a plurality of $R^{11}$'s may be identical to or different from each other; and the position at which $R^{11}$ is bonded to the α-naphthyl group is not limited.)

The anthracene derivative represented by the following formula (2-2-5) is such that $Ar^{11}$ in the formula (2-2) represents a substituted or unsubstituted β-naphthyl group, and $Ar^{12}$ in the formula represents a substituted or unsubstituted phenyl group.

[Chem 51]

(2-2-5)

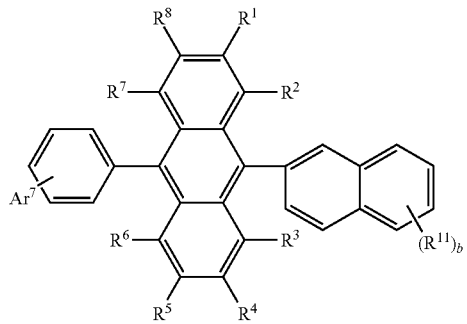

(In the formula (2-2-5): $R^1$ to $R^8$ and $R^{11}$, and b each have the same meaning as that described above; $Ar^7$ represents a substituted or unsubstituted alkyl group having 1 to 50 ring carbon atoms, a substituted or unsubstituted cycloalkyl group having 3 to 50 ring carbon atoms, a substituted or unsubstituted aralkyl group having 7 to 50 carbon atoms, a substituted or unsubstituted heterocyclic group having 5 to 50 ring atoms, a dibenzofuran-1-yl group, a dibenzofuran-2-yl group, a dibenzofuran-3-yl group, or a dibenzofuran-4-yl group, and $Ar^7$ may form a substituted or unsubstituted fluorenyl group, or a substituted or unsubstituted dibenzofluorenyl group together with the benzene ring to which $Ar^7$ is bonded; when b represents an integer of 2 or more, a plurality of $R^{11}$'s may be identical to or different from each other; and the position at which $R^{11}$ is bonded to the β-naphthyl group is not limited.)

(Anthracene Derivative (2-C))

The anthracene derivative is represented by the following formula (2-2-6). To be specific, the derivative is preferably a derivative represented by any one of the following formulae (2-2-6-1), (2-2-6-2), and (2-2-6-3).

[Chem 52]

(2-2-6)

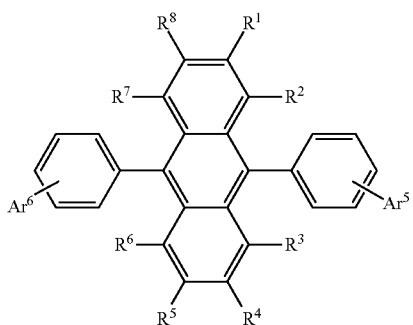

(In the formula (2-2-6): $R^1$ to $R^8$ and $Ar^6$ each have the same meaning as that described above; $Ar^5$ represents a substituted or unsubstituted aryl group having 6 to 50 ring carbon atoms, a substituted or unsubstituted alkyl group having 1 to 50 ring carbon atoms, a substituted or unsubstituted cycloalkyl group having 3 to 50 ring carbon atoms, a substituted or unsubstituted aralkyl group having 7 to 50 carbon atoms, or a substituted or unsubstituted heterocyclic group having 5 to 50 ring atoms; and $Ar^5$ and $Ar^6$ are selected independently of each other.)

[Chem 53]

(2-2-6-1)

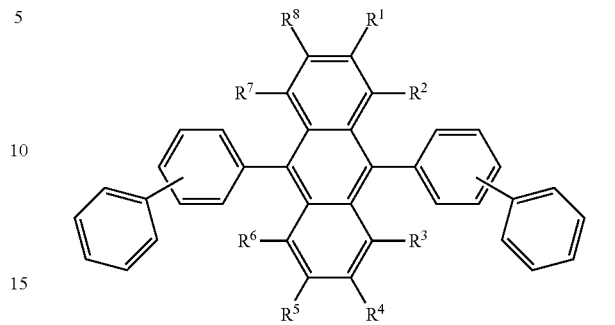

(In the formula (2-2-6-1), $R^1$ to $R^8$ each have the same meaning as that described above.)

[Chem 54]

(2-2-6-2)

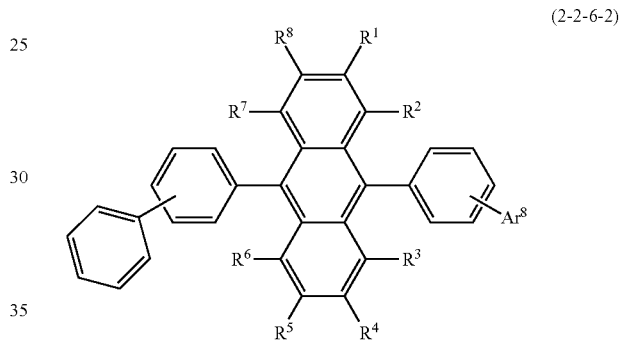

(In the formula (2-2-6-2), $R^1$ to $R^8$ each have the same meaning as that described above, and $Ar^8$ represents a substituted or unsubstituted, fused aryl group having 10 to 20 ring carbon atoms.)

[Chem 55]

(2-2-6-3)

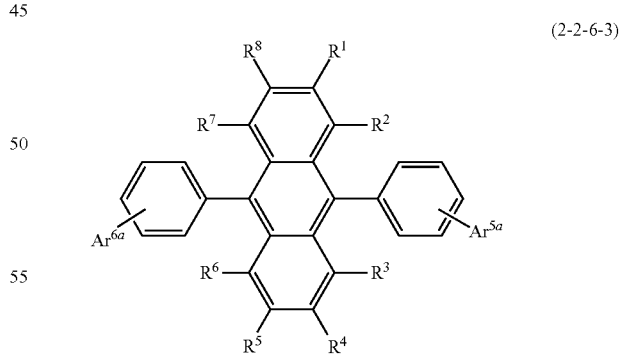

(In the formula (2-2-6-3), $R^1$ to $R^8$ each have the same meaning as that in the formula (2-2), and $Ar^{5a}$ and $Ar^{6a}$ each independently represent a substituted or unsubstituted, fused aryl group having 10 to 20 ring carbon atoms.)

Examples of the substituted or unsubstituted aryl group having 6 to 20 ring carbon atoms represented by any one of $Ar^{11}$ and $Ar^{12}$ include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 6-chrysenyl group, a 1-benzo[c]phenanthryl group, a 2-benzo[c]phenanthryl group, a 3-benzo[c]phenanthryl group, a 4-benzo[c]phenanthryl group, a 5-benzo[c]phenanthryl group, a 6-benzo[c]phenanthryl group, a 1-benzo[g]chrysenyl group, a 2-benzo[g]chrysenyl group, a 3-benzo[g]chrysenyl group, a 4-benzo[g]chrysenyl group, a 5-benzo[g]chrysenyl group, a 6-benzo[g]chrysenyl group, a 7-benzo[g]chrysenyl group, an 8-benzo[g]chrysenyl group, a 9-benzo[g]chrysenyl group, a 10-benzo[g]chrysenyl group, an 11-benzo[g]chrysenyl group, a 12-benzo[g]chrysenyl group, a 13-benzo[g]chrysenyl group, a 14-benzo[g]chrysenyl group, a 1-triphenyl group, a 2-triphenyl group, a 2-fluorenyl group, a 9,9-dimethylfluoren-2-yl group, a benzofluorenyl group, a dibenzofluorenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, and a 4"-t-butyl-p-terphenyl-4-yl group. Of those, preferred is a substituted phenyl group and a substituted or unsubstituted aryl group having 10 to 14 ring carbon atoms (such as an α-naphthyl group, a β-naphthyl group, or a 9-phenanthryl group).

In addition, examples of the substituted or unsubstituted, fused aryl group having 10 to 20 ring carbon atoms represented by any one of $Ar^{5a}$, $Ar^{6a}$, and $Ar^8$ include an α-naphthyl group, a β-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, and a 4-pyrenyl group. Of those, an α-naphthyl group, a β-naphthyl group, and a 9-phenanthryl group are particularly preferred.

Examples of the substituted or unsubstituted aryl group having 6 to 50 carbon atoms represented by any one of $R^1$ to $R^8$, $R^{11}$, and $Ar^5$ and $Ar^6$ include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 6-chrysenyl group, a 1-benzo[c]phenanthryl group, a 2-benzo[c]phenanthryl group, a 3-benzo[c]phenanthryl group, a 4-benzo[c]phenanthryl group, a 5-benzo[c]phenanthryl group, a 6-benzo[c]phenanthryl group, a 1-benzo[g]chrysenyl group, a 2-benzo[g]chrysenyl group, a 3-benzo[g]chrysenyl group, a 4-benzo[g]chrysenyl group, a 5-benzo[g]chrysenyl group, a 6-benzo[g]chrysenyl group, a 7-benzo[g]chrysenyl group, an 8-benzo[g]chrysenyl group, a 9-benzo[g]chrysenyl group, a 10-benzo[g]chrysenyl group, an 11-benzo[g]chrysenyl group, a 12-benzo[g]chrysenyl group, a 13-benzo[g]chrysenyl group, a 14-benzo[g]chrysenyl group, a 1-triphenyl group, a 2-triphenyl group, a 2-fluorenyl group, a 9,9-dimethylfluoren-2-yl group, a benzofluorenyl group, a dibenzofluorenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, and a 4"-t-butyl-p-terphenyl-4-yl group.

Examples of the substituted or unsubstituted heterocyclic group having 5 to 50 ring atoms represented by any one of $R^1$ to $R^8$, $R^{11}$, and $Ar^5$ to $Ar^7$ include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

Examples of the substituted or unsubstituted alkyl group having 1 to 50 carbon atoms represented by any one of $R^1$ to $R^8$, $R^{11}$, and $Ar^5$ to $Ar^7$ include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, and a 1,2,3-trinitropropyl group.

Examples of the substituted or unsubstituted cycloalkyl group having 3 to 50 ring carbon atoms as the substituent represented by any one of $R^1$ to $R^8$, $R^{11}$, and $Ar^5$ to $Ar^7$ include a cyclopropyl group, a cyclobutyl group, a cyclopentyl group, a cyclohexyl group, a 4-methylcyclohexyl group, a 1-adamantyl group, a 2-adamantyl group, a 1-norbornyl group, and a 2-norbornyl group.

The substituted or unsubstituted alkoxy group having 1 to 50 carbon atoms represented by any one of $R^1$ to $R^8$ and $R^{11}$ is a group represented as —OZ, and Z is selected from the substituted or unsubstituted alkyl groups each having 1 to 50 carbon atoms represented by $R^1$ to $R^8$.

Examples of the substituted or unsubstituted aralkyl group having 7 to 50 carbon atoms (the aryl portion having 6 to 49 carbon atoms and the alkyl portion having 1 to 44 carbon atoms) as the substituent represented by any one of $R^1$ to $R^8$, $R^{11}$, and $Ar^5$ to $Ar^7$ include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, an m-methylbenzyl group, an o-methylbenzyl group, a p-chlorobenzyl group, an m-chlorobenzyl group, an o-chlorobenzyl group, a p-bromobenzyl group, an m-bromobenzyl group, an o-bromobenzyl group, a p-iodobenzyl group, an m-iodobenzyl group, an o-iodobenzyl group, a p-hydroxybenzyl group, an m-hydroxybenzyl group, an o-hydroxybenzyl group, a p-aminobenzyl group, an m-aminobenzyl group, an o-aminobenzyl group, a p-nitrobenzyl group, an m-nitrobenzyl group, an o-nitrobenzyl group, a p-cyanobenzyl group, an m-cyanobenzyl group, an o-cyanobenzyl group, a 1-hydroxy-2-phenylisopropyl group, and a 1-chloro-2-phenylisopropyl group.

The substituted or unsubstituted aryloxy group having 6 to 50 ring carbon atoms and the substituted or unsubstituted arylthio group having 6 to 50 ring carbon atoms each represented by any one of $R^1$ to $R^8$ and $R^{11}$ are represented as —OY and —SY, respectively. Each Y is selected from the substituted or unsubstituted aryl groups each having 6 to 50 ring carbon atoms represented by $R^1$ to $R^8$.

The substituted or unsubstituted alkoxycarbonyl group having 2 to 50 carbon atoms (the alkyl portion having 1 to 49 carbon atoms) represented by any one of $R^1$ to $R^8$ and $R^{11}$ is represented as —COOZ. Z is selected from the substituted or unsubstituted alkyl groups each having 1 to 49 carbon atoms represented by $R^1$ to $R^8$.

Examples of the substituted silyl group represented by any one of $R^1$ to $R^8$ and $R^{11}$ include a trimethylsilyl group, a triethylsilyl group, a t-butyldimethylsilyl group, a vinyldimethylsilyl group, a propyldimethylsilyl group, and a triphenylsilyl group.

Examples of the halogen atom represented by any one of $R^1$ to $R^8$ and $R^{11}$ include fluorine, chlorine, bromine, and iodine.

Specific examples of the anthracene derivative represented by the formula (2-2) include derivatives represented by the following formulae.

[Chem 56]

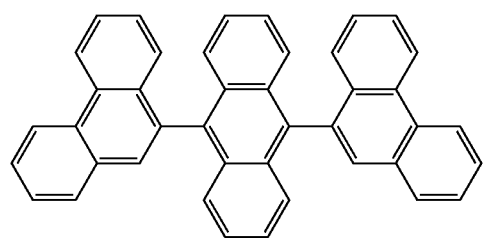

EM2-1

[Chem 57]
EM2-2
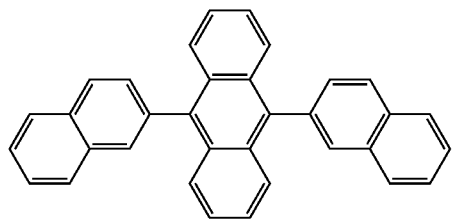
EM2-3
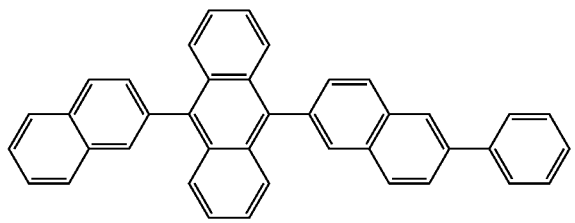
EM2-4
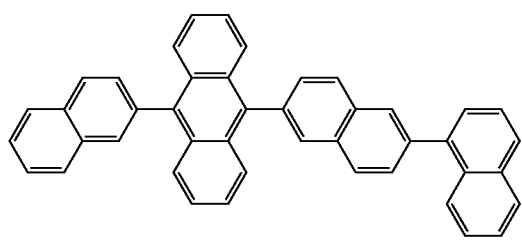
EM2-5
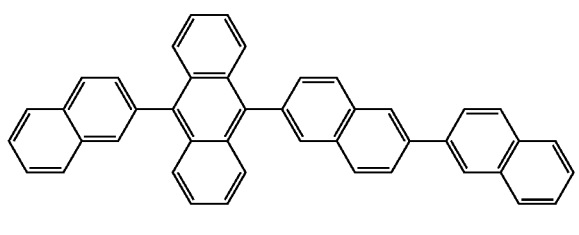
EM2-6
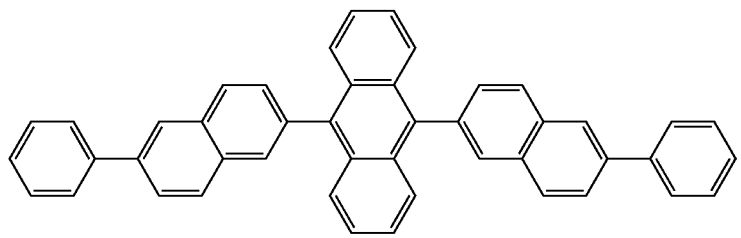
EM2-7
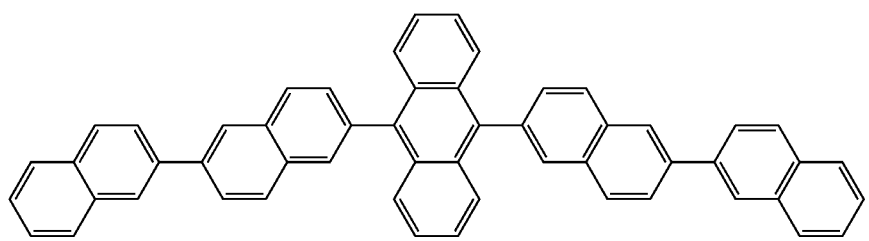
EM2-8
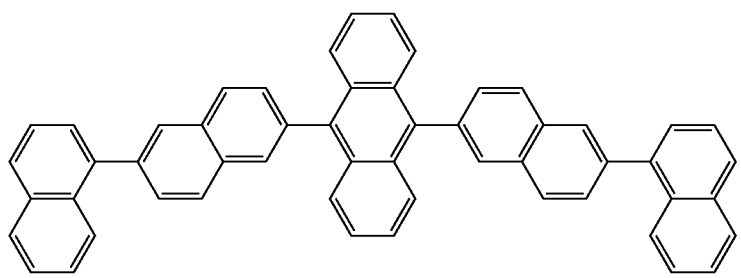
[Chem 58]
EM2-9
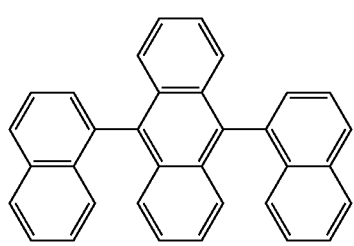
EM2-10
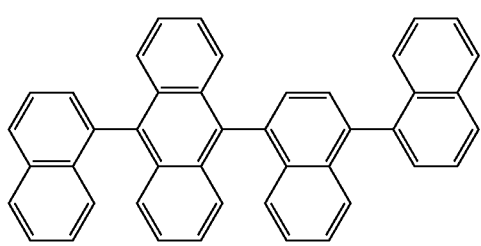

-continued
EM2-11
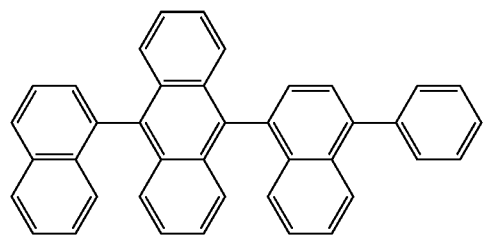
EM2-12
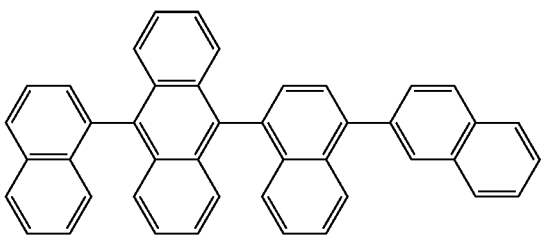
[Chem 59]
EM2-13
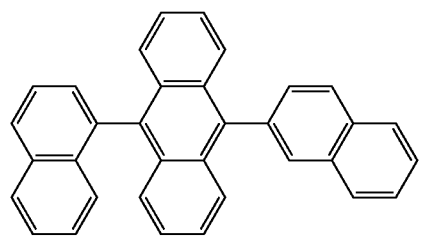
EM2-14
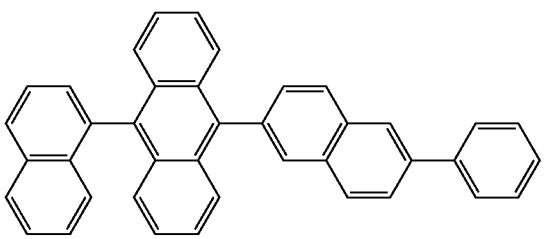
EM2-15
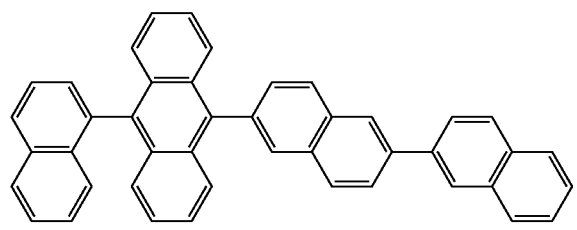
EM2-16
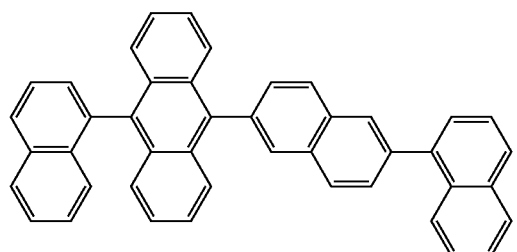
EM2-17
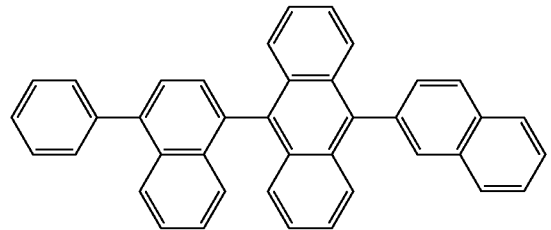
EM2-18
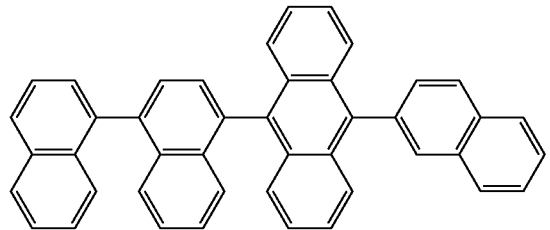
EM2-19
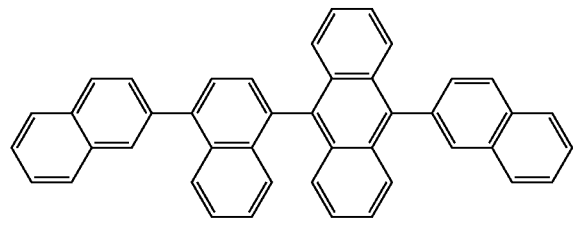
EM2-20
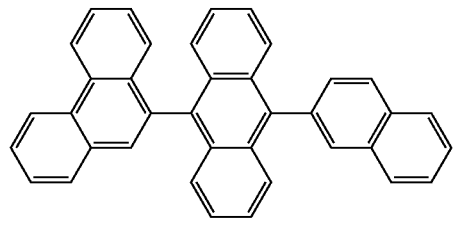
EM2-21
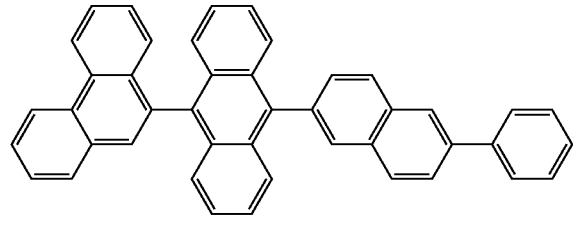
EM2-22
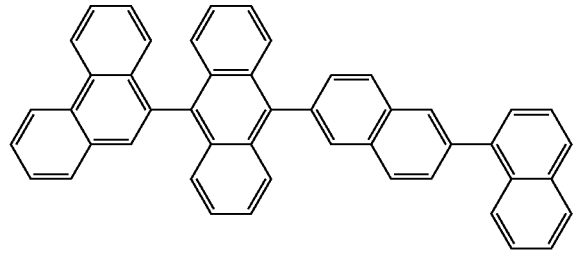

EM2-23
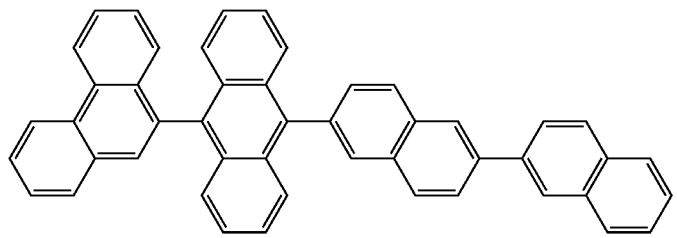
[Chem 60]
EM2-24
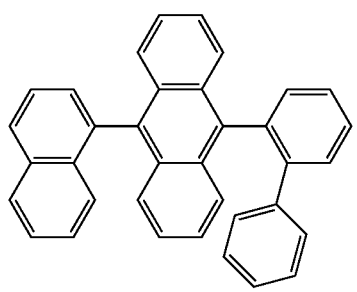
EM2-25
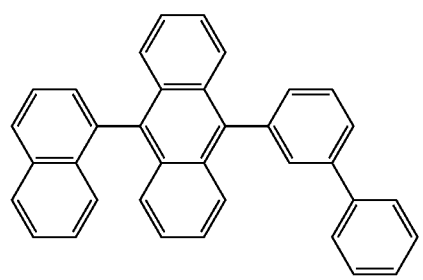
EM2-26
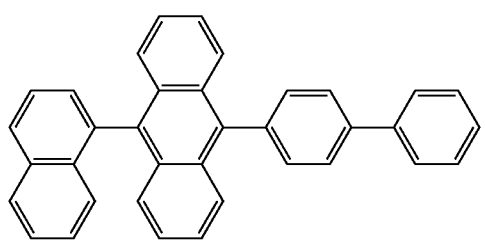
EM2-27
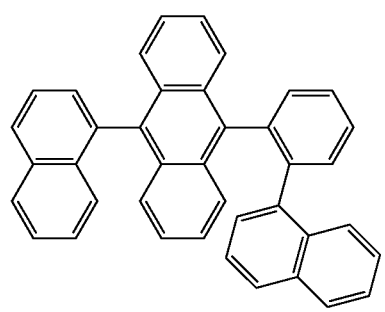
EM2-28
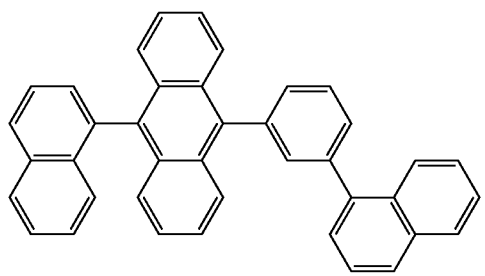
EM2-29
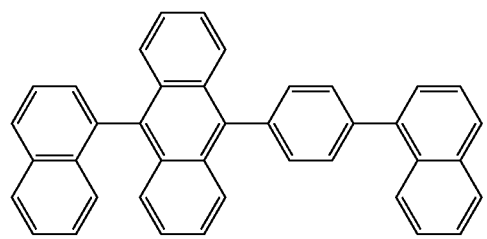
EM2-30
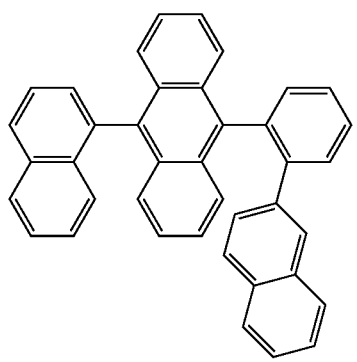
EM2-31
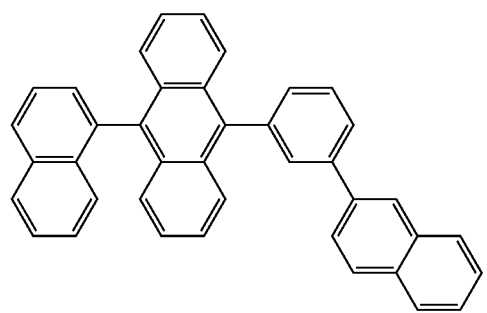

-continued
EM2-32
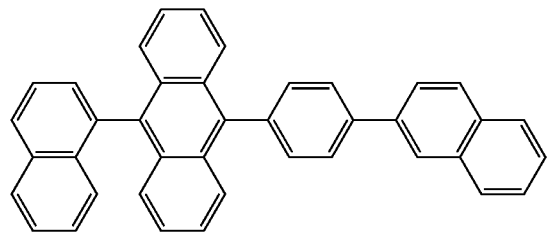
EM2-33
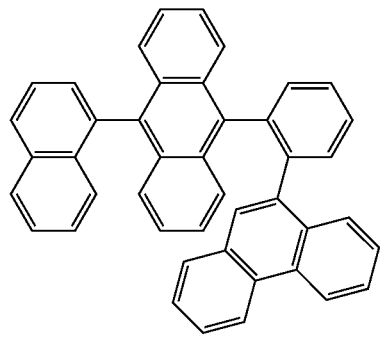
EM2-34
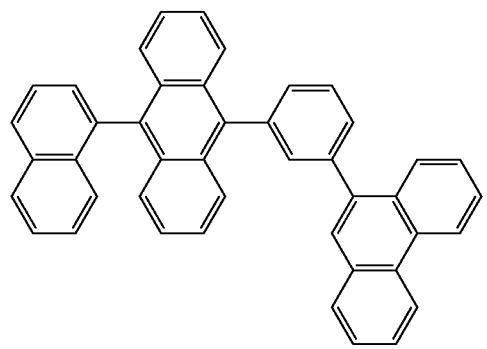
EM2-35
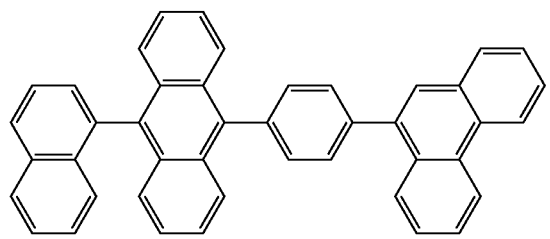
[Chem 61]
EM2-36
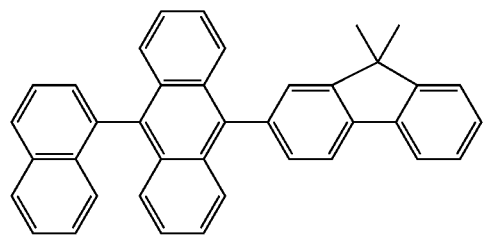
EM2-37
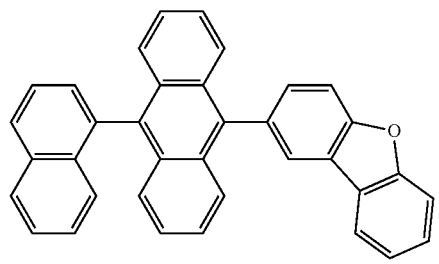
EM2-38
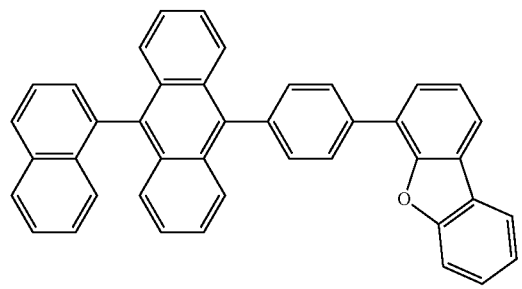
EM2-39
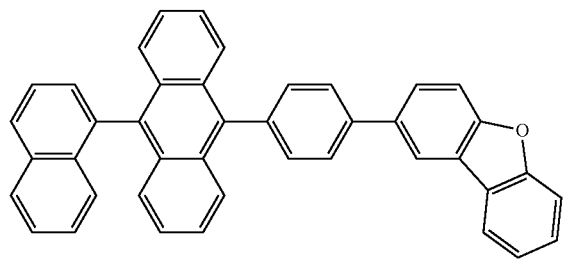

-continued
EM2-40
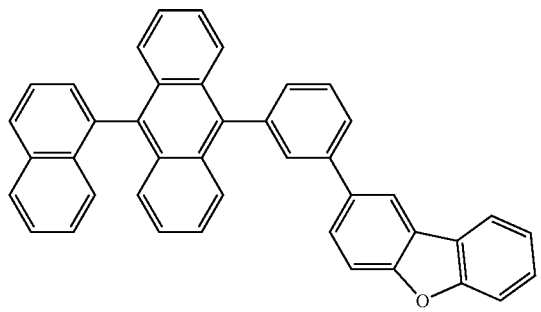
EM2-41
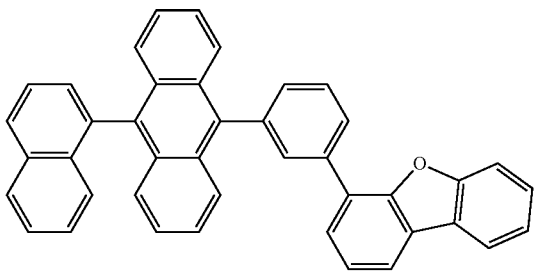
EM2-42
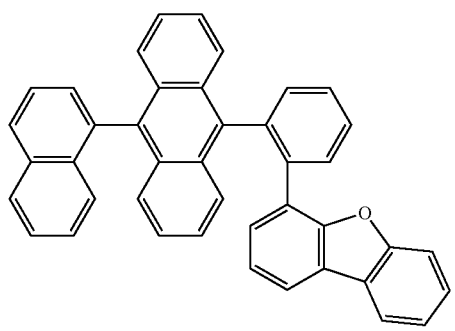
EM2-43
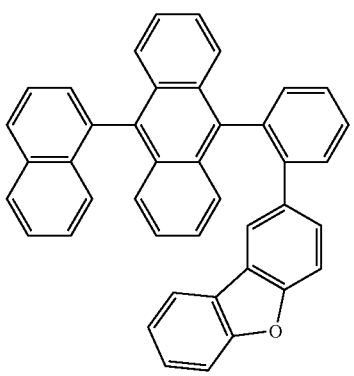
EM2-44
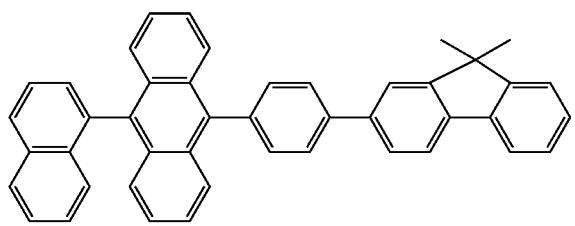
EM2-45
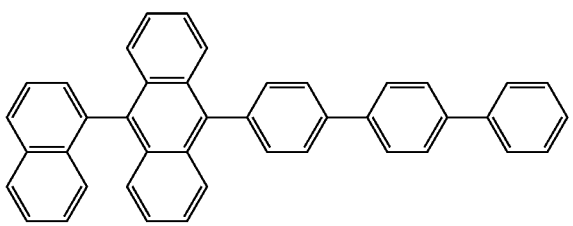
EM2-46
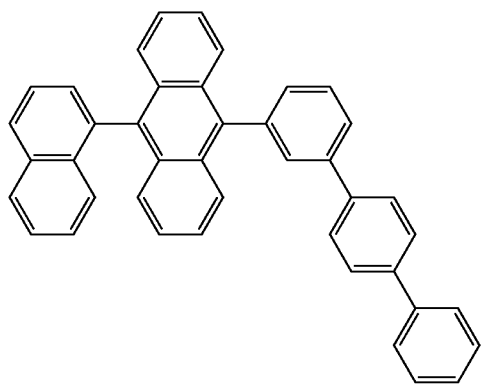
EM2-47
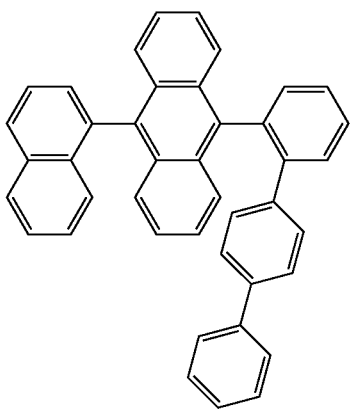

[Chem 62]
EM2-48
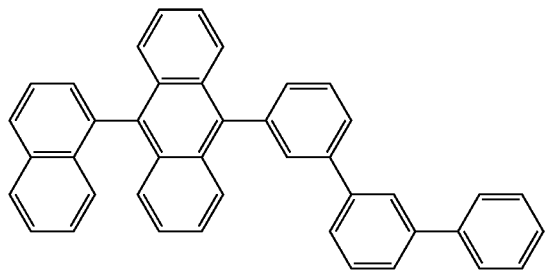
EM2-49
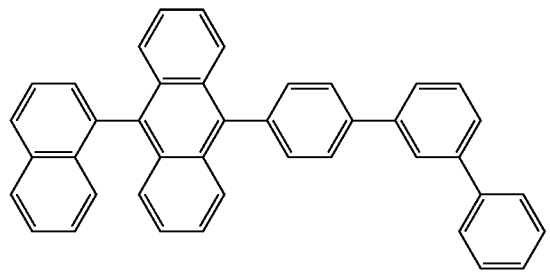
EM2-50
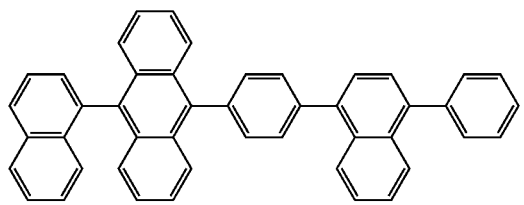
EM2-51
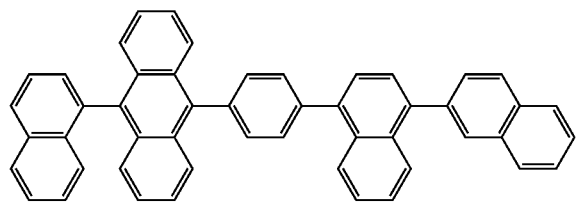
EM2-52
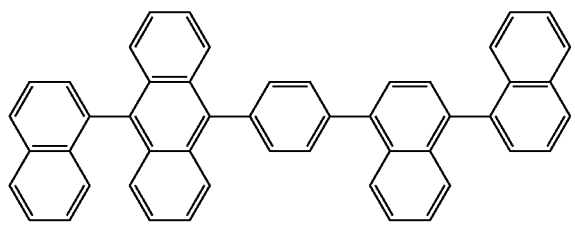
EM2-53
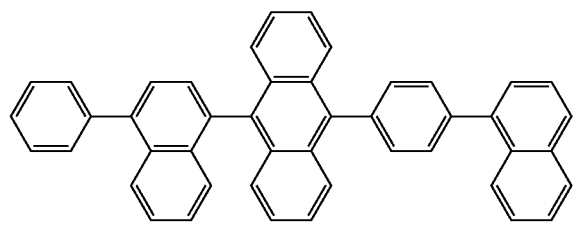
EM2-54
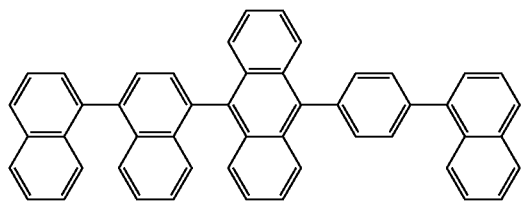
EM2-55
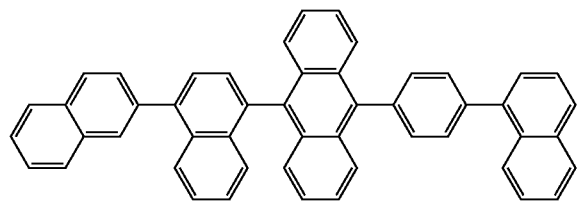
EM2-56
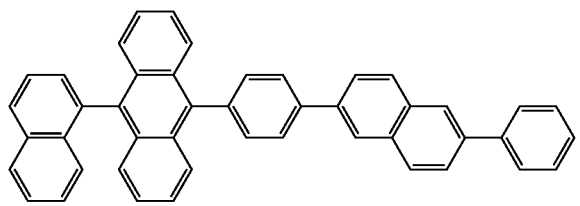
EM2-57
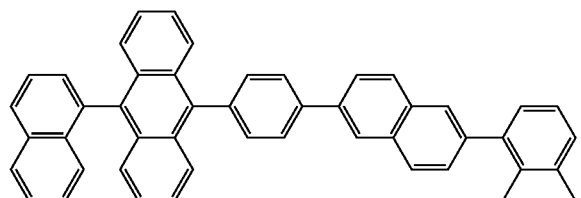
EM2-58
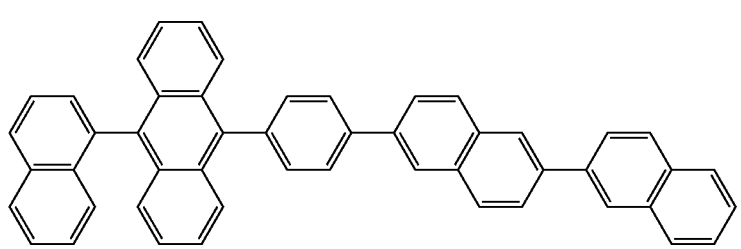

[Chem 63]
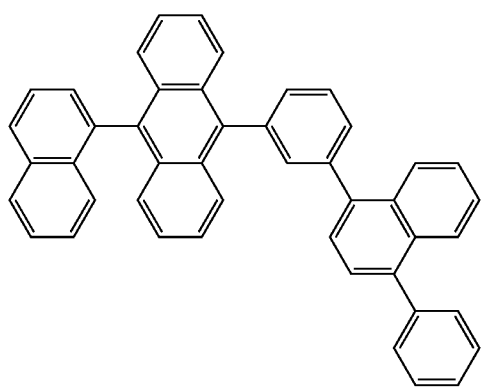
EM2-59
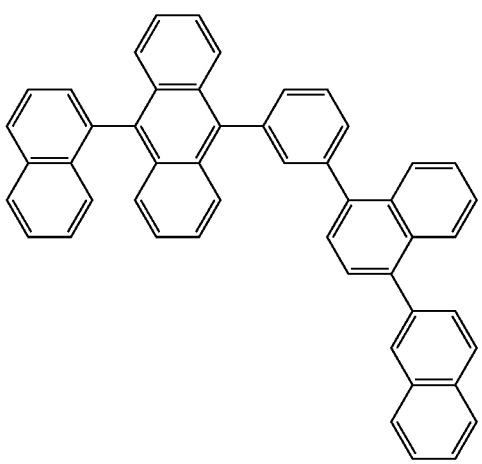
EM2-60
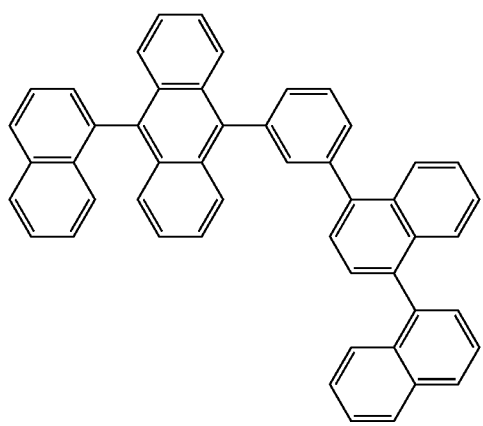
EM2-61
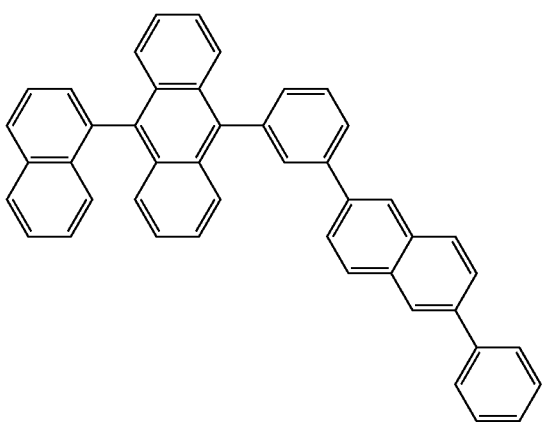
EM2-62
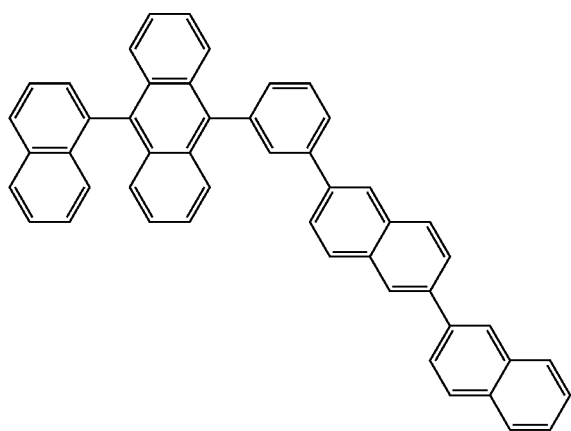
EM2-63
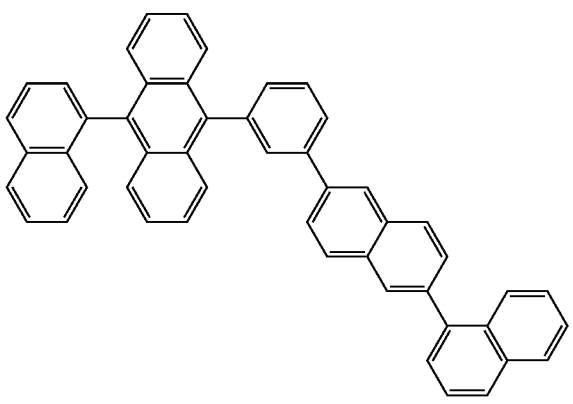
EM2-64

[Chem 64]
EM2-65
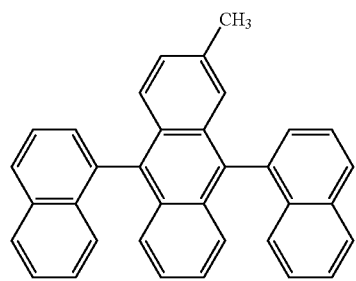
EM2-66
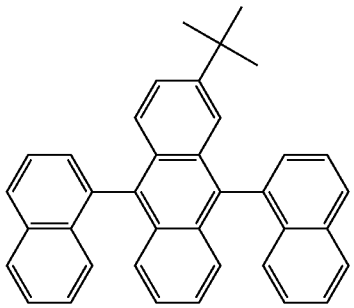
EM2-67
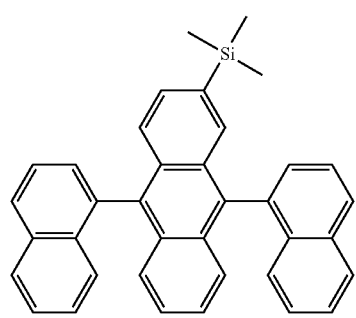
EM2-68
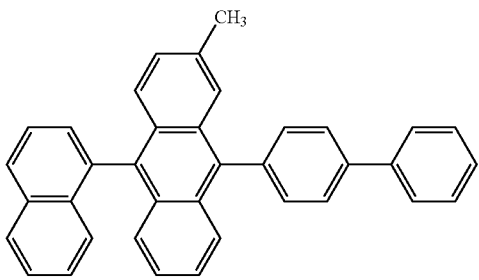
EM2-69
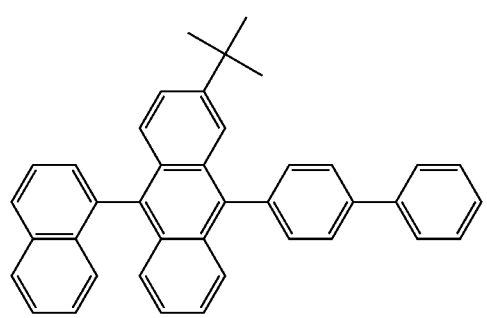
EM2-70
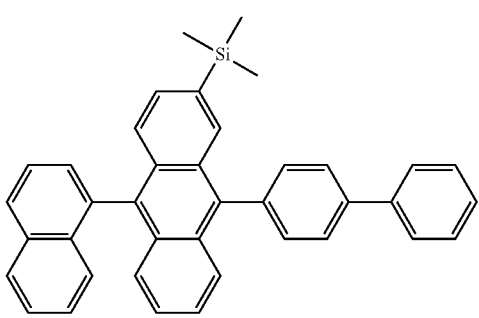
EM2-71
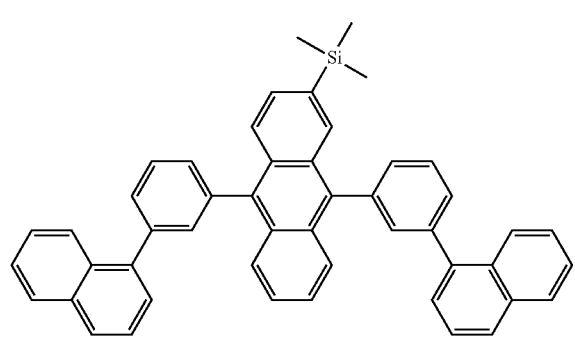
EM2-72
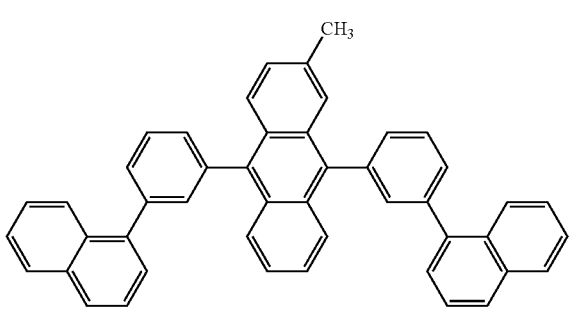

-continued
EM2-73
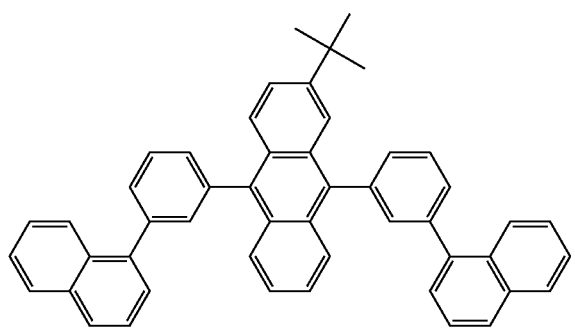
EM2-74
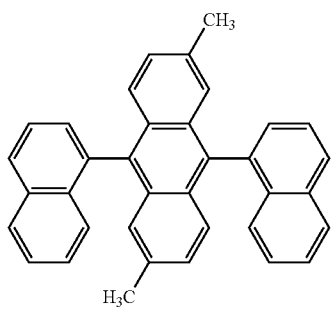
EM2-75
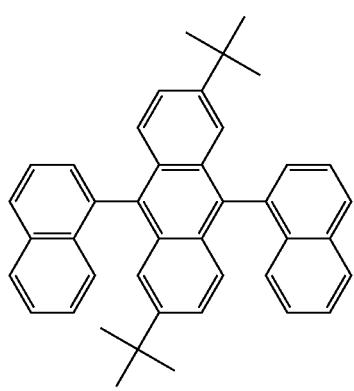
EM2-76
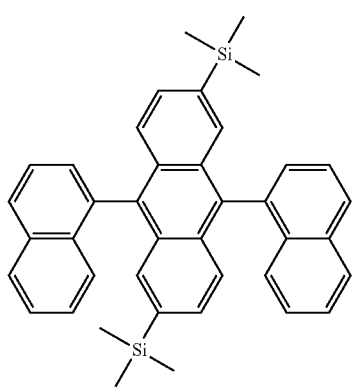
[Chem 65]
EM2-77
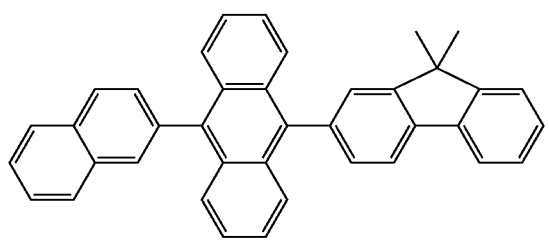
EM2-78
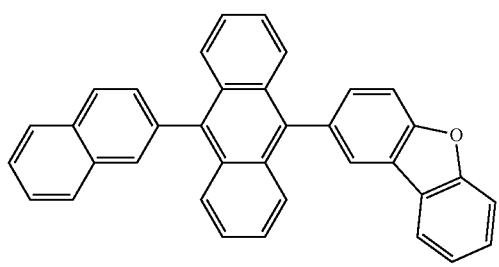
EM2-79
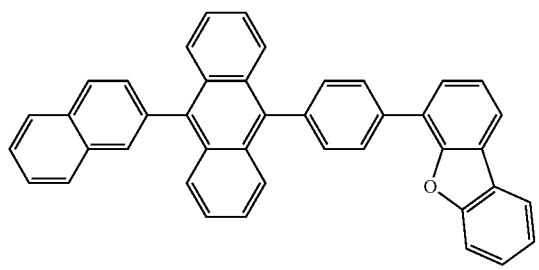
EM2-80
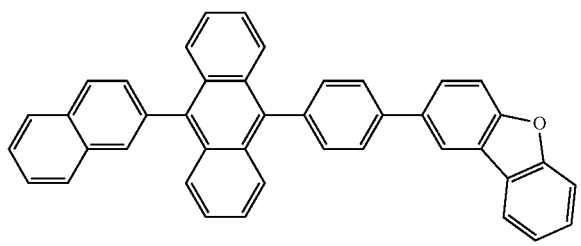

-continued
EM2-81
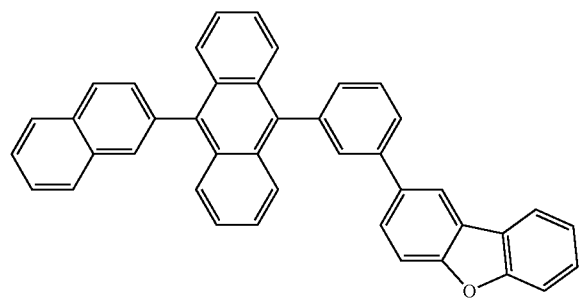
EM2-82
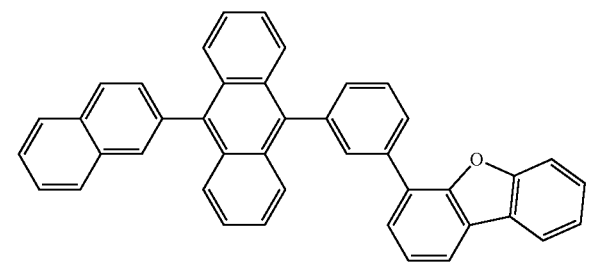
EM2-83
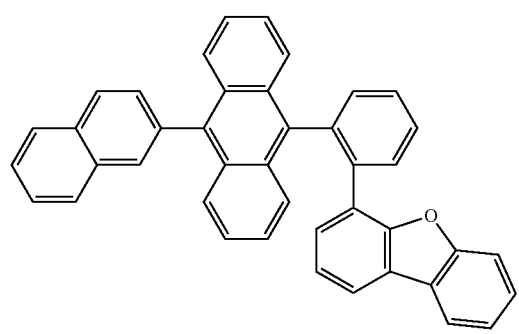
EM2-84
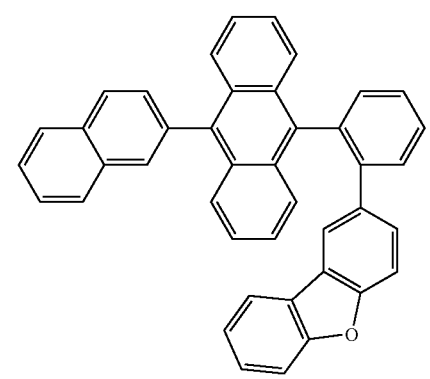
[Chem 66]
EM2-85
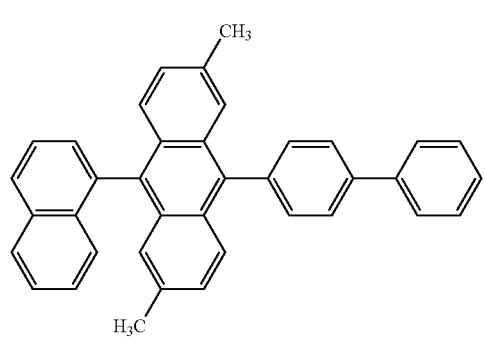
EM2-86
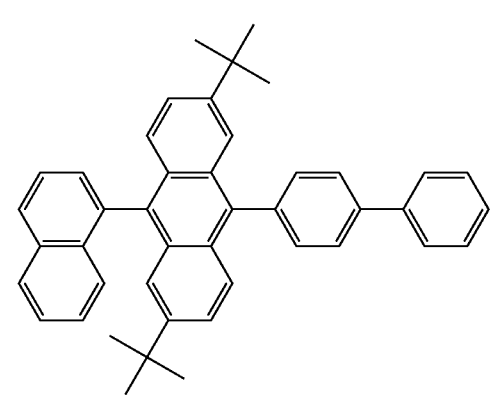
EM2-87
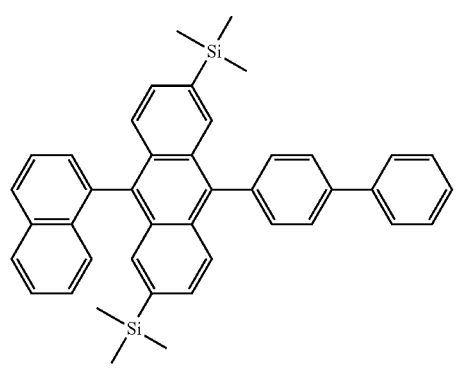
EM2-88
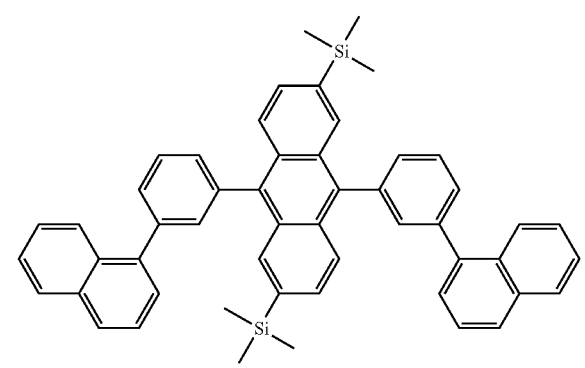

-continued
EM2-89
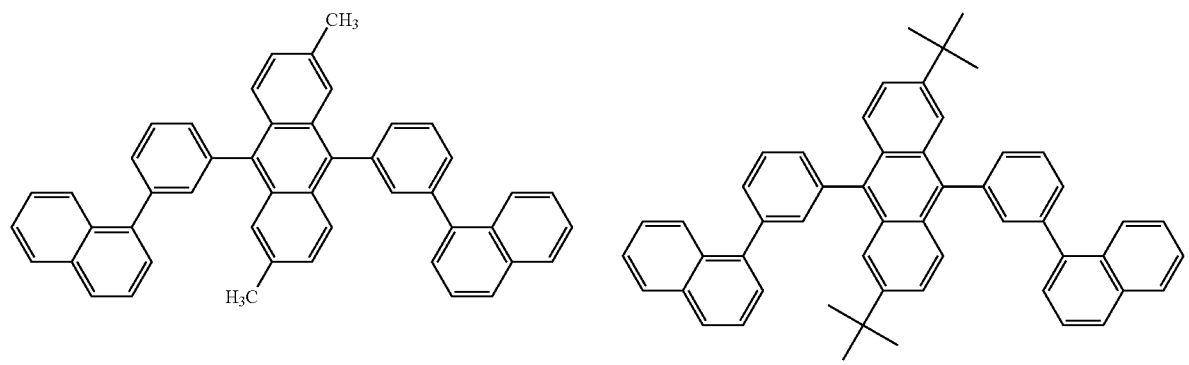
EM2-90
EM2-91
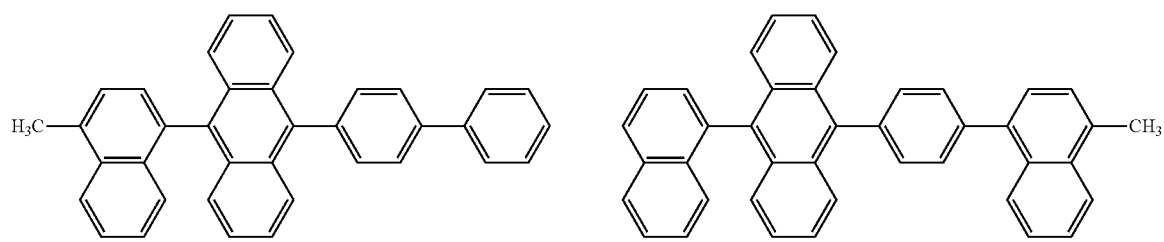
EM2-92
EM2-93
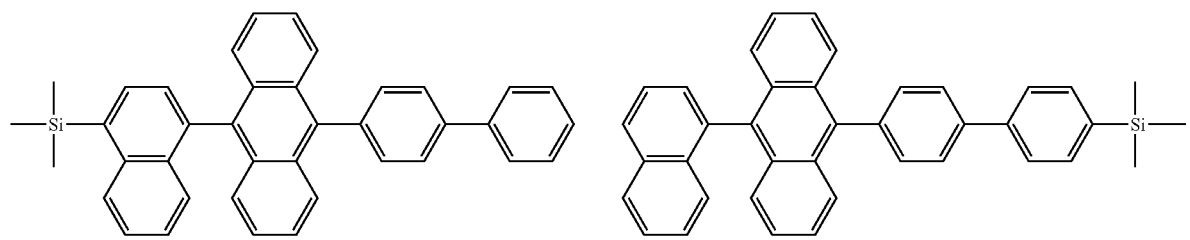
EM2-94
[Chem 67]
EM2-104
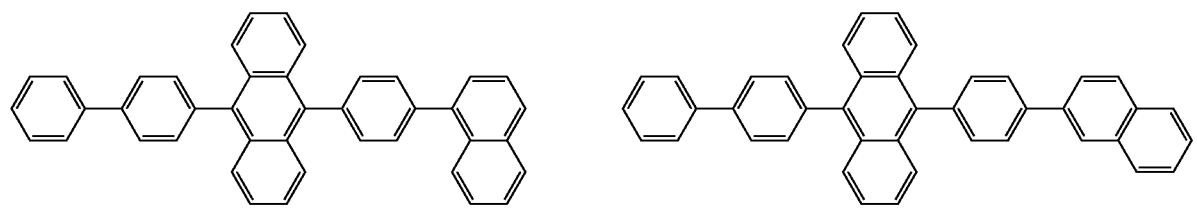
EM2-105
EM2-106
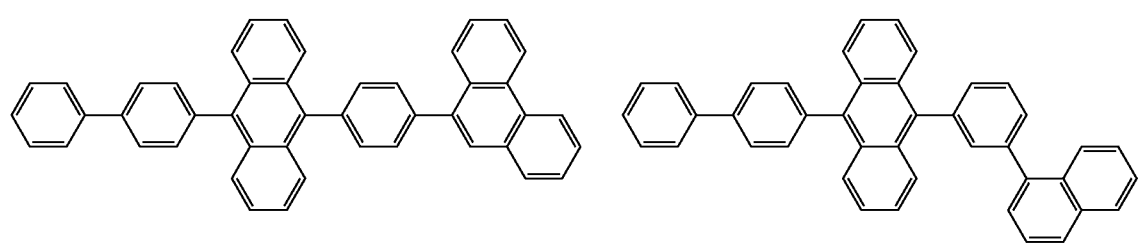
EM2-107

-continued
EM2-108
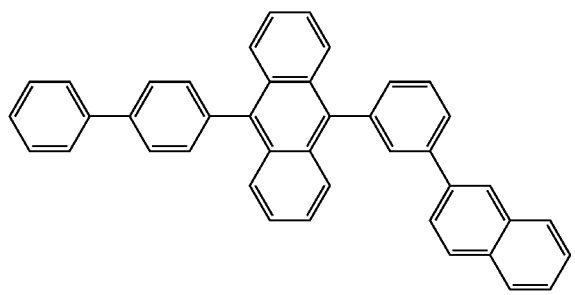
EM2-109
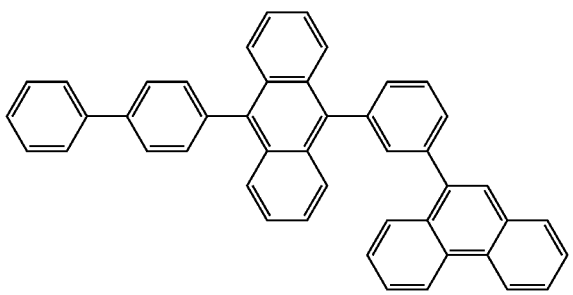
EM2-110
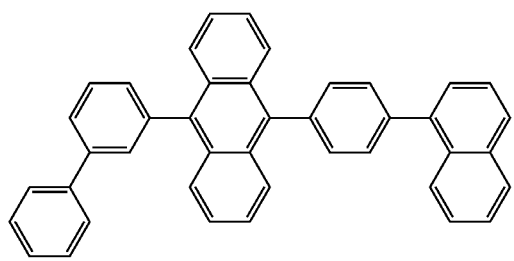
EM2-111
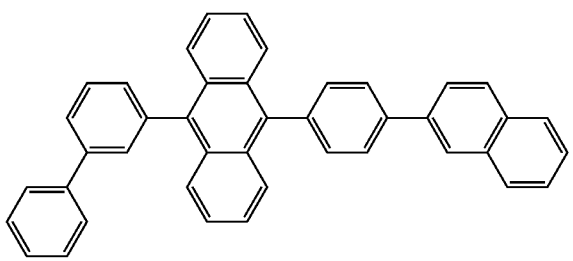
EM2-112
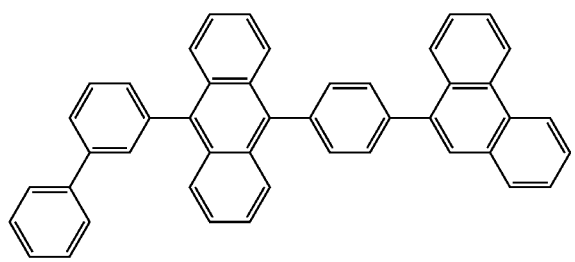
EM2-113
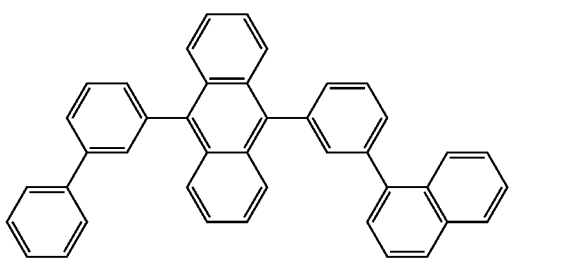
EM2-114
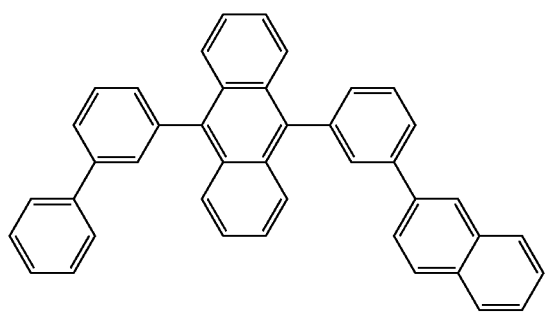
EM2-115
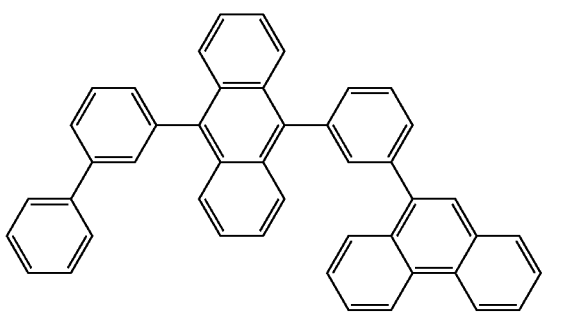
[Chem 68]
EM2-116
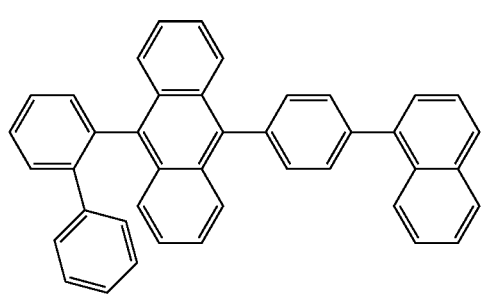
EM2-117
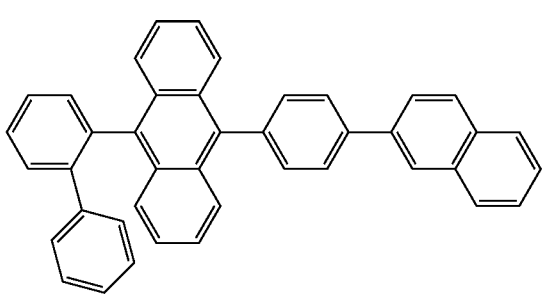

-continued
EM2-118
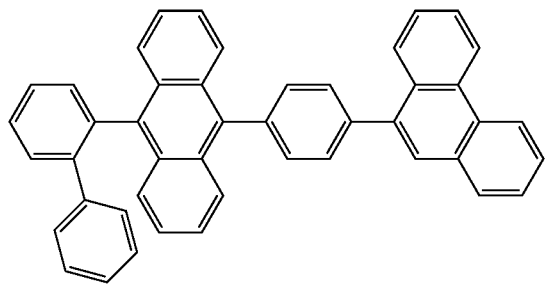
EM2-119
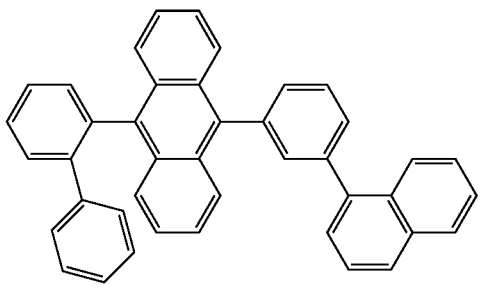
EM2-120
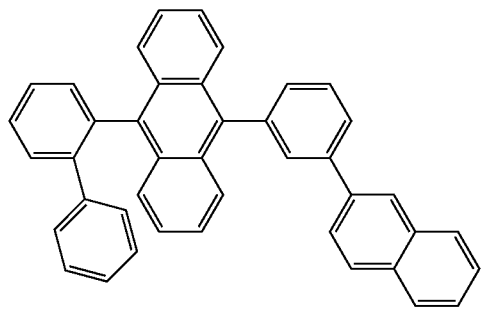
EM2-121
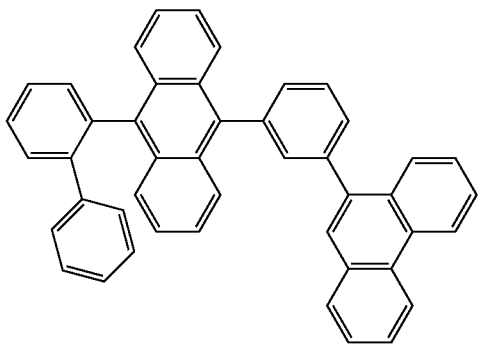
[Chem 69]
EM2-122
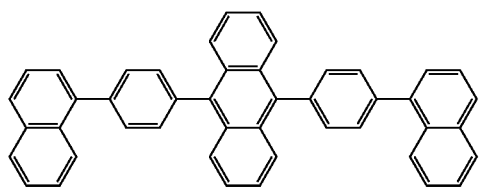
EM2-123
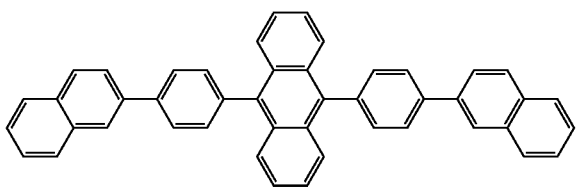
EM2-124
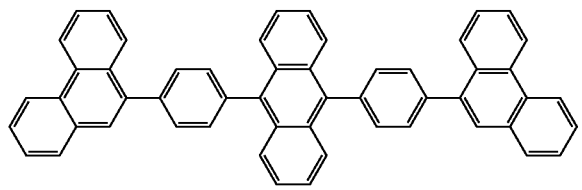
EM2-125
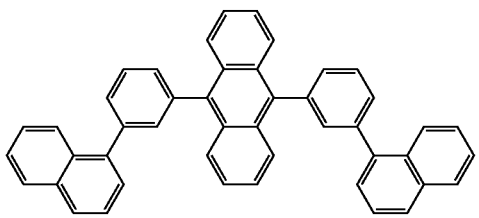
EM2-126
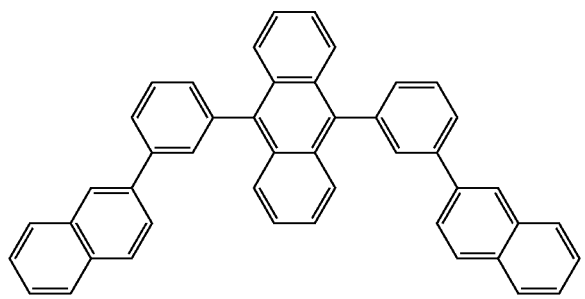
EM2-127
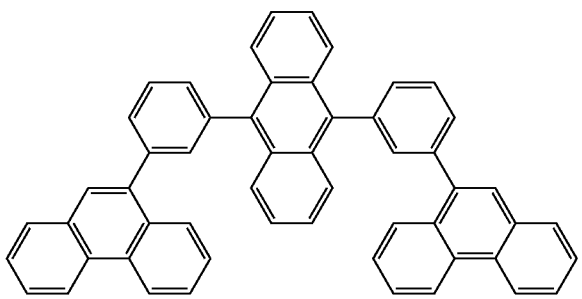

EM2-128
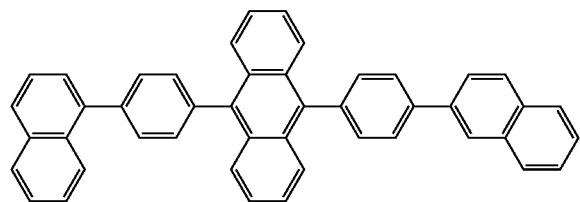
EM2-129
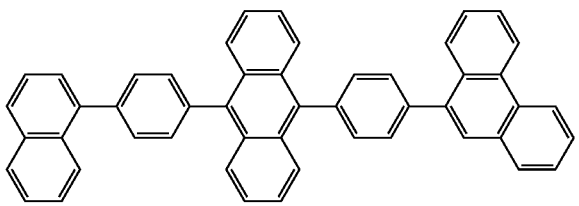
EM2-130
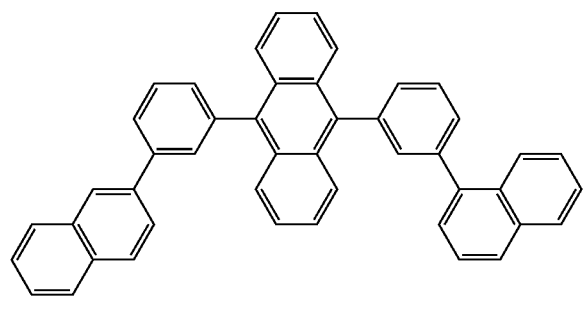
EM2-131
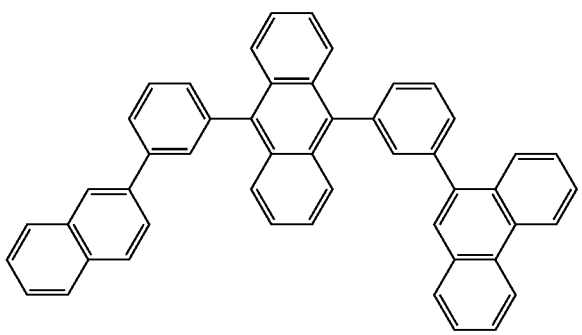
EM2-132
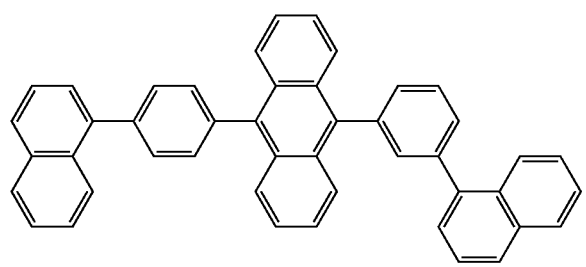
[Chem 70]
EM2-133
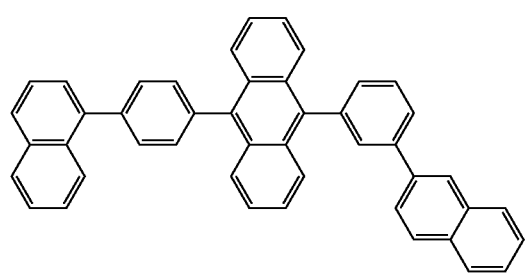
EM2-134
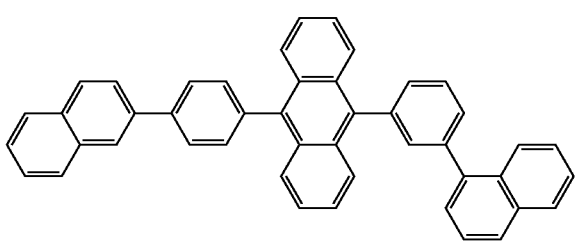
EM2-135
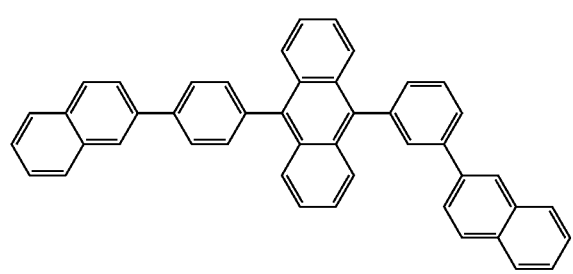
EM2-136
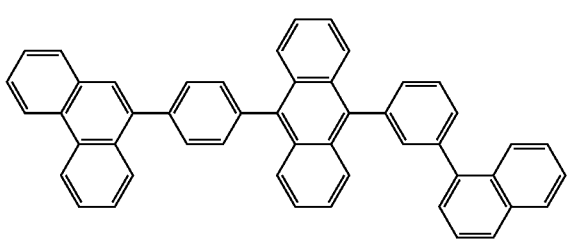

EM2-137

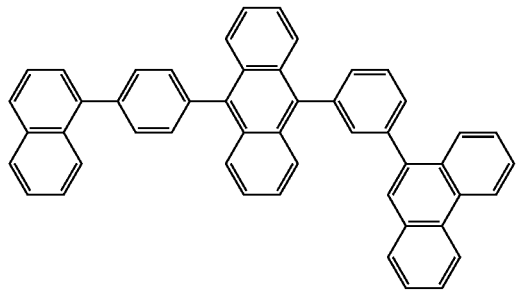

EM2-138

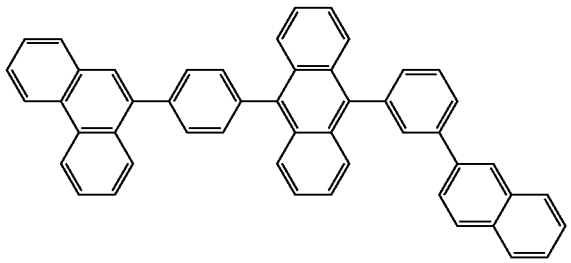

EM2-139

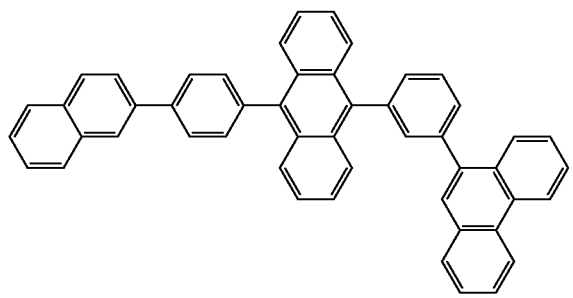

EM2-140

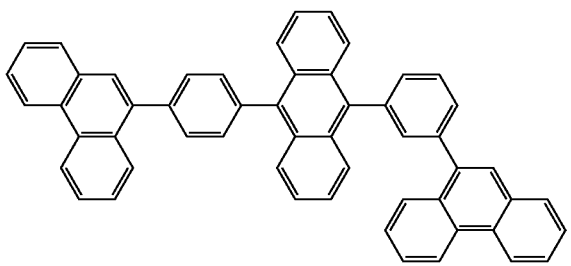

The diaminopyrene derivative represented by the formula (1) can be synthesized by, for example, causing a dibromopyrene obtained by brominating commercially available pyrene to react with the corresponding secondary amine compound in the presence of a metal catalyst. In addition, the anthracene derivative represented by the formula (2) can be synthesized by, for example, a method described in WO 2004/018587 A1.

The organic luminescent medium of the present invention is in a state where such diaminopyrene derivative represented by the formula (1) and anthracene derivative represented by the formula (1) and the formula (2) as described above coexist. A mass ratio between the diaminopyrene derivative represented by the formula (1) and the anthracene derivative represented by the formula (2) is preferably 50:50 to 0.1:99.9, or more preferably 20:80 to 1:99.

[Organic EL Device]

An organic EL device of the present invention is a device in which one or more organic thin film layers are formed between an anode and a cathode. When a plurality of organic thin film layers are formed, one of the layers serves as a light emitting layer. When one organic thin film layer is formed, a light emitting layer as the organic thin film layer is formed between the anode and the cathode. At least one layer (preferably the light emitting layer) of the organic thin film layers contains the organic luminescent medium of the first invention described above and/or the organic luminescent medium of the second invention described above (which may hereinafter be abbreviated as "organic luminescent medium"). The layer may further contain a hole injecting material or an electron injection material in order that a hole injected from the anode or an electron injected from the cathode may be transported to a light emitting material. The organic luminescent medium of the present invention can be used as a light emitting material or doping material in the light emitting layer because the medium has a high light emitting characteristic, and is excellent in hole injecting characteristic, hole transporting characteristic, electron injecting characteristic, and electron transporting characteristic.

The content of the organic luminescent medium in at least one layer (preferably the light emitting layer) of the organic thin film layers is preferably 0.1 to 20 mass %, or more preferably 1 to 10 mass %. In addition, the light emitting layer can be formed only of the organic luminescent medium of the present invention because the medium brings together extremely high fluorescent quantum efficiency, a high hole transporting ability, and a high electron transporting ability, and enables the formation of a uniform thin film.

Alternatively, the organic EL device of the present invention is preferably an organic EL device having organic thin film layers formed of two or more layers including at least a light emitting layer, the organic thin film layers being interposed between a cathode and an anode, in which an organic layer mainly formed of the organic luminescent medium of the present invention is present between the anode and the light emitting layer. Examples of the organic layer include a hole injecting layer and a hole transporting layer.

In the present invention, the organic EL device having multiple organic thin film layers is a laminate having, for example, an (anode/hole injecting layer/light emitting layer/cathode), (anode/light emitting layer/electron injecting layer/cathode), or (anode/hole injecting layer/light emitting layer/electron injecting layer/cathode) structure.

If needed, in addition to the organic luminescent medium of the present invention, a known light emitting material, doping material, hole injecting material, or electron injecting material may be further used in the multiple layers. When the organic EL device has a structure of the multiple organic thin film layers, a reduction in luminance or lifetime due to quenching may be prevented. If needed, the light emitting material, the doping material, the hole injecting material, and the electron injecting material may be used in combination. In addition, by using the doping material, improvements in emission luminance and luminous efficiency, and red or blue light emission may also be obtained. In addition, each of the hole injecting layer, the light emitting layer, and the electron injecting layer may be formed of a layer structure having two or more layers. At that time, in the case of the hole injecting layer, a layer for injecting a hole from the electrode is referred to as a hole injecting layer, and a layer for accepting the hole from the hole injecting layer and transporting the hole to the light emitting layer is referred to as a hole transporting layer. In the same manner, in the case of the electron injecting layer, a layer for injecting an electron from the electrode is referred to as an electron injecting layer, and a layer for accepting the electron from the electron injecting layer and transporting the electron to the light emitting layer is referred to as an electron transporting layer. Each of those layers is selected and used depending on factors such as the energy level of a material, heat resistance, and adhesiveness between the layer and an organic layer or a metal electrode.

Examples of the host material or doping material which may be used in the light emitting layer together with the organic luminescent medium of the present invention include: polyfused aromatic compounds such as naphthalene, phenanthrene, rubrene, anthracene, tetracene, pyrene, perylene, chrysene, decacyclene, coronene, tetraphenylcyclopentadiene, pentaphenylcyclopentadiene, fluorene, spirofluorene, 9,10-diphenylanthracene, 9,10-bis(phenylethinyl)anthracene, and 1,4-bis(9'-ethinylanthraceyl)benzene and derivatives thereof; organic metal complexes such as tris(8-quinolinolato)aluminum and bis-(2-methyl-8-quinolinolato)-4-(phenylphenolato)aluminum; a triarylamine derivative; a styrylamine derivative; a stilbene derivative; a coumarin derivative; a pyrane derivative; an oxazone derivative; a benzothiazole derivative; a benzoxazole derivative; a benzimidazole derivative; a pyrazine derivative; a cinnamate derivative; a diketopyrrolopyrrole derivative; an acridone derivative; and a quinacridone derivative, but the material is not limited thereto.

A compound having an ability to transport a hole, having a hole injection effect from an anode and an excellent hole injection effect to a light emitting layer or an organic luminescent medium, having an ability of preventing the migration of an exciton generated in the light emitting layer to an electron injecting layer or an electron injecting material, and having excellent thin film-formability is preferred as the hole injecting material. Specific examples of the compound include, but are not limited to, a phthalocyanine derivative, a naphthalocyanine derivative, a porphyrin derivative, oxazole, oxadiazole, triazole, imidazole, imidazolone, imidazolethione, pyrazoline, pyrazolone, tetrahydroimidazole, oxazole, oxadiazole, a hydrazone, acylhydrazone, a polyaryalkane, stilbene, butadiene, benzidine-type triphenylamine, styrylamine-type triphenylamine, diamine-type triphenylamine, and the like, and derivatives thereof, and polymer materials such as polyvinyl carbazole, polysilane, and a conductive polymer.

Of the hole injecting materials that may be used in the organic EL device of the present invention, more effective hole injecting materials are an aromatic tertiary amine derivative and a phthalocyanine derivative.

Examples of the aromatic tertiary amine derivative include, but are not limited to, triphenylamine, tritolylamine, tolyldiphenylamine, N,N'-diphenyl-N,N'-(3-methylphenyl)-1,1'-biphenyl-4,4'-diamine, N,N,N',N'-(4-methylphenyl)-1,1'-phenyl-4,4'-diamine, N,N,N',N'-(4-methylphenyl)-1,1'-biphenyl-4,4'-diamine, N,N'-diphenyl-N,N'-dinaphthyl-1,1'-biphenyl-4,4'-diamine, N,N'-(methylphenyl)-N,N'-(4-n-butylphenyl)-phenanthrene-9,10-diamine, N,N-bis(4-di-4-tolylaminophenyl)-4-phenyl-cyclohexane, and the like, and an oligomer or a polymer having one of the aromatic tertiary amine skeletons.

Examples of the phthalocyanine (Pc) derivative include, but are not limited to, phthalocyanine derivatives such as $H_2Pc$, $CuPc$, $CoPc$, $NiPc$, $ZnPc$, $PdPc$, $FePc$, $MnPc$, $ClAlPc$, $ClGaPc$, $ClInPc$, $ClSnPc$, $Cl_2SiPc$, $(HO)AlPc$, $(HO)GaPc$, $VOPc$, $TiOPc$, $MoOPc$, and $GaPc$-O—$GaPc$, and naphthalocyanine derivatives.

In addition, the organic EL device of the present invention is preferably formed of a layer containing any of those aromatic tertiary amine derivatives and/or phthalocyanine derivatives, such as the hole transporting layer or the hole injecting layer, between a light emitting layer and an anode.

A compound having an ability of transporting electrons, having an electron injection effect from a cathode and an excellent electron injection effect to a light emitting layer or a light emitting material, having an ability of preventing the migration of an exciton generated in the light emitting layer to the hole injecting layer, and having excellent thin film-formability is preferred as an electron injecting material.

As specific examples of the electron injecting material, a metal complex of 8-hydroxyquinoline or of a derivative of 8-hydroxyquinoline, or an oxadiazole derivative is suitable. Specific examples of the metal complex of 8-hydroxyquinoline or of the derivative of 8-hydroxyquinoline that can be used as the electron injecting material include metal chelate oxynoid compounds each containing a chelate of an oxine (generally 8-quinolinol or 8-hydroxyquinoline) such as tris(8-quinolinolato)aluminum.

On the other hand, examples of the oxadiazole derivative include electron transfer compounds represented by the following general formula.

[Chem 71]

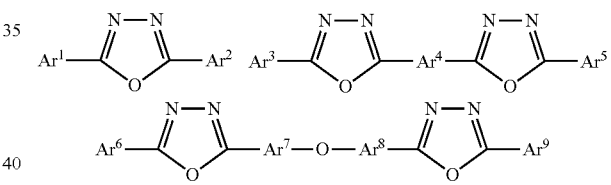

(In the formula, $Ar^1$, $Ar^2$, $Ar^3$, $Ar^5$, $Ar^6$, and $Ar^9$ each represent a substituted or unsubstituted aryl group and may be identical to or different from each other; and $Ar^4$, $Ar^7$ and $Ar^8$ each represent a substituted or unsubstituted arylene group and may be identical to or different from each other.)

Examples of the aryl group include a phenyl group, a biphenyl group, an anthranyl group, a perylenyl group, and a pyrenyl group. In addition, examples of the arylene group include a phenylene group, a naphthylene group, a biphenylene group, an anthranylene group, a perylenylene group, and a pyrenylene group. In addition, examples of the substituent include alkyl groups each having 1 to 10 carbon atoms, alkoxy groups each having 1 to 10 carbon atoms, and a cyano group. As the electron transfer compound, a compound having a thin film forming property is preferred.

Specific examples of the electron transfer compounds described above include the following.

[Chem 72]

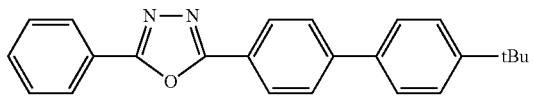

-continued

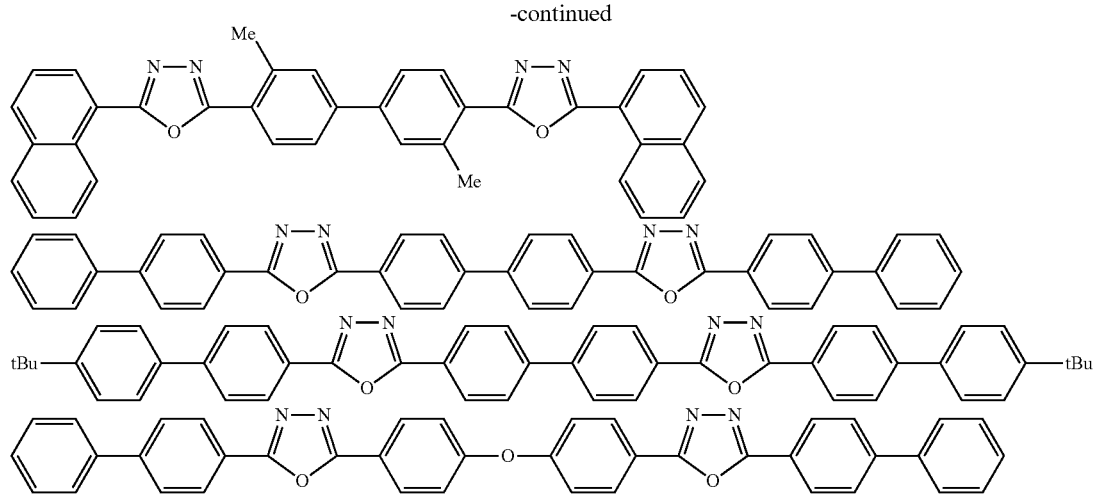

Further, materials represented by the following general formulae (A) to (F) can be used in the electron injecting material:

nitrogen-containing heterocyclic derivatives represented by the general formulae (A) and (B):

[Chem 73]

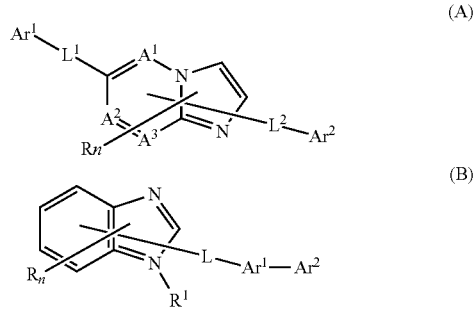

(in the general formulae (A) and (B): $A^1$ to $A^3$ each independently represent a nitrogen atom or a carbon atom;

$Ar^1$ represents a substituted or unsubstituted aryl group having 6 to 60 ring carbon atoms, or a substituted or unsubstituted heterocyclic group having 5 to 60 ring atoms, $Ar^2$ represents a hydrogen atom, a substituted or unsubstituted aryl group having 6 to 60 ring carbon atoms, a substituted or unsubstituted heterocyclic group having 5 to 60 ring atoms, a substituted or unsubstituted alkyl group having 1 to 20 carbon atoms, or a substituted or unsubstituted alkoxy group having 1 to 20 carbon atoms, or a divalent group of any one of those groups, provided that one of $Ar^1$ and $Ar^2$ represents a substituted or unsubstituted fused ring group having 10 to 60 ring carbon atoms or a substituted or unsubstituted monohetero fused ring group having 5 to 60 ring atoms;

$L^1$, $L^2$, and L each independently represent a single bond, a substituted or unsubstituted arylene group having 6 to 60 ring carbon atoms, a substituted or unsubstituted heteroarylene group having 5 to 60 ring atoms, or a substituted or unsubstituted fluorenylene group;

R represents a hydrogen atom, a substituted or unsubstituted aryl group having 6 to 60 ring carbon atoms, a substituted or unsubstituted heterocyclic group having 5 to 60 ring atoms, a substituted or unsubstituted alkyl group having 1 to 20 carbon atoms, or a substituted or unsubstituted alkoxy group having 1 to 20 carbon atoms; and n represents an integer of 0 to 5, and, when n represents 2 or more, multiple R's may be identical to or different from each other, and multiple R groups adjacent to each other may be bonded to each other to form a carbocyclic aliphatic ring or a carbocyclic aromatic ring);

a nitrogen-containing heterocyclic ring derivative represented by the general formula (C):

$$HAr\text{-}L\text{-}Ar^1\text{—}Ar^2 \quad (C)$$

(in the formula, HAr represents a nitrogen-containing heterocyclic ring which has 3 to 40 carbon atoms and may have a substituent, L represents a single bond, an arylene group which has 6 to 60 ring carbon atoms and may have a substituent, a heteroarylene group which has 5 to 60 ring carbon atoms and may have a substituent, or a fluorenylene group which may have a substituent, $Ar^1$ represents a divalent aromatic hydrocarbon group which has 6 to 60 ring carbon atoms and may have a substituent, and $Ar^2$ represents an aryl group which has 6 to 60 ring carbon atoms and may have a substituent, or a hetercyclic group which has 5 to 60 ring carbon atoms and may have a substituent);

a silacyclopentadiene derivative represented by the general formula (D):

[Chem 74]

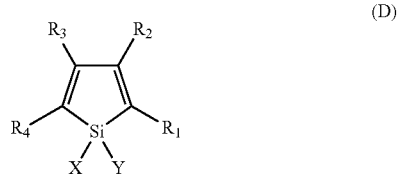

(in the formula: X and Y each independently represent a saturated or unsaturated hydrocarbon group having 1 to 6 carbon atoms, an alkoxy group, an alkenyloxy group, an alkynyloxy group, a hydroxy group, a substituted or unsubstituted aryl group, or a substituted or unsubstituted heterocycle, or X and Y are bonded to each other to form a structure as a saturated or unsaturated ring; and $R_1$ to $R_4$ each independently represent hydrogen, a halogen atom, a substituted or unsubstituted alkyl group having 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoyl group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group, or a cyano group, or, when two or more of $R_1$ to $R_4$ are adjacent to each other, they form a structure in which substituted or unsubstituted rings are fused);

a borane derivative represented by the general formula (E):

[Chem 75]

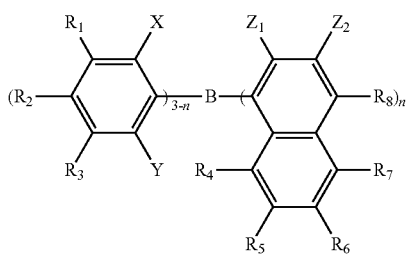

(in the formula: $R_1$ to $R_8$ and $Z_2$ each independently represent a hydrogen atom, a saturated or unsaturated hydrocarbon group, an aromatic hydrocarbon group, a heterocyclic group, a substituted amino group, a substituted boryl group, an alkoxy group, or an aryloxy group; X, Y, and $Z_1$ each independently represent a saturated or unsaturated hydrocarbon group, an aromatic hydrocarbon group, a heterocyclic group, a substituted amino group, an alkoxy group, or an aryloxy group; substituents of $Z_1$ and $Z_2$ may be bonded to each other to form a fused ring; and n represents an integer of 1 to 3, and, when n represents 2 or more, $Z_1$'s may be different from each other, provided that the case where n represents 1, X, Y, and $R_2$ each represent a methyl group, $R_8$ represents a hydrogen atom or a substituted boryl group and the case where n represents 3 and $Z_1$'s each represent a methyl group are excluded);

[Chem 76]

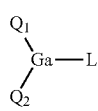

(in the formula: $Q^1$ and $Q^2$ each independently represent a ligand represented by the following general formula (G); and L represents a halogen atom, a substituted or unsubstituted alkyl group, a substituted or unsubstituted cycloalkyl group, a substituted or unsubstituted aryl group, a substituted or unsubstituted heterocyclic group, —$OR^1$ (where $R^1$ represents a hydrogen atom, a substituted or unsubstituted alkyl group, a substituted or unsubstituted cycloalkyl group, a substituted or unsubstituted aryl group, or a substituted or unsubstituted heterocyclic group), or a ligand represented by —O—Ga-$Q^3(Q^4)$ (where $Q^3$ and $Q^4$ are identical to $Q^1$ and $Q^2$, respectively).)

[Chem 77]

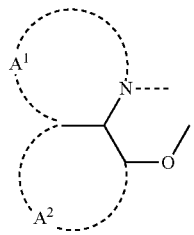

(In the formula, rings $A^1$ and $A^2$ are six-membered aryl ring structures which are fused with each other and each of which may have a substituent.)

The metal complex behaves strongly as an n-type semiconductor, and has a significant electron injecting ability. Further, generation energy upon formation of the complex is low. As a result, the metal and the ligand of the formed metal complex are bonded to each other so strongly that the fluorescent quantum efficiency of the complex as a light emitting material improves.

Specific examples of a substituent in the rings $A^1$ and $A^2$ each of which form a ligand in the general formula (G) include: a halogen atom such as chlorine, bromine, iodine, or fluorine; a substituted or unsubstituted alkyl group such as a methyl group, an ethyl group, a propyl group, a butyl group, an s-butyl group, a t-butyl group, a pentyl group, a hexyl group, a heptyl group, an octyl group, a stearyl group, or trichloromethyl group; a substituted or unsubstituted aryl group such as a phenyl group, a naphthyl group, a 3-methylphenyl group, a 3-methoxyphenyl group, a 3-fluorophenyl group, a 3-trichloromethylphenyl group, a 3-trifluoromethylphenyl group, or a 3-nitrophenyl group; a substituted or unsubstituted alkoxy group such as a methoxy group, an n-butoxy group, a t-butoxy group, a trichloromethoxy group, a trifluoroethoxy group, a pentafluoropropoxy group, a 2,2,3,3-tetrafluoropropoxy group, a 1,1,1,3,3,3-hexafluoro-2-propoxy group, or a 6-(perfluoroethyl)hexyloxy group; a substituted or unsubstituted aryloxy group such as a phenoxy group, a p-nitrophenoxy group, a p-t-butylphenoxy group, a 3-fluorophenoxy group, a pentafluorophenyl group, or a 3-trifluoromethylphenoxy group; a substituted or unsubstituted alkylthio group such as a methylthio group, an ethylthio group, a t-butylthio group, a hexylthio group, an octylthio group, or a trifluoromethylthio group; a substituted or unsubstituted arylthio group such as a phenylthio group, a p-nitrophenylthio group, a p-t-butylphenylthio group, a 3-fluorophenylthio group, a pentafluorophenylthio group, or a 3-trifluoromethylphenylthio group; a cyano group; a nitro group; an amino group; a mono-substituted or di-substituted amino group such as a methylamino group, a diethylamino group, an ethylamino group, a diethylamino group, a dipropylamino group, a dibutylamino group, or a diphenylamino group; an acylamino group such as a bis(acetoxymethyl) amino group, a bis(acetoxyethyl)amino group, a bis(acetoxypropyl)amino group, or a bis(acetoxybutyl)amino group; a hydroxyl group; a siloxy group; an acyl group; a carbamoyl group such as a methylcarbamoyl group, a dimethylcarbamoyl group, an ethylcarbamoyl group, a diethylcarbamoyl group, a propylcarbamoyl group, a butylcarbamoyl group, or a phenylcarbamoyl group; a carboxylic acid group; a sulfonic acid group; an imide group; a cycloalkyl group such as a cyclopentane group, or a cyclohexyl group; an aryl group such as a phenyl group, a naphthyl group, a biphenyl group, an anthranyl group, a phenanthryl group, a fluorenyl group, or a pyrenyl group; and a heterocyclic group such as a pyridinyl group, a pyrazinyl group, a pyrimidinyl group, a pyridazinyl group, a triazinyl group, an indolinyl group, a quinolinyl group, an acridinyl group, a pyrrolidinyl group, a dioxanyl group, a piperidinyl group, a morpholidinyl group, a piperazinyl group, a triathinyl group, a carbazolyl group, a furanyl group, a thiophenyl group, an oxazolyl group, an oxadiazolyl group, a benzoxazolyl group, a thiazolyl group, a thiadiazolyl group, a benzothiazolyl group, a triazolyl group, an imidazolyl group, a benzoimidazolyl group, or a puranyl group. In addition, the above-mentioned substituents may be bonded to each other to further form a six-membered aryl ring or a heterocycle.

A preferred embodiment of the organic EL device of the present invention includes a device including a reducing dopant in the region of electron transport or in the interfacial region of the cathode and the organic layer. Here, the reducing dopant is defined as a substance which can reduce a compound having an electron transporting property. Thus, various compounds can be used as the reducing dopant as long as the compounds have a certain reducing property. For example, at least one substance selected from the group consisting of alkali metals, alkaline earth metals, rare earth metals, oxides of alkali metals, halides of alkali metals, oxides of alkaline earth metals, halides of alkaline earth metals, oxides of rare earth metals, halides of rare earth metals, carbonates of alkali metals, carbonates of alkaline earth metals, organic complexes of alkali metals, organic complexes of alkaline earth metals, and organic complexes of rare earth metals can be suitably used.

In addition, more specifically, preferred examples of the reducing dopant particularly preferably include substances having a work function of 2.9 eV or less, examples of which include at least one alkali metal selected from the group consisting of Na (work function: 2.36 eV), K (work function: 2.28 eV), Rb (work function: 2.16 eV), and Cs (work function: 1.95 eV) and at least one alkaline earth metal selected from the group consisting of Ca (work function: 2.9 eV), Sr (work function: 2.0 to 2.5 eV), and Ba (work function: 2.52 eV). Of those, at least one alkali metal selected from the group consisting of K, Rb, and Cs is more preferred, Rb and Cs are still more preferred, and Cs is most preferred as the reducing dopant. Those alkali metals have particularly high reducing ability, and the emission luminance and the life time of the organic EL device can be increased by addition of a relatively small amount of any of the alkali metals into the electron injecting region. As the reducing dopant having a work function of 2.9 eV or less, a combination of two or more kinds of the alkali metals is also preferred. In particular, a combination containing Cs such as the combination of Cs and Na, Cs and K, Cs and Rb, or Cs, Na, and K is preferred. The reducing ability can be efficiently exhibited by the combination containing Cs. The luminance of emitted light and the life time of the organic EL device can be increased by adding the combination into the electron injecting region.

The present invention may further include an electron injecting layer which is formed of an insulating material or a semiconductor and disposed between the cathode and the organic layer. In this case, leak of electric current can be effectively prevented, and the electron injecting property can be improved. As the insulating material, at least one metal compound selected from the group consisting of alkali metal chalcogenides, alkaline earth metal chalcogenides, halides of alkali metals, and halides of alkaline earth metals is preferably used. It is preferred that the electron injecting layer be formed of the alkali metal chalcogenide or the like because the electron injecting property can be further improved. Specifically, preferred examples of the alkali metal chalcogenide include $Li_2O$, $K_2O$, $Na_2S$, $Na_2Se$, and $Na_2O$. Preferred examples of the alkaline earth metal chalcogenide include CaO, BaO, SrO, BeO, BaS, and CaSe. In addition, preferred examples of the halide of an alkali metal include LiF, NaF, KF, CsF, LiCl, KCl, and NaCl. In addition, preferred examples of the halide of an alkaline earth metal include fluorides such as $CaF_2$, $BaF_2$, $SrF_2$, $MgF_2$, and $BeF_2$ and halides other than the fluorides.

In addition, examples of the semiconductor forming the electron injecting layer include oxides, nitrides, and oxide nitrides containing at least one element selected from Ba, Ca, Sr, Yb, Al, Ga, In, Li, Na, Cd, Mg, Si, Ta, Sb, and Zn used alone or in combination of two or more kinds. In addition, it is preferred that the inorganic compound forming the electron injecting layer form a crystallite or amorphous insulating thin film. When the electron injecting layer is formed of the insulating thin film described above, a more uniform thin film can be formed, and defects of pixels such as dark spots can be decreased. It should be noted that examples of the inorganic compound include the alkali metal chalcogenides, alkaline earthmetal chalcogenides, halides of alkali metals, and halides of alkaline earth metals described above.

Next, as the cathode, a cathode using an electrode material such as a metal, an alloy, a conductive compound, or a mixture of those materials which has a small work function (4 eV or less) is used. Specific examples of the electrode material include sodium, a sodium-potassium alloy, magnesium, lithium, cesium, a magnesium-silver alloy, aluminum/aluminum oxide, $Al/Li_2O$, Al/LiO, Al/LiF, aluminum-lithium alloys, indium, and rare earth metals.

The cathode can be prepared by forming a thin film of the electrode material by a process such as vapor deposition or sputtering.

Here, when the light emitted from the light emitting layer is obtained through the cathode, it is preferred that the cathode have a transmittance of the emitted light of more than 10%. It is also preferred that the sheet resistivity of the cathode be several hundred QM or less. Further, the thickness of the cathode is, in general, in the range of 10 nm to 1 μm or preferably in the range of 50 to 200 nm.

Further, defects in pixels are, in general, easily formed in organic EL device due to leak or short circuit because an electric field is applied to ultra-thin films. To prevent the formation of the defects, a layer of a thin film having an insulating property may be inserted between the pair of electrodes.

Examples of a material used for the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide. A mixture or laminate of the materials may also be used.

In the organic EL device of the present invention, in addition to at least one kind of aromatic amine derivative selected from the general formula (1), at least one kind of light emitting material, doping material, hole injecting material, and electron injecting material may be incorporated into the light emitting layers. In addition, the surface of the organic EL device obtained according to the present invention may be provided with a protective layer, or the entire device may be protected with a silicone oil, a resin, or the like with a view to improving the stability of the device against temperature, humidity, an atmosphere, or the like.

A conductive material having a work function of more than 4 eV is suitably used in the anode of the organic EL device of the present invention. Examples of the conductive material to be used include: carbon, aluminum, vanadium, iron, cobalt, nickel, tungsten, silver, gold, platinum, palladium, and alloys thereof; metal oxides such as tin oxide and indium oxide which are used in an ITO substrate and an NESA substrate; and further, organic conductive resins such as polythiophene and polypyrrole. A conductive substance having a work function of less than 4 eV is suitably used in the cathode. Examples of the conductive substance to be used include, but are not limited to, magnesium, calcium, tin, lead, titanium, yttrium, lithium, ruthenium, manganese, aluminum, lithium fluoride, and alloys thereof. Representative examples of the alloys include, but are not limited to, a magnesium/silver alloy, a magnesium/indium alloy, and a lithium/aluminum alloy. A ratio between the components of the alloy is controlled depending on, for example, the temperature of a deposition source, an atmosphere, and a degree of vacuum, and is selected appropriately. Each of the anode and the cathode may be formed in a layer structure having two or more layers if needed.

It is desirable that at least one surface of the organic EL device of the present invention be sufficiently transparent in the emission wavelength region of the device so that the device may efficiently emit light. A substrate is also desirably transparent. A transparent electrode is formed by using any one of the above-mentioned conductive materials, and is set by a method such as deposition from the vapor or sputtering in such a manner that desired translucency is secured. The light transmittance of an electrode on a light emitting surface is desirably 10% or more. The substrate is not limited as long as it has mechanical strength, thermal strength, and transparency. Examples of the substrate include a glass substrate and a transparent resin film. Examples of the transparent resin film include polyethylene, an ethylene-vinyl acetate copolymer, an ethylene-vinyl alcohol copolymer, polypropylene, polystyrene, polymethyl methacrylate, polyvinyl chloride, polyvinyl alcohol, polyvinyl butyral, nylon, polyether ether ketone, polysulfone, polyether sulfone, a tetrafluoroethylene-perfluoroalkyl vinyl ether copolymer, polyvinyl fluoride, a tetrafluoroethylene-ethylene copolymer, a tetrafluoroethylene-hexafluoropropylene copolymer, polychlorotrifluoroethylene, polyvinylidene fluoride, polyester, polycarbonate, polyurethane, polyimide, polyetherimide, polyimide, and polypropylene.

Any one of dry film forming methods such as vacuum deposition, sputtering, plasma, and ion plating, and wet film forming methods such as spin coating, dipping, and flow coating is applicable to the formation of each layer of the organic EL device according to the present invention. The thickness of each layer is not particularly limited, but must be set to an appropriate thickness. An excessively large thickness requires an increased applied voltage for obtaining certain optical output, resulting in poor efficiency. An excessively small thickness causes a pin hole or the like, with the result that sufficient emission luminance cannot be obtained even when an electric field is applied. In general, the thickness is in the range of preferably 5 nm to 10 µm, or more preferably 10 nm to 0.2 µm.

In the case of a wet film forming method, a material of which each layer is formed is dissolved or dispersed into an appropriate solvent such as ethanol, chloroform, tetrahydrofuran, or dioxane, to thereby form a thin film. At that time, any one of the solvents may be used. In addition, an appropriate resin or additive may be used in each of the organic thin film layers for, for example, improving film formability or preventing a pin hole in the film. Examples of an available resin include: insulating resins such as polystyrene, polycarbonate, polyallylate, polyester, polyamide, polyurethane, polysulfone, polymethyl methacrylate, polymethyl acrylate, and cellulose, and copolymers thereof; photoconductive resins such as poly-N-vinylcarbazole and polysilane; and conductive resins such as polythiophene and polypyrrole. In addition, examples of the additive include an antioxidant, a UV absorber, and a plasticizer.

The organic EL device of the present invention may find use in applications including a flat luminous body such as the flat panel display of a wall hanging television, a light source for the backlight, meters, or the like of a copying machine, a printer, or a liquid crystal display, a display panel, and a signal lamp. In addition, the material of the present invention may be used in not only the field of an organic EL device but also the fields of an electrophotographic photosensitive member, a photoelectric conversion device, a solar cell, an image sensor, and the like.

EXAMPLES

Next, the present invention is described more specifically by way of examples and comparative examples. However, the present invention is not limited to them.

Example 1-1

A glass substrate (manufactured by GEOMATEC Corporation) with an ITO transparent electrode (anode) measuring 25 mm wide by 75 mm long by 1.1 mm thick was subjected to ultrasonic cleaning in isopropyl alcohol for 5 minutes. After that, the substrate was subjected to UV/ozone cleaning for 30 minutes. The glass substrate with the transparent electrode line after the cleaning was mounted on the substrate holder of a vacuum deposition apparatus. First, the following compound A-1 was formed into a film having a thickness of 60 nm on the surface on the side where the transparent electrode line was formed so as to cover the transparent electrode. After that, the following compound A-2 was formed into a film having a thickness of 20 nm on the film formed of the compound A-1.

Further, the host material (anthracene derivative) EM 1-1 and dopant material (diaminopyrene derivative) DM 1-1-2 of the present invention were formed into a film by co-deposition at a weight ratio of 40:2 on the film formed of the compound A-2 so that an organic luminescent medium might be formed. The medium was used as a blue light emitting layer having a thickness of 40 nm.

Alq having the following structure was formed into a film having a thickness of 20 nm by deposition on the blue light emitting layer so as to serve as an electron transporting layer. After that, LiF was formed into a film having a thickness of 1 nm. Metal Al was deposited from the vapor onto the film formed of LiF so as to have a thickness of 150 nm. As a result, a metal cathode was formed. Thus, an organic EL device was produced.

[Chem 78]

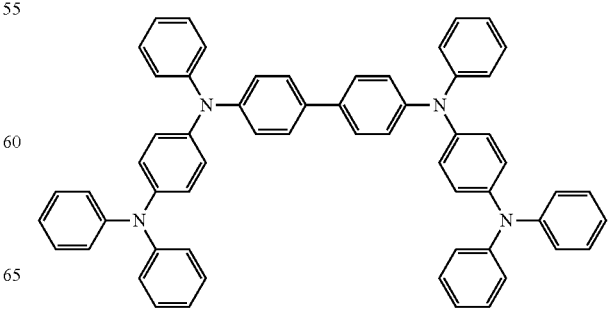

A-1

-continued

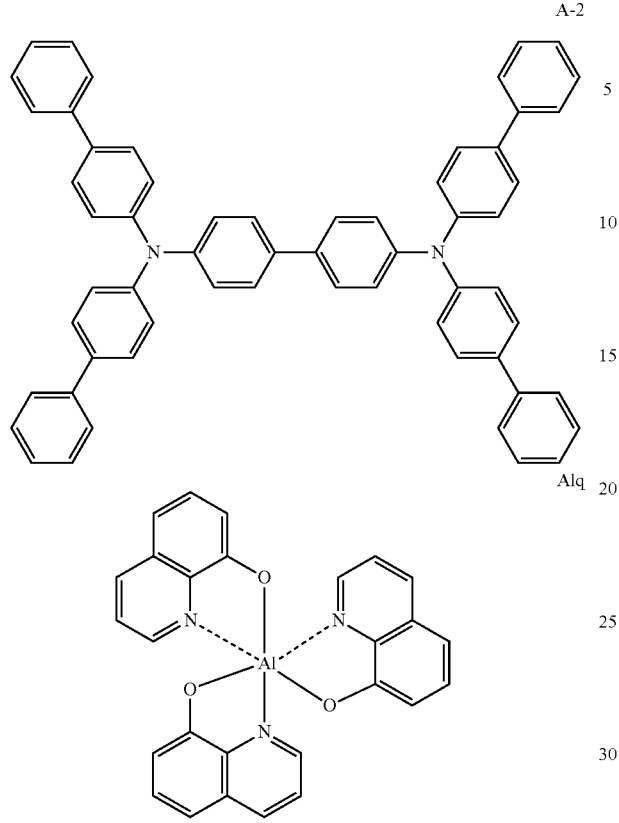

A-2

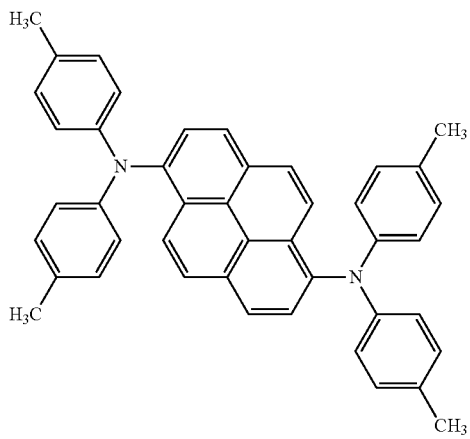

Alq

Examples 1-2 to 1-170

Organic EL devices were each produced in the same manner as in Example 1-1 except that materials shown in any one of Tables 1 to 4 below were used instead of the host material EM 1-1 and the dopant material DM 1-1-2.

Comparative Example 1-1

An organic EL device was produced in the same manner as in Example 1-1 except that: EM 1-74 was used instead of the host material EM 1-1; and a compound 1-A having the following structure was used instead of the dopant material DM 1-1-2.

[Chem 79]

(1-A)

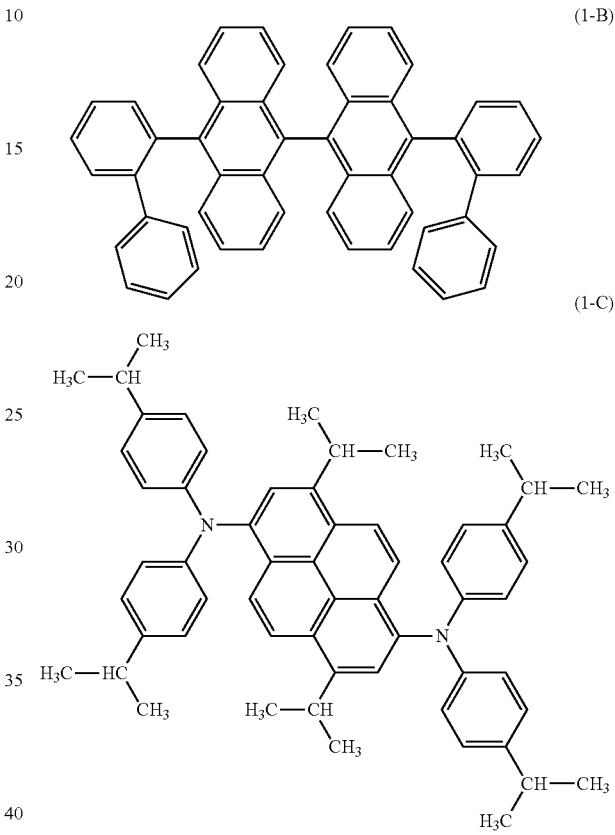

Comparative Example 1-2

An organic EL device was produced in the same manner as in Example 1-1 except that: a compound 1-B having the following structure was used instead of the host material EM 1-1; and a compound 1-C having the following structure was used instead of the dopant material DM 1-1-2.

[Chem 80]

(1-B)

(1-C)

Tables 1 to 4 below show the emission wavelengths of the organic EL devices of the examples and the comparative examples, and the half lifetimes of the devices at an initial luminance of 1000 cd/m$^2$.

TABLE 1

| Example No. | Host material | Dopant material | Emission wavelength (nm) | Half lifetime (hours) |
|---|---|---|---|---|
| 1-1 | EM 1-1 | DM 1-1-2 | 468 | 7000 |
| 1-2 | EM 1-2 | DM 1-1-2 | 469 | 7000 |
| 1-3 | EM 1-9 | DM 1-1-2 | 468 | 7000 |
| 1-4 | EM 1-11 | DM 1-1-2 | 468 | 9000 |
| 1-5 | EM 1-13 | DM 1-1-2 | 468 | 9000 |
| 1-6 | EM 1-14 | DM 1-1-2 | 468 | 9000 |
| 1-7 | EM 1-25 | DM 1-1-2 | 468 | 9000 |
| 1-8 | EM 1-26 | DM 1-1-2 | 468 | 9000 |
| 1-9 | EM 1-28 | DM 1-1-2 | 468 | 9000 |
| 1-10 | EM 1-29 | DM 1-1-2 | 468 | 9000 |
| 1-11 | EM 1-31 | DM 1-1-2 | 468 | 9000 |
| 1-12 | EM 1-32 | DM 1-1-2 | 468 | 9000 |
| 1-13 | EM 1-56 | DM 1-1-2 | 468 | 9000 |
| 1-14 | EM 1-59 | DM 1-1-2 | 468 | 9000 |
| 1-15 | EM 1-62 | DM 1-1-2 | 468 | 9000 |
| 1-16 | EM 1-66 | DM 1-1-2 | 469 | 10,000 |
| 1-17 | EM 1-67 | DM 1-1-2 | 469 | 10,000 |
| 1-18 | EM 1-69 | DM 1-1-2 | 469 | 10,000 |
| 1-19 | EM 1-70 | DM 1-1-2 | 469 | 10,000 |

TABLE 1-continued

| Example No. | Host material | Dopant material | Emission wavelength (nm) | Half lifetime (hours) |
|---|---|---|---|---|
| 1-20 | EM 1-73 | DM 1-1-2 | 469 | 10,000 |
| 1-21 | EM 1-74 | DM 1-1-2 | 469 | 10,000 |
| 1-22 | EM 1-75 | DM 1-1-2 | 469 | 10,000 |
| 1-23 | EM 1-76 | DM 1-1-2 | 469 | 10,000 |
| 1-24 | EM 1-116 | DM 1-1-2 | 467 | 9000 |
| 1-25 | EM 1-117 | DM 1-1-2 | 467 | 9000 |
| 1-26 | EM 1-119 | DM 1-1-2 | 467 | 9000 |
| 1-27 | EM 1-120 | DM 1-1-2 | 467 | 9000 |
| 1-28 | EM 1-128 | DM 1-1-2 | 467 | 9000 |
| 1-29 | EM 1-130 | DM 1-1-2 | 467 | 9000 |
| 1-30 | EM 1-132 | DM 1-1-2 | 467 | 9000 |
| 1-31 | EM 1-133 | DM 1-1-2 | 467 | 9000 |
| 1-32 | EM 1-134 | DM 1-1-2 | 467 | 9000 |
| 1-33 | EM 1-135 | DM 1-1-2 | 467 | 9000 |
| 1-34 | EM 1-137 | DM 1-1-2 | 467 | 9000 |
| 1-35 | EM 1-1 | DM 1-1-3 | 469 | 8000 |
| 1-36 | EM 1-2 | DM 1-1-3 | 470 | 8000 |
| 1-37 | EM 1-9 | DM 1-1-3 | 469 | 8000 |
| 1-38 | EM 1-11 | DM 1-1-3 | 469 | 10,000 |
| 1-39 | EM 1-13 | DM 1-1-3 | 469 | 10,000 |
| 1-40 | EM 1-14 | DM 1-1-3 | 469 | 10,000 |
| 1-41 | EM 1-25 | DM 1-1-3 | 469 | 10,000 |
| 1-42 | EM 1-26 | DM 1-1-3 | 469 | 10,000 |
| 1-43 | EM 1-28 | DM 1-1-3 | 469 | 10,000 |
| 1-44 | EM 1-29 | DM 1-1-3 | 469 | 10,000 |
| 1-45 | EM 1-31 | DM 1-1-3 | 469 | 10,000 |
| 1-46 | EM 1-32 | DM 1-1-3 | 469 | 10,000 |
| 1-47 | EM 1-56 | DM 1-1-3 | 469 | 10,000 |
| 1-48 | EM 1-59 | DM 1-1-3 | 469 | 10,000 |
| 1-49 | EM 1-62 | DM 1-1-3 | 469 | 10,000 |
| 1-50 | EM 1-66 | DM 1-1-3 | 470 | 11,000 |

TABLE 2

| Example No. | Host material | Dopant material | Emission wavelength (nm) | Half lifetime (hours) |
|---|---|---|---|---|
| 1-51 | EM 1-67 | DM 1-1-3 | 470 | 11,000 |
| 1-52 | EM 1-69 | DM 1-1-3 | 470 | 11,000 |
| 1-53 | EM 1-70 | DM 1-1-3 | 470 | 11,000 |
| 1-54 | EM 1-73 | DM 1-1-3 | 470 | 11,000 |
| 1-55 | EM 1-74 | DM 1-1-3 | 470 | 11,000 |
| 1-56 | EM 1-75 | DM 1-1-3 | 470 | 11,000 |
| 1-57 | EM 1-76 | DM 1-1-3 | 470 | 11,000 |
| 1-58 | EM 1-116 | DM 1-1-3 | 468 | 10,000 |
| 1-59 | EM 1-117 | DM 1-1-3 | 468 | 10,000 |
| 1-60 | EM 1-119 | DM 1-1-3 | 468 | 10,000 |
| 1-61 | EM 1-120 | DM 1-1-3 | 468 | 10,000 |
| 1-62 | EM 1-128 | DM 1-1-3 | 468 | 10,000 |
| 1-63 | EM 1-130 | DM 1-1-3 | 468 | 10,000 |
| 1-64 | EM 1-132 | DM 1-1-3 | 468 | 10,000 |
| 1-65 | EM 1-133 | DM 1-1-3 | 468 | 10,000 |
| 1-66 | EM 1-134 | DM 1-1-3 | 468 | 10,000 |
| 1-67 | EM 1-135 | DM 1-1-3 | 468 | 10,000 |
| 1-68 | EM 1-137 | DM 1-1-3 | 468 | 10,000 |
| 1-69 | EM 1-1 | DM 1-1-4 | 470 | 8500 |
| 1-70 | EM 1-2 | DM 1-1-4 | 471 | 8500 |
| 1-71 | EM 1-9 | DM 1-1-4 | 470 | 8500 |
| 1-72 | EM 1-11 | DM 1-1-4 | 470 | 12,000 |
| 1-73 | EM 1-13 | DM 1-1-4 | 470 | 12,000 |
| 1-74 | EM 1-14 | DM 1-1-4 | 470 | 12,000 |
| 1-75 | EM 1-25 | DM 1-1-4 | 470 | 12,000 |
| 1-76 | EM 1-26 | DM 1-1-4 | 470 | 12,000 |
| 1-77 | EM 1-28 | DM 1-1-4 | 470 | 12,000 |
| 1-78 | EM 1-29 | DM 1-1-4 | 470 | 12,000 |
| 1-79 | EM 1-31 | DM 1-1-4 | 470 | 12,000 |
| 1-80 | EM 1-32 | DM 1-1-4 | 470 | 12,000 |
| 1-81 | EM 1-56 | DM 1-1-4 | 470 | 12,000 |
| 1-82 | EM 1-59 | DM 1-1-4 | 470 | 12,000 |
| 1-83 | EM 1-62 | DM 1-1-4 | 470 | 12,000 |
| 1-84 | EM 1-66 | DM 1-1-4 | 471 | 13,000 |
| 1-85 | EM 1-67 | DM 1-1-4 | 471 | 13,000 |

TABLE 2-continued

| Example No. | Host material | Dopant material | Emission wavelength (nm) | Half lifetime (hours) |
|---|---|---|---|---|
| 1-86 | EM 1-69 | DM 1-1-4 | 471 | 13,000 |
| 1-87 | EM 1-70 | DM 1-1-4 | 471 | 13,000 |
| 1-88 | EM 1-73 | DM 1-1-4 | 471 | 13,000 |
| 1-89 | EM 1-74 | DM 1-1-4 | 471 | 13,000 |
| 1-90 | EM 1-75 | DM 1-1-4 | 471 | 13,000 |
| 1-91 | EM 1-76 | DM 1-1-4 | 471 | 13,000 |
| 1-92 | EM 1-116 | DM 1-1-4 | 469 | 12,000 |
| 1-93 | EM 1-117 | DM 1-1-4 | 469 | 12,000 |
| 1-94 | EM 1-119 | DM 1-1-4 | 469 | 12,000 |
| 1-95 | EM 1-120 | DM 1-1-4 | 469 | 12,000 |
| 1-96 | EM 1-128 | DM 1-1-4 | 469 | 12,000 |
| 1-97 | EM 1-130 | DM 1-1-4 | 469 | 12,000 |
| 1-98 | EM 1-132 | DM 1-1-4 | 469 | 12,000 |
| 1-99 | EM 1-133 | DM 1-1-4 | 469 | 12,000 |
| 1-100 | EM 1-134 | DM 1-1-4 | 469 | 12,000 |

TABLE 3

| Example No. | Host material | Dopant material | Emission wavelength (nm) | Half lifetime (hours) |
|---|---|---|---|---|
| 1-101 | EM 1-135 | DM 1-1-4 | 469 | 12,000 |
| 1-102 | EM 1-137 | DM 1-1-4 | 469 | 12,000 |
| 1-103 | EM 1-1 | DM 1-1-5 | 470 | 8500 |
| 1-104 | EM 1-2 | DM 1-1-5 | 471 | 8500 |
| 1-105 | EM 1-9 | DM 1-1-5 | 470 | 8500 |
| 1-106 | EM 1-11 | DM 1-1-5 | 470 | 13,000 |
| 1-107 | EM 1-13 | DM 1-1-5 | 470 | 13,000 |
| 1-108 | EM 1-14 | DM 1-1-5 | 470 | 13,000 |
| 1-109 | EM 1-25 | DM 1-1-5 | 470 | 13,000 |
| 1-110 | EM 1-26 | DM 1-1-5 | 470 | 13,000 |
| 1-111 | EM 1-28 | DM 1-1-5 | 470 | 13,000 |
| 1-112 | EM 1-29 | DM 1-1-5 | 470 | 13,000 |
| 1-113 | EM 1-31 | DM 1-1-5 | 470 | 13,000 |
| 1-114 | EM 1-32 | DM 1-1-5 | 470 | 13,000 |
| 1-115 | EM 1-56 | DM 1-1-5 | 470 | 13,000 |
| 1-116 | EM 1-59 | DM 1-1-5 | 470 | 13,000 |
| 1-117 | EM 1-62 | DM 1-1-5 | 470 | 13,000 |
| 1-118 | EM 1-66 | DM 1-1-5 | 471 | 14,000 |
| 1-119 | EM 1-67 | DM 1-1-5 | 471 | 14,000 |
| 1-120 | EM 1-69 | DM 1-1-5 | 471 | 14,000 |
| 1-121 | EM 1-70 | DM 1-1-5 | 471 | 14,000 |
| 1-122 | EM 1-73 | DM 1-1-5 | 471 | 14,000 |
| 1-123 | EM 1-74 | DM 1-1-5 | 471 | 14,000 |
| 1-124 | EM 1-75 | DM 1-1-5 | 471 | 14,000 |
| 1-125 | EM 1-76 | DM 1-1-5 | 471 | 14,000 |
| 1-126 | EM 1-116 | DM 1-1-5 | 469 | 13,000 |
| 1-127 | EM 1-117 | DM 1-1-5 | 469 | 13,000 |
| 1-128 | EM 1-119 | DM 1-1-5 | 469 | 13,000 |
| 1-129 | EM 1-120 | DM 1-1-5 | 469 | 13,000 |
| 1-130 | EM 1-128 | DM 1-1-5 | 469 | 13,000 |
| 1-131 | EM 1-130 | DM 1-1-5 | 469 | 13,000 |
| 1-132 | EM 1-132 | DM 1-1-5 | 469 | 13,000 |
| 1-133 | EM 1-133 | DM 1-1-5 | 469 | 13,000 |
| 1-134 | EM 1-134 | DM 1-1-5 | 469 | 13,000 |
| 1-135 | EM 1-135 | DM 1-1-5 | 469 | 13,000 |
| 1-136 | EM 1-137 | DM 1-1-5 | 469 | 13,000 |
| 1-137 | EM 1-1 | DM 1-1-6 | 470 | 8500 |
| 1-138 | EM 1-2 | DM 1-1-6 | 471 | 8500 |
| 1-139 | EM 1-9 | DM 1-1-6 | 470 | 8500 |
| 1-140 | EM 1-11 | DM 1-1-6 | 470 | 12,000 |
| 1-141 | EM 1-13 | DM 1-1-6 | 470 | 12,000 |
| 1-142 | EM 1-14 | DM 1-1-6 | 470 | 12,000 |
| 1-143 | EM 1-25 | DM 1-1-6 | 470 | 12,000 |
| 1-144 | EM 1-26 | DM 1-1-6 | 470 | 12,000 |
| 1-145 | EM 1-28 | DM 1-1-6 | 470 | 12,000 |
| 1-146 | EM 1-29 | DM 1-1-6 | 470 | 12,000 |
| 1-147 | EM 1-31 | DM 1-1-6 | 470 | 12,000 |
| 1-148 | EM 1-32 | DM 1-1-6 | 470 | 12,000 |
| 1-149 | EM 1-56 | DM 1-1-6 | 470 | 12,000 |
| 1-150 | EM 1-59 | DM 1-1-6 | 470 | 12,000 |

TABLE 4

| Example No. | Host material | Dopant material | Emission wavelength (nm) | Half lifetime (hours) |
|---|---|---|---|---|
| 1-151 | EM 1-62 | DM 1-1-6 | 470 | 12,000 |
| 1-152 | EM 1-66 | DM 1-1-6 | 471 | 13,000 |
| 1-153 | EM 1-67 | DM 1-1-6 | 471 | 13,000 |
| 1-154 | EM 1-69 | DM 1-1-6 | 471 | 13,000 |
| 1-155 | EM 1-70 | DM 1-1-6 | 471 | 13,000 |
| 1-156 | EM 1-73 | DM 1-1-6 | 471 | 13,000 |
| 1-157 | EM 1-74 | DM 1-1-6 | 471 | 13,000 |
| 1-158 | EM 1-75 | DM 1-1-6 | 471 | 13,000 |
| 1-159 | EM 1-76 | DM 1-1-6 | 471 | 13,000 |
| 1-160 | EM 1-116 | DM 1-1-6 | 469 | 12,000 |
| 1-161 | EM 1-117 | DM 1-1-6 | 469 | 12,000 |
| 1-162 | EM 1-119 | DM 1-1-6 | 469 | 12,000 |
| 1-163 | EM 1-120 | DM 1-1-6 | 469 | 12,000 |
| 1-164 | EM 1-128 | DM 1-1-6 | 469 | 12,000 |
| 1-165 | EM 1-130 | DM 1-1-6 | 469 | 12,000 |
| 1-166 | EM 1-132 | DM 1-1-6 | 469 | 12,000 |
| 1-167 | EM 1-133 | DM 1-1-6 | 469 | 12,000 |
| 1-168 | EM 1-134 | DM 1-1-6 | 469 | 12,000 |
| 1-169 | EM 1-135 | DM 1-1-6 | 469 | 12,000 |
| 1-170 | EM 1-137 | DM 1-1-6 | 469 | 12,000 |
| Comparative Example 1-1 | EM 1-74 | Compound 1-A | 477 | 4100 |
| Comparative Example 1-2 | Compound 1-B | Compound 1-C | 477 | 3200 |

Example 2-1

A glass substrate (manufactured by GEOMATEC Corporation) with an ITO transparent electrode (anode) measuring 25 mm wide by 75 mm long by 1.1 mm thick was subjected to ultrasonic cleaning in isopropyl alcohol for 5 minutes. After that, the substrate was subjected to UV/ozone cleaning for 30 minutes. The glass substrate with the transparent electrode line after the cleaning was mounted on the substrate holder of a vacuum deposition apparatus. First, the compound A-1 was formed into a film having a thickness of 60 nm on the surface on the side where the transparent electrode line was formed so as to cover the transparent electrode. Subsequent to the formation of the A-1 film, the compound A-2 was formed into a film having a thickness of 20 nm on the A-1 film. Further, the host material EM 2-1 and dopant material DM 2-1-4 of the present invention were formed into a film by co-deposition at a weight ratio of 40:2 on the A-2 film. Thus, a blue light emitting layer having a thickness of 40 nm was obtained.

[Chem 81]

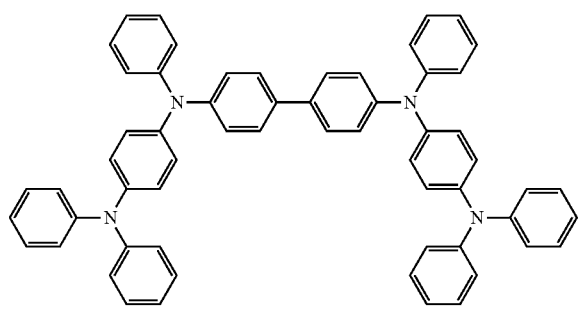

A-1

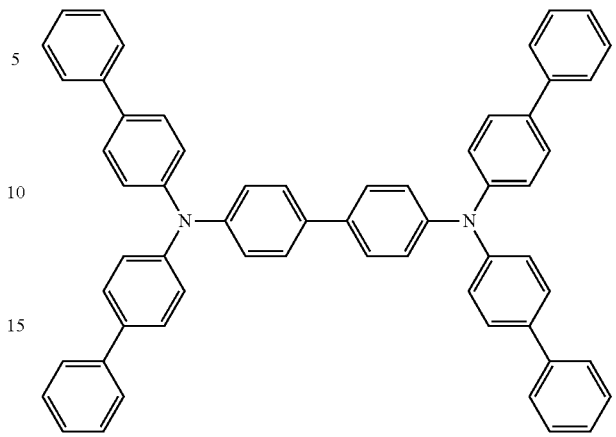

A-2

Alq having the following structure was formed into a film having a thickness of 20 nm by deposition on the film so as to serve as an electron transporting layer. After that, LiF was formed into a film having a thickness of 1 nm. Metal Al was deposited from the vapor onto the LiF film so as to have a thickness of 150 nm. As a result, a metal cathode was formed. Thus, an organic EL device was formed.

[Chem 82]

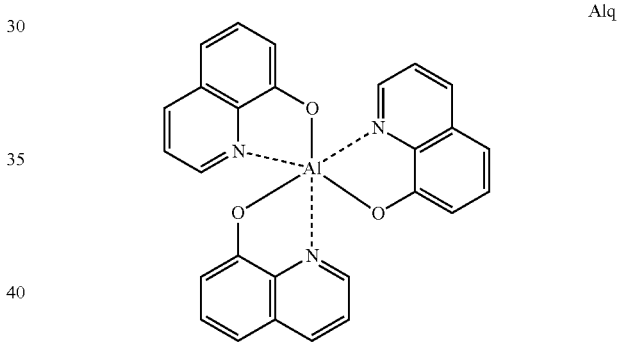

Alq

Examples 2-2 to 2-156

Organic EL devices were each produced in the same manner as in Example 2-1 except that a host material and a dopant material shown in Table 1 were used instead of the host material EM 2-1 and the dopant material DM 2-1-4.

Comparative Example 2-1

An organic EL device was produced in the same manner as in Example 1 except that: the following compound 2-A was used instead of the host material EM 2-1; and the following compound 2-B was used instead of the dopant material DM 2-1-4.

[Chem 83]

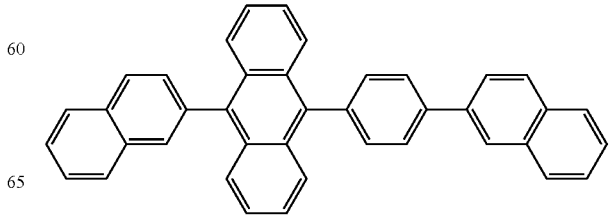

Compound 2-A

-continued

Compound 2-B

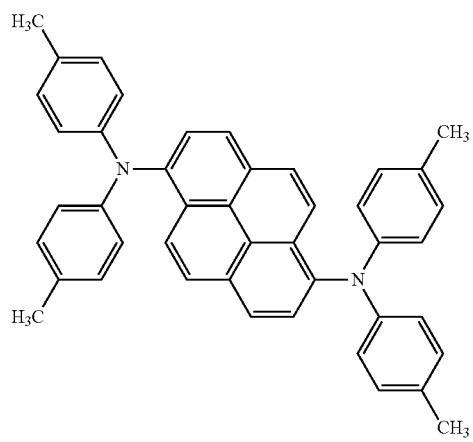

Comparative Example 2-2

An organic EL device was produced in the same manner as in Example 2-1 except that: the following compound 2-C was used instead of the host material EM 2-1; and the following compound 2-D was used instead of the dopant material DM 2-1-4.

[Chem 84]

Compound 2-C

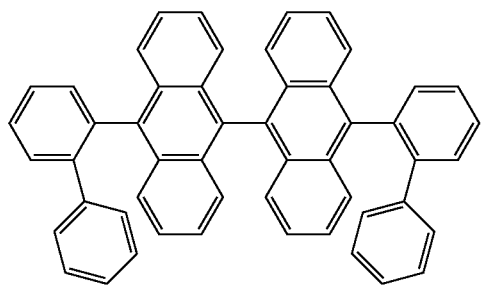

Compound 2-D

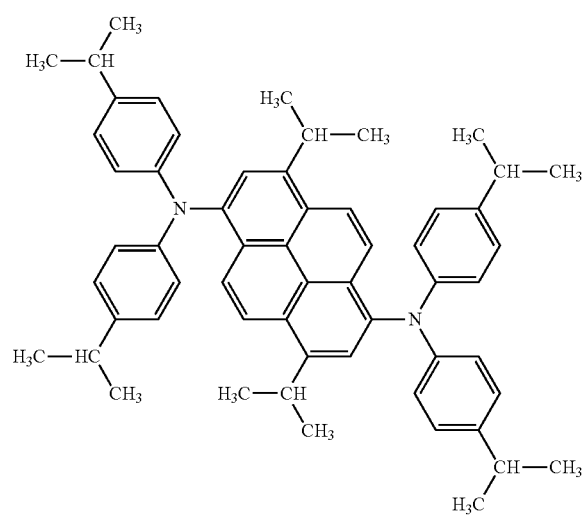

Tables 5 to 8 show the emission wavelengths of the organic EL devices and the half lifetimes of the devices at an initial luminance of 1000 cd/m².

TABLE 5

| Example No. | Host material | Dopant material | Emission wavelength (nm) | Half lifetime (hours) |
|---|---|---|---|---|
| 2-1 | EM 2-1 | DM 2-1-4 | 472 | 10,000 |
| 2-2 | EM 2-2 | DM 2-1-4 | 471 | 10,000 |
| 2-3 | EM 2-9 | DM 2-1-4 | 472 | 10,000 |
| 2-4 | EM 2-11 | DM 2-1-4 | 471 | 12,000 |
| 2-5 | EM 2-13 | DM 2-1-4 | 471 | 12,000 |
| 2-6 | EM 2-14 | DM 2-1-4 | 471 | 12,000 |
| 2-7 | EM 2-25 | DM 2-1-4 | 471 | 12,000 |
| 2-8 | EM 2-26 | DM 2-1-4 | 471 | 12,000 |
| 2-9 | EM 2-28 | DM 2-1-4 | 471 | 12,000 |
| 2-10 | EM 2-29 | DM 2-1-4 | 471 | 12,000 |
| 2-11 | EM 2-31 | DM 2-1-4 | 471 | 12,000 |
| 2-12 | EM 2-32 | DM 2-1-4 | 471 | 12,000 |
| 2-13 | EM 2-56 | DM 2-1-4 | 471 | 12,000 |
| 2-14 | EM 2-59 | DM 2-1-4 | 471 | 12,000 |
| 2-15 | EM 2-62 | DM 2-1-4 | 471 | 12,000 |
| 2-16 | EM 2-116 | DM 2-1-4 | 472 | 11,000 |
| 2-17 | EM 2-117 | DM 2-1-4 | 472 | 11,000 |
| 2-18 | EM 2-119 | DM 2-1-4 | 472 | 11,000 |
| 2-19 | EM 2-120 | DM 2-1-4 | 472 | 11,000 |
| 2-20 | EM 2-128 | DM 2-1-4 | 472 | 12,000 |
| 2-21 | EM 2-130 | DM 2-1-4 | 472 | 12,000 |
| 2-22 | EM 2-132 | DM 2-1-4 | 472 | 12,000 |
| 2-23 | EM 2-133 | DM 2-1-4 | 472 | 12,000 |
| 2-24 | EM 2-134 | DM 2-1-4 | 472 | 12,000 |
| 2-25 | EM 2-135 | DM 2-1-4 | 472 | 12,000 |
| 2-26 | EM 2-137 | DM 2-1-4 | 472 | 12,000 |
| 2-27 | EM 2-1 | DM 2-1-8 | 470 | 9000 |
| 2-28 | EM 2-2 | DM 2-1-8 | 469 | 9000 |
| 2-29 | EM 2-9 | DM 2-1-8 | 470 | 9000 |
| 2-30 | EM 2-11 | DM 2-1-8 | 469 | 11,000 |
| 2-31 | EM 2-13 | DM 2-1-8 | 469 | 11,000 |
| 2-32 | EM 2-14 | DM 2-1-8 | 469 | 11,000 |
| 2-33 | EM 2-25 | DM 2-1-8 | 469 | 11,000 |
| 2-34 | EM 2-26 | DM 2-1-8 | 469 | 11,000 |
| 2-35 | EM 2-28 | DM 2-1-8 | 469 | 11,000 |
| 2-36 | EM 2-29 | DM 2-1-8 | 469 | 11,000 |
| 2-37 | EM 2-31 | DM 2-1-8 | 469 | 11,000 |
| 2-38 | EM 2-32 | DM 2-1-8 | 469 | 11,000 |
| 2-39 | EM 2-56 | DM 2-1-8 | 469 | 11,000 |
| 2-40 | EM 2-59 | DM 2-1-8 | 469 | 11,000 |

TABLE 6

| Example No. | Host material | Dopant material | Emission wavelength (nm) | Half lifetime (hours) |
|---|---|---|---|---|
| 2-41 | EM 2-62 | DM 2-1-8 | 469 | 11,000 |
| 2-42 | EM 2-116 | DM 2-1-8 | 470 | 10,000 |
| 2-43 | EM 2-117 | DM 2-1-8 | 470 | 10,000 |
| 2-44 | EM 2-119 | DM 2-1-8 | 470 | 10,000 |
| 2-45 | EM 2-120 | DM 2-1-8 | 470 | 10,000 |
| 2-46 | EM 2-128 | DM 2-1-8 | 470 | 11,000 |
| 2-47 | EM 2-130 | DM 2-1-8 | 470 | 11,000 |
| 2-48 | EM 2-132 | DM 2-1-8 | 470 | 11,000 |
| 2-49 | EM 2-133 | DM 2-1-8 | 470 | 11,000 |
| 2-50 | EM 2-134 | DM 2-1-8 | 470 | 11,000 |
| 2-51 | EM 2-135 | DM 2-1-8 | 470 | 11,000 |
| 2-52 | EM 2-137 | DM 2-1-8 | 470 | 11,000 |
| 2-53 | EM 2-1 | DM 2-2-3 | 471 | 9000 |
| 2-54 | EM 2-2 | DM 2-2-3 | 470 | 9000 |
| 2-55 | EM 2-9 | DM 2-2-3 | 471 | 9000 |
| 2-56 | EM 2-11 | DM 2-2-3 | 470 | 11,000 |
| 2-57 | EM 2-13 | DM 2-2-3 | 470 | 11,000 |
| 2-58 | EM 2-14 | DM 2-2-3 | 470 | 11,000 |
| 2-59 | EM 2-25 | DM 2-2-3 | 470 | 11,000 |
| 2-60 | EM 2-26 | DM 2-2-3 | 470 | 11,000 |
| 2-61 | EM 2-28 | DM 2-2-3 | 470 | 11,000 |
| 2-62 | EM 2-29 | DM 2-2-3 | 470 | 11,000 |

TABLE 6-continued

| Example No. | Host material | Dopant material | Emission wavelength (nm) | Half lifetime (hours) |
|---|---|---|---|---|
| 2-63 | EM 2-31 | DM 2-2-3 | 470 | 11,000 |
| 2-64 | EM 2-32 | DM 2-2-3 | 470 | 11,000 |
| 2-65 | EM 2-56 | DM 2-2-3 | 470 | 11,000 |
| 2-66 | EM 2-59 | DM 2-2-3 | 470 | 11,000 |
| 2-67 | EM 2-62 | DM 2-2-3 | 470 | 11,000 |
| 2-68 | EM 2-116 | DM 2-2-3 | 471 | 10,000 |
| 2-69 | EM 2-117 | DM 2-2-3 | 471 | 10,000 |
| 2-70 | EM 2-119 | DM 2-2-3 | 471 | 10,000 |
| 2-71 | EM 2-120 | DM 2-2-3 | 471 | 10,000 |
| 2-72 | EM 2-128 | DM 2-2-3 | 471 | 11,000 |
| 2-73 | EM 2-130 | DM 2-2-3 | 471 | 11,000 |
| 2-74 | EM 2-132 | DM 2-2-3 | 471 | 11,000 |
| 2-75 | EM 2-133 | DM 2-2-3 | 471 | 11,000 |
| 2-76 | EM 2-134 | DM 2-2-3 | 471 | 11,000 |
| 2-77 | EM 2-135 | DM 2-2-3 | 471 | 11,000 |
| 2-78 | EM 2-137 | DM 2-2-3 | 471 | 11,000 |
| 2-79 | EM 2-1 | DM 2-2-4 | 471 | 9000 |
| 2-80 | EM 2-2 | DM 2-2-4 | 470 | 9000 |

TABLE 7

| Example No. | Host material | Dopant material | Emission wavelength (nm) | Half lifetime (hours) |
|---|---|---|---|---|
| 2-81 | EM 2-9 | DM 2-2-4 | 471 | 9000 |
| 2-82 | EM 2-11 | DM 2-2-4 | 470 | 11,000 |
| 2-83 | EM 2-13 | DM 2-2-4 | 470 | 11,000 |
| 2-84 | EM 2-14 | DM 2-2-4 | 470 | 11,000 |
| 2-85 | EM 2-25 | DM 2-2-4 | 470 | 11,000 |
| 2-86 | EM 2-26 | DM 2-2-4 | 470 | 11,000 |
| 2-87 | EM 2-28 | DM 2-2-4 | 470 | 11,000 |
| 2-88 | EM 2-29 | DM 2-2-4 | 470 | 11,000 |
| 2-89 | EM 2-31 | DM 2-2-4 | 470 | 11,000 |
| 2-90 | EM 2-32 | DM 2-2-4 | 470 | 11,000 |
| 2-91 | EM 2-56 | DM 2-2-4 | 470 | 11,000 |
| 2-92 | EM 2-59 | DM 2-2-4 | 470 | 11,000 |
| 2-93 | EM 2-62 | DM 2-2-4 | 470 | 11,000 |
| 2-94 | EM 2-116 | DM 2-2-4 | 471 | 10,000 |
| 2-95 | EM 2-117 | DM 2-2-4 | 471 | 10,000 |
| 2-96 | EM 2-119 | DM 2-2-4 | 471 | 10,000 |
| 2-97 | EM 2-120 | DM 2-2-4 | 471 | 10,000 |
| 2-98 | EM 2-128 | DM 2-2-4 | 471 | 11,000 |
| 2-99 | EM 2-130 | DM 2-2-4 | 471 | 11,000 |
| 2-100 | EM 2-132 | DM 2-2-4 | 471 | 11,000 |
| 2-101 | EM 2-133 | DM 2-2-4 | 471 | 11,000 |
| 2-102 | EM 2-134 | DM 2-2-4 | 471 | 11,000 |
| 2-103 | EM 2-135 | DM 2-2-4 | 471 | 11,000 |
| 2-104 | EM 2-137 | DM 2-2-4 | 471 | 11,000 |
| 2-105 | EM 2-1 | DM 2-2-5 | 473 | 10,000 |
| 2-106 | EM 2-2 | DM 2-2-5 | 472 | 10,000 |
| 2-107 | EM 2-9 | DM 2-2-5 | 473 | 10,000 |
| 2-108 | EM 2-11 | DM 2-2-5 | 472 | 12,000 |
| 2-109 | EM 2-13 | DM 2-2-5 | 472 | 12,000 |
| 2-110 | EM 2-14 | DM 2-2-5 | 472 | 12,000 |
| 2-111 | EM 2-25 | DM 2-2-5 | 472 | 12,000 |
| 2-112 | EM 2-26 | DM 2-2-5 | 472 | 12,000 |
| 2-113 | EM 2-28 | DM 2-2-5 | 472 | 12,000 |
| 2-114 | EM 2-29 | DM 2-2-5 | 472 | 12,000 |
| 2-115 | EM 2-31 | DM 2-2-5 | 472 | 12,000 |
| 2-116 | EM 2-32 | DM 2-2-5 | 472 | 12,000 |
| 2-117 | EM 2-56 | DM 2-2-5 | 472 | 12,000 |
| 2-118 | EM 2-59 | DM 2-2-5 | 472 | 12,000 |
| 2-119 | EM 2-62 | DM 2-2-5 | 472 | 12,000 |
| 2-120 | EM 2-116 | DM 2-2-5 | 473 | 11,000 |

TABLE 8

| Example No. | Host material | Dopant material | Emission wavelength (nm) | Half lifetime (hours) |
|---|---|---|---|---|
| 2-121 | EM 2-117 | DM 2-2-5 | 473 | 11,000 |
| 2-122 | EM 2-119 | DM 2-2-5 | 473 | 11,000 |
| 2-123 | EM 2-120 | DM 2-2-5 | 473 | 11,000 |
| 2-124 | EM 2-128 | DM 2-2-5 | 473 | 12,000 |
| 2-125 | EM 2-130 | DM 2-2-5 | 473 | 12,000 |
| 2-126 | EM 2-132 | DM 2-2-5 | 473 | 12,000 |
| 2-127 | EM 2-133 | DM 2-2-5 | 473 | 12,000 |
| 2-128 | EM 2-134 | DM 2-2-5 | 473 | 12,000 |
| 2-129 | EM 2-135 | DM 2-2-5 | 473 | 12,000 |
| 2-130 | EM 2-137 | DM 2-2-5 | 473 | 12,000 |
| 2-131 | EM 2-1 | DM 2-4-9 | 472 | 10,000 |
| 2-132 | EM 2-2 | DM 2-4-9 | 471 | 10,000 |
| 2-133 | EM 2-9 | DM 2-4-9 | 472 | 10,000 |
| 2-134 | EM 2-11 | DM 2-4-9 | 471 | 12,000 |
| 2-135 | EM 2-13 | DM 2-4-9 | 471 | 12,000 |
| 2-136 | EM 2-14 | DM 2-4-9 | 471 | 12,000 |
| 2-137 | EM 2-25 | DM 2-4-9 | 471 | 12,000 |
| 2-138 | EM 2-26 | DM 2-4-9 | 471 | 12,000 |
| 2-139 | EM 2-28 | DM 2-4-9 | 471 | 12,000 |
| 2-140 | EM 2-29 | DM 2-4-9 | 471 | 12,000 |
| 2-141 | EM 2-31 | DM 2-4-9 | 471 | 12,000 |
| 2-142 | EM 2-32 | DM 2-4-9 | 471 | 12,000 |
| 2-143 | EM 2-56 | DM 2-4-9 | 471 | 12,000 |
| 2-144 | EM 2-59 | DM 2-4-9 | 471 | 12,000 |
| 2-145 | EM 2-62 | DM 2-4-9 | 471 | 12,000 |
| 2-146 | EM 2-116 | DM 2-4-9 | 472 | 11,000 |
| 2-147 | EM 2-117 | DM 2-4-9 | 472 | 11,000 |
| 2-148 | EM 2-119 | DM 2-4-9 | 472 | 11,000 |
| 2-149 | EM 2-120 | DM 2-4-9 | 472 | 11,000 |
| 2-150 | EM 2-128 | DM 2-4-9 | 472 | 12,000 |
| 2-151 | EM 2-130 | DM 2-4-9 | 472 | 12,000 |
| 2-152 | EM 2-132 | DM 2-4-9 | 472 | 12,000 |
| 2-153 | EM 2-133 | DM 2-4-9 | 472 | 12,000 |
| 2-154 | EM 2-134 | DM 2-4-9 | 472 | 12,000 |
| 2-155 | EM 2-135 | DM 2-4-9 | 472 | 12,000 |
| 2-156 | EM 2-137 | DM 2-4-9 | 472 | 12,000 |
| Comparative Example 2-1 | Compound 2-A | Compound 2-B | 477 | 4100 |
| Comparative Example 2-2 | Compound 2-C | Compound 2-D | 477 | 3200 |

INDUSTRIAL APPLICABILITY

An organic EL device using the organic luminescent medium of the present invention is useful as a light source such as a flat luminous body for a wall hanging television or the backlight of a display.

The invention claimed is:
1. An organic luminescent medium, comprising:
a diaminopyrene derivative represented by formula (1-1)

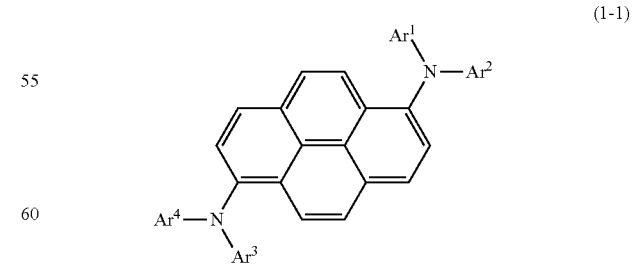

wherein $Ar^1$ to $Ar^4$ each independently represent a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, or a substituted or unsubstituted heterocyclic group having 5 to 50 ring atoms, provided that one or more of Ar¹ to Ar4 each represent an α-naphthyl group; and an anthracene derivative represented by the following formula (1-2):

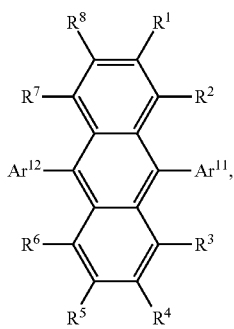

(1-2)

wherein Ar¹¹ and Ar¹² each independently represent a substituted or unsubstituted aryl group having 6 to 20 ring carbon atoms, and R¹ to R⁸ each independently represent a group selected from the group consisting of a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group; a halogen atom, a cyano group, a nitro group, and a hydroxyl group.

2. The organic luminescent medium according to claim 1, wherein the diaminopyrene derivative is represented by formula (1-1A):

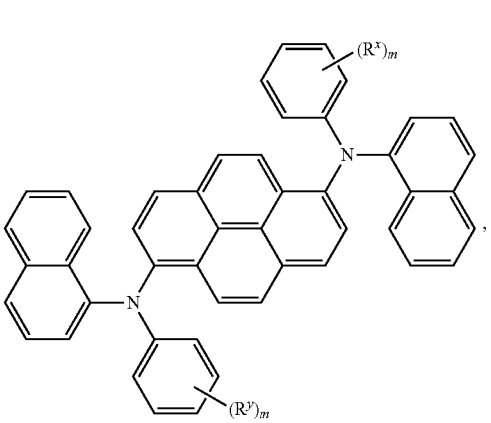

(1-1A)

wherein
R$^x$ and R$^y$ each independently represent an alkyl group having 1 to 5 carbon atoms, and
m represents an integer of 1 to 5.

3. The organic luminescent medium according to claim 2, wherein the diaminopyrene derivative is represented by formula (1-1 a):

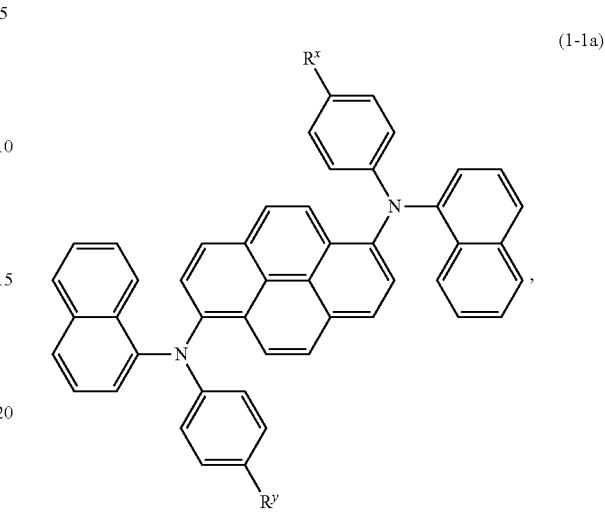

(1-1a)

wherein R$^x$ and R$^y$ each independently represent an alkyl group having 1 to 5 carbon atoms.

4. The organic luminescent medium according to claim 1, wherein Ar¹¹ and Ar¹² in formula (1-2) each independently represent a substituted or unsubstituted, fused aryl group having 10 to 20 ring carbon atoms.

5. The organic luminescent medium according to claim 4, wherein Ar¹¹ and Ar¹² in the formula (1-2) represent the same group.

6. The organic luminescent medium according to claim 5, wherein Ar¹¹ and Ar¹² in the formula (1-2) each represent a substituted or unsubstituted 9-phenanthrenyl group.

7. The organic luminescent medium according to claim 5, wherein Ar¹¹ and Ar¹² in the formula (1-2) each represent a substituted or unsubstituted β-naphthyl group.

8. The organic luminescent medium according to claim 5, wherein Ar¹¹ and Ar¹² in the formula (1-2) each represent a substituted or unsubstituted α-naphthyl group.

9. The organic luminescent medium according to claim 4, wherein Ar¹¹ and Ar¹² in the formula (1-2) represent different groups.

10. The organic luminescent medium according to claim 9, wherein Ar¹¹ and Ar¹² in the formula (1-2) each represent any one selected from the group consisting of a substituted 9-phenanthrenyl group, an unsubstituted 9-phenanthrenyl group, a substituted α-naphthyl group, an unsubstituted α-naphthyl group, a substituted β-naphthyl group, and an unsubstituted β-naphthyl group.

11. The organic luminescent medium according to claim 1, wherein one of Ar¹¹ and Ar¹² in the formula (1-2) represents a substituted or unsubstituted phenyl group, and the other represents a substituted or unsubstituted, fused aryl group having 10 to 20 ring carbon atoms.

12. The organic luminescent medium according to claim 11, wherein the substituted or unsubstituted, fused aryl group having 10 to 20 ring carbon atoms comprises a substituted or unsubstituted α-naphthyl group.

13. The organic luminescent medium according to claim 11, wherein the substituted or unsubstituted, fused aryl group having 10 to 20 ring carbon atoms comprises a substituted or unsubstituted β-naphthyl group.

14. The organic luminescent medium according to claim 1, wherein the anthracene derivative is represented by formula (1-2-6):

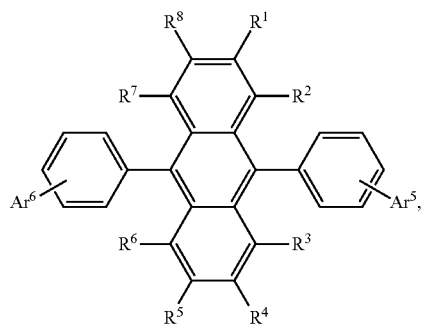

(1-2-6)

wherein:
$R^1$ to $R^6$ each independently represent a group selected from the group consisting of a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group; a halogen atom, a cyano group, a nitro group, and a hydroxyl group; and
$Ar^5$ and $Ar^6$ each independently represent a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, or a substituted or unsubstituted heterocyclic group having 5 to 50 ring atoms.

15. The organic luminescent medium according to claim 14, wherein $Ar^5$ and $Ar^6$ in the formula (1-2-6) each represent a substituted or unsubstituted phenyl group.

16. The organic luminescent medium according to claim 14, wherein one of $Ar^5$ and $Ar^6$ in the formula (1-2-6) represents a substituted or unsubstituted phenyl group, and the other represents a substituted or unsubstituted, fused aryl group having 10 to 20 ring carbon atoms.

17. The organic luminescent medium according to claim 14, wherein $Ar^5$ and $Ar^6$ in the formula (I-2-6) each represent a substituted or unsubstituted, fused aryl group having 10 to 20 ring carbon atoms.

18. An organic electroluminescence device comprising at least one organic thin film layer comprising a light emitting layer between a cathode and an anode,
wherein at least one layer of the at least one organic thin film layer comprises the organic luminescent medium according to claim 1.

19. The organic electroluminescence device according to claim 18, wherein the light emitting layer comprises the organic luminescent medium.

20. An organic luminescent medium, comprising:
a diaminopyrene derivative represented by formula (2-1)

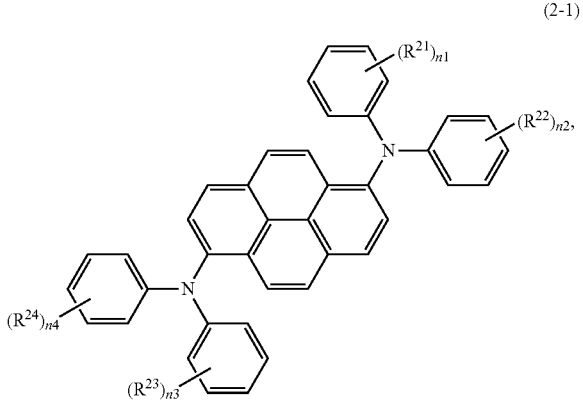

(2-1)

wherein:
$R^{21}$ to $R^{24}$ each independently represent a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, or a substituted or unsubstituted aralkyl group having 7 to 50 carbon atoms, and when one pair of adjacent alkyl groups is, or two pairs of adjacent alkyl groups are, present on the same benzene ring, the adjacent alkyl groups may be bonded to each other to form a substituted or unsubstituted, divalent bonding group, provided that a case where the adjacent alkyl groups form a 1-naphthyl group together with the benzene ring to which the groups are bonded is excluded; and
n1 to n4 each independently represent an integer of 0 1:o 5, and at least one of n1 to n4 represents an integer of 1 to 5; and
an anthracene derivative represented by the following formula (2-2):

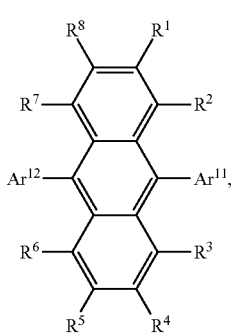

(2-2)

wherein
$Ar^{11}$ and $Ar^{12}$ each independently represent a substituted or unsubstituted aryl group having 6 to 20 ring carbon atoms, and
$R^1$ to $R^8$ each independently represent a group selected from the group consisting of a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group, provided that, when one of $Ar^{11}$ and $Ar^{12}$ represents a substituted or unsubstituted β-naphthyl group, the other represents a group excluding a substituted or unsubstituted arylphenylene group and a substituted or unsubstituted fluorenylphenylene group.

21. The organic luminescent medium according to claim 20, wherein $Ar^{11}$ and $Ar^{12}$ in the formula (2-2) each independently represent a substituted or unsubstituted, fused aryl group having 10 to 20 ring carbon atoms.

22. The organic luminescent medium according to claim 21, wherein $Ar^{11}$ and $Ar^{12}$ in the formula (2-2) represent the same group.

23. The organic luminescent medium according to claim 22, wherein $Ar^{11}$ and $Ar^{12}$ in the formula (2-2) each represent a substituted or unsubstituted 9-phenanthrenyl group.

24. The organic luminescent medium according to claim 22, wherein $Ar^{11}$ and $Ar^{12}$ in the formula (2-2) each represent a substituted or unsubstituted βnaphthyl group.

25. The organic luminescent medium according to claim 20, wherein $Ar^{11}$ and $Ar^{12}$ in the formula (2-2) each represent a substituted or unsubstituted α-naphthyl group.

26. The organic luminescent medium according to claim 21, wherein $Ar^{11}$ and $Ar^{12}$ in the formula (2-2) represent different groups.

27. The organic luminescent medium according to claim 26, wherein $Ar^{11}$ and $Ar^{12}$ in the formula (2-2) each represent any one selected from the group consisting of a substituted 9-phenanthrenyl group, an unsubstituted 9-phenanthrenyl group, a substituted α-naphthyl group, an unsubstituted α-naphthyl group, a substituted β-naphthyl group, and an unsubstituted β-naphthyl group.

28. The organic luminescent medium according to claim 20, wherein one of $Ar^{11}$ and $Ar^{12}$ in the formula (2-2) represents a substituted or unsubstituted phenyl group, and the other represents a substituted or unsubstituted, fused aryl group having 10 to 20 ring carbon atoms.

29. The organic luminescent medium according to claim 28, wherein the substituted or unsubstituted, fused aryl group having 10 to 20 ring carbon atoms comprises a substituted or unsubstituted α-naphthyl group.

30. The organic luminescent medium according to claim 28,
wherein the substituted or unsubstituted, fused aryl group having 10 to 20 ring carbon atoms comprises a substituted or unsubstituted β-naphthyl group.

31. The organic luminescent medium according to claim 20, wherein the anthracene derivative is represented by formula (2-2-6):

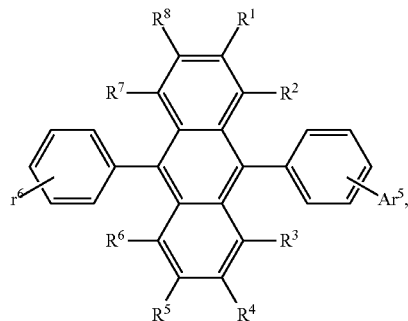

(2-2-6)

wherein:
$R^1$ to $R^8$ each independently represent a group selected from the group consisting of a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group, provided that, when one of $Ar^{11}$ and $Ar^{12}$ represents a substituted or unsubstituted β-naphthyl group, the other represents a group excluding a substituted or unsubstituted arylphenylene group and a substituted or unsubstituted fluorenylphenylene group; and $Ar^5$ and $Ar^6$ each independently represent a substituted or unsubstituted aryl group having 6 to 50 ring carbon atoms, a substituted or unsubstituted alkyl group having 1 to 50 carbon atoms, a substituted or unsubstituted cycloalkyl, group having 3 to 50 ring carbon atoms, a substituted or unsubstituted aralkyl group having 7 to 50 carbon atoms, or a substituted or unsubstituted heterocyclic group having 5 to 50 ring atoms.

32. The organic luminescent medium according to claim 31,
wherein $Ar^5$ and $Ar^6$ in the formula (2-2-6) each represent a substituted or unsubstituted phenyl group.

33. The organic luminescent medium according to claim 31, wherein one of $Ar^5$ and $Ar^6$ in the formula (2-2-6) represents a substituted or unsubstituted phenyl group, and the other represents a substituted or unsubstituted, fused aryl group having 10 to 20 ring carbon atoms.

34. The organic luminescent medium according to claim 31, wherein $Ar^5$ and $Ar^6$ in the formula (2-2-6) each represent a substituted or unsubstituted, fused aryl group having 10 to 20 ring carbon atoms.

* * * * *